(12) United States Patent
Katoh

(10) Patent No.: US 10,410,719 B2
(45) Date of Patent: Sep. 10, 2019

(54) NON-VOLATILE MEMORY DEVICE INCLUDING A MEMORY CELL IN A VARIABLE STATE AND A MEMORY CELL IN AN INITIAL STATE

(71) Applicant: Panasonic Intellectual Property Management Co., Ltd., Osaka (JP)

(72) Inventor: Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 422 days.

(21) Appl. No.: 14/678,571

(22) Filed: Apr. 3, 2015

(65) Prior Publication Data

US 2015/0213885 A1 Jul. 30, 2015

Related U.S. Application Data

(63) Continuation of application No. PCT/JP2014/000513, filed on Jan. 31, 2014.

(30) Foreign Application Priority Data

Feb. 1, 2013 (JP) ................................. 2013-018722

(51) Int. Cl.
*G11C 13/00* (2006.01)
*H01L 27/24* (2006.01)
(Continued)

(52) U.S. Cl.
CPC .............. *G11C 13/004* (2013.01); *G11C 7/24* (2013.01); *G11C 13/0007* (2013.01);
(Continued)

(58) Field of Classification Search
CPC ............ G11C 11/5614; G11C 13/0011; G11C 13/004; G11C 13/0007; G11C 13/0059;
(Continued)

(56) References Cited

U.S. PATENT DOCUMENTS 8,305,795 B2 11/2012 Azuma et al.
8,432,721 B2 * 4/2013 Iijima ................ G11C 13/0007
257/143

(Continued)

FOREIGN PATENT DOCUMENTS

EP 2045814 A1 4/2009
JP 2006-351780 A 12/2006
(Continued)

OTHER PUBLICATIONS

International Search Report issued in PCT/JP2014/000513, dated Feb. 25, 2014, with English translation.

(Continued)

*Primary Examiner* — Sung Il Cho
(74) *Attorney, Agent, or Firm* — McDermott Will & Emery LLP

(57) ABSTRACT

A non-volatile memory device comprises a memory cell array that includes a plurality of memory cells, the plurality of memory cells including: a memory cell in a variable state, in which a resistance value reversibly changes between a plurality of changeable resistance value ranges in accordance with an electric signal applied thereto; and a memory cell in an initial state, which does not change to the variable state unless a forming stress for changing the memory cell in the initial state to the variable state is applied thereto, a resistance value of the memory in the initial state being within an initial resistance value range which does not overlap with the plurality of changeable resistance value ranges, wherein in the memory cell array, data is stored on the basis of whether each of the plurality of memory cells is in the initial state or the variable state.

19 Claims, 17 Drawing Sheets

(51) Int. Cl.
*G11C 7/24* (2006.01)
*H01L 45/00* (2006.01)
*G11C 7/20* (2006.01)

(52) U.S. Cl.
CPC ...... *G11C 13/0059* (2013.01); *G11C 13/0064* (2013.01); *G11C 13/0069* (2013.01); *H01L 27/2463* (2013.01); *G11C 7/20* (2013.01); *G11C 2013/0076* (2013.01); *G11C 2013/0083* (2013.01); *G11C 2213/15* (2013.01); *G11C 2213/32* (2013.01); *G11C 2213/79* (2013.01); *H01L 27/2409* (2013.01); *H01L 27/2436* (2013.01); *H01L 45/08* (2013.01); *H01L 45/1233* (2013.01); *H01L 45/146* (2013.01)

(58) Field of Classification Search
CPC ... G11C 13/0064; G11C 13/0069; G11C 7/20; G11C 7/24; G11C 2013/0076; G11C 2013/0083; G11C 2013/15; G11C 2013/32; G11C 2013/79; H01L 27/2463; H01L 27/2409; H01L 27/2436; H01L 45/08; H01L 45/1233; H01L 45/146
USPC .......................................................... 365/148
See application file for complete search history.

(56) References Cited

U.S. PATENT DOCUMENTS

| 8,737,115 B2* | 5/2014 | Yamazaki | H01L 45/08 365/148 |
|---|---|---|---|
| 8,902,629 B2 | 12/2014 | Kawai et al. | |
| 9,129,894 B2 | 9/2015 | Hashim et al. | |
| 2010/0054019 A1* | 3/2010 | Toda | G11C 8/12 365/148 |
| 2010/0322008 A1 | 12/2010 | Yoneya et al. | |
| 2011/0110144 A1* | 5/2011 | Kawai | G11C 11/5685 365/148 |
| 2011/0116296 A1 | 5/2011 | Kitagawa et al. | |
| 2011/0228587 A1 | 9/2011 | Ito | |
| 2012/0030268 A1 | 2/2012 | Liu et al. | |
| 2012/0044777 A1 | 2/2012 | Fujiwara et al. | |
| 2012/0081946 A1 | 4/2012 | Kawabata et al. | |
| 2012/0120712 A1* | 5/2012 | Kawai | G11C 13/0007 365/148 |
| 2012/0230085 A1* | 9/2012 | Kawai | H01L 27/101 365/148 |
| 2013/0058154 A1* | 3/2013 | Katagiri | G11C 8/10 365/148 |

FOREIGN PATENT DOCUMENTS

| JP | 2008-066438 A | 3/2008 |
|---|---|---|
| JP | 2008-165439 A | 7/2008 |
| JP | 2009-003318 A | 1/2009 |
| JP | 2009-093786 A | 4/2009 |
| JP | 2010-193013 A | 9/2010 |
| JP | 4972238 B2 | 4/2012 |

OTHER PUBLICATIONS

Extended European Search Report issued in European Application No. 14745623.0, dated Feb. 16, 2016.
U.S. Final Office Action dated Jul. 26, 2017 issued in U.S. Appl. No. 14/677,708.
U.S. Office Action dated Dec. 1, 2016 issued in U.S. Appl. No. 14/677,708.
U.S. Final Office Action dated Jul. 18, 2016 issued in U.S. Appl. No. 14/677,708.
U.S. Non-Final Office Action dated Dec. 24, 2015 issued in U.S. Appl. No. 14/677,708.

* cited by examiner

Hexadecimal form

| | | | | | |
|---|---|---|---|---|---|
| 255 | 255 | 255 | 255 | | 0 |
| 255 | 255 | 255 | 9 | | 1 |
| 255 | 255 | 10 | 255 | | 2 |
| 255 | 255 | 11 | 9 | | 3 |
| 255 | 11 | 255 | 255 | | 4 |
| 255 | 9 | 255 | 10 | | 5 |
| 255 | 10 | 10 | 255 | | 6 |
| 255 | 10 | 10 | 10 | | 7 |
| 15 | 255 | 255 | 255 | | 8 |
| 11 | 255 | 255 | 9 | | 9 |
| 13 | 255 | 10 | 255 | | A |
| 9 | 255 | 9 | 10 | | B |
| 9 | 10 | 255 | 255 | | C |
| 9 | 10 | 255 | 9 | | D |
| 9 | 10 | 9 | 255 | | E |
| 9 | 11 | 10 | 10 | | F |

Fig.15

Hexadecimal form

| | | | | | |
|---|---|---|---|---|---|
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 11 | 255 | 255 | 255 | | 8 |
| 10 | 255 | 255 | 255 | | 8 |
| 11 | 255 | 255 | 255 | | 8 |
| 10 | 255 | 21 | 255 | | A |
| 11 | 255 | 255 | 255 | | 8 |

Fig.16

NON-VOLATILE MEMORY DEVICE INCLUDING A MEMORY CELL IN A VARIABLE STATE AND A MEMORY CELL IN AN INITIAL STATE

This is a continuation application under 35 U.S.C. 111(a) of pending prior International application No. PCT/JP2014/000513, filed on Jan. 31, 2014.

BACKGROUND OF THE INVENTION

1. Field of the Invention

The present disclosure relates to a non-volatile memory device. More particularly, the present disclosure relates to a non-volatile memory device which employs a novel data storing method.

2. Description of the Related Art

Japanese Laid-Open Patent Application Publication No. 2008-165439 (Patent Literature 1) discloses a magnetic disc device including a storage medium section including a storage medium, a magnetic disc medium section including a magnetic disc medium, a storage means which stores data transmitted from a host in the storage medium, a first verification means which verifies a password input externally with a password pre-stored in the storage medium or a semiconductor memory configured on the same board as that of the storage medium, and a control means which is provided in the storage medium section and controls access to the magnetic disc medium configured in the magnetic disc medium section according to a result of the verification of the first verification means.

Japanese Laid-Open Patent Application Publication No. 2010-193013 (Patent Literature 2) discloses a cipher key protecting method of a semiconductor memory device including a non-volatile memory including a memory cell array and being configured to encrypt file data input, store the encrypted file data in a portion of the non-volatile memory, and store management information including a key used to decrypt the encrypted file data, in another portion of the non-volatile memory, in which method, in a first state in which password reference using the management information is valid, the input password is verified, and the encrypted file data is permitted to be decrypted by the key based on a result of the verification, while in a second state in which the password reference using the management information is invalid, the encrypted file data is permitted to be decrypted by the key without an input of the password, the management information indicating that the first state is formed is stored in the memory cell array using a first threshold voltage and a second threshold voltage which is lower than the first threshold voltage, and the management information indicating that the second state is formed is stored in the memory cell array using a third threshold voltage and a fourth threshold voltage which is lower than the third threshold voltage.

SUMMARY OF THE INVENTION

One non-limiting and exemplary embodiment provide a novel data storing method which is not provided in a prior art, and is applicable to a safer encryption technique, and the like, in a non-volatile memory device.

In one general aspect, the techniques disclosed here feature is a non-volatile memory device comprising: a memory cell array that includes a plurality of memory cells, the plurality of memory cells including: a memory cell in a variable state, in which a resistance value reversibly changes between a plurality of changeable resistance value ranges in accordance with an electric signal applied thereto; and a memory cell in an initial state, which does not change to the variable state unless a forming stress for changing the memory cell in the initial state to the variable state is applied thereto, a resistance value of the memory in the initial state being within an initial resistance value range which does not overlap with the plurality of changeable resistance value ranges, wherein in the memory cell array, data is stored on the basis of whether each of the plurality of memory cells is in the initial state or the variable state.

According to one general aspect of techniques, it becomes possible to achieve an advantage that a novel data storing method which is not provided in a prior art, and is applicable to a safer encryption technique, and the like, in a non-volatile memory device.

BRIEF DESCRIPTION OF DRAWINGS

FIG. 15 is a table showing the exemplary result of reading of data in a special read mode from the memory cell to which the data is written in the special write mode of FIG. 14.

FIG. 16 is a table showing the exemplary result of reading of data in a normal read mode from the memory cell to which the data is written in the special write mode of FIG. 14.

DESCRIPTION OF THE PREFERRED EMBODIMENT

Figure 1:
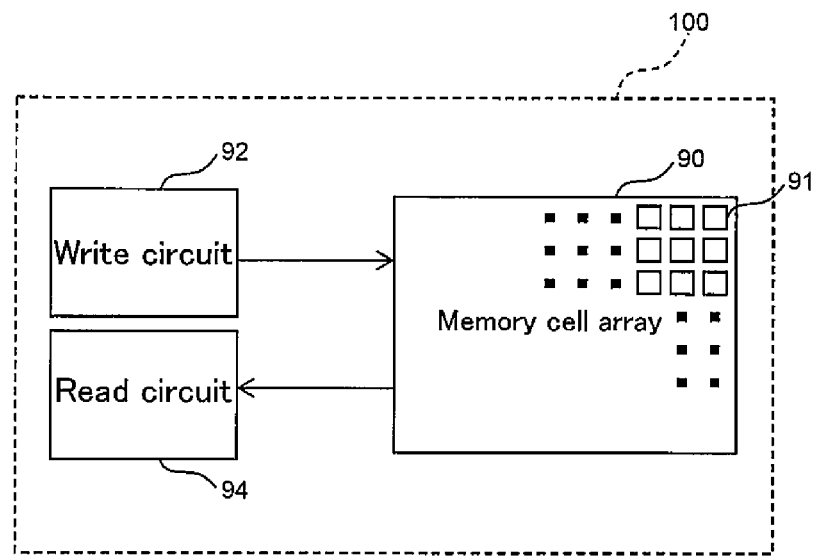
FIG. 1 is a block diagram showing the exemplary schematic configuration of a non-volatile memory device according to Embodiment 1.

Hereinafter, the embodiments of the present disclosure will be described with reference to the attached drawings.

The embodiments described hereinafter are preferred specific examples of the present disclosure. Numeric values, shapes, materials, constituents (elements), layout positions of the constituents, connection form of the constituents, steps, the order of the steps, etc., which are illustrated in the embodiments described below, are merely exemplary, and are not intended to limit the present disclosure. Also, among the constituents in the embodiments described below, the constituents which are not recited in independent claims defining a broadest concept of the present disclosure will be described as arbitrary constituents constituting a more desirable embodiment. Description of the constituents designated by the same reference symbols in the drawings will be sometimes omitted. For easier understanding, in the drawings, the constituents are schematically shown, and their shapes, dimension ratio, etc., are not sometimes accurate. Moreover, in a manufacturing method, the order of the steps, etc., can be changed and other known steps may be added as necessary.

Embodiment 1

A non-volatile memory device of Embodiment 1, comprises a non-volatile memory device comprising: a memory cell array that includes a plurality of memory cells, the plurality of memory cells including: a memory cell in a variable state, in which a resistance value reversibly changes between a plurality of changeable resistance value ranges in accordance with an electric signal applied thereto; and a memory cell in an initial state, which does not change to the variable state unless a forming stress for changing the memory cell in the initial state to the variable state is applied thereto, a resistance value of the memory in the initial state being within an initial resistance value range which does not overlap with the plurality of changeable resistance value ranges, wherein in the memory cell array, data is stored on the basis of whether each of the plurality of memory cells is in the initial state or the variable state.

In this configuration, it becomes possible to provide a novel data storing method which is not provided in a prior art, and is applicable to a safer encryption technique, and the like, in a non-volatile memory device.

The phrase "initial resistance value range which does not overlap with the changeable resistance value ranges" refers to the fact that when a particular resistance value is within the initial resistance value range, this resistance value does not fall into the changeable resistance value ranges, while when a particular resistance value is within the changeable resistance value ranges, this resistance value does not fall into the initial resistance value range.

It is sufficient that the plurality of memory cells include at least the memory cell in the initial state and the memory cell in the variable state, and may partially include, for example, a failure memory cell in which a resistance value does not fall into the initial resistance value range and the changeable resistance value ranges. In some cases, there may cause a failure memory cell, because the resistance value of the memory cell which fell into the changeable resistance value range is within the initial resistance value range with a passage of time. Such a failure memory cell emerges, for example, in a case where the memory cell is left under a high-temperature environment, and thereby the resistance value changes. The data of the failure memory cell is corrected into correct data by, for example, error correction.

The phrase "data is stored on the basis of whether each of the memory cells is in the initial state or the variable state", specifically refers to the fact that the data is stored by allocating each information (e.g. integer value such as "0" or "1") such that the information corresponds to the state of the memory cell (one of the initial state and the plurality of variable states). More specifically, for example, the phrase "data is stored on the basis of whether each of the memory cells is in the initial state or the variable state", refers to the fact that binary data is stored in the memory cell in such a manner that a case where the memory cell is in the initial state is allocated to the first value of the data, and a case where the memory cell is in the variable state is allocated to the second value of the data.

The forming stress may be larger in magnitude than the plurality of different electric signals applied to reversibly change the resistance value of the memory cell in the variable state between the changeable resistance value ranges. For example, the forming stress is larger in at least one of amplitude and pulse width than the plurality of different electric signals applied to reversibly change the resistance value of the memory cell in the variable state.

Or, for example, in a case where the memory cell in the variable state is selectively placed in a high-resistance state or a low-resistance state, three-valued data may be stored in the memory cell in such a manner that a case where the memory cell is in the initial state is allocated to the first value of the data, a case where the memory cell is in the high-resistance state is allocated to the second value of the data, and a case where the memory cell is in the low-resistance state is allocated to the third value of the data. More specifically, for example, the second value and the third value are allocated to correspond to the different changeable resistance value ranges, respectively.

The non-volatile memory device may further comprise: a read circuit that selectively executes: reading the first-kind data on the basis of a first-kind threshold group including a first threshold which is equal to or smaller than a lower limit of the initial resistance value range and is equal to or larger than the largest of upper limits of the plurality of changeable resistance value ranges; and reading the second-kind data on the basis of a second-kind threshold group including thresholds which are equal to or smaller than the largest of lower limits of the plurality of changeable resistance value ranges.

The non-volatile memory device may further comprise: a read circuit that selectively executes: reading the first-kind data on the basis of a first-kind threshold group including a first threshold which is equal to or larger than an upper limit of the initial resistance value range and is equal to or smaller than the smallest of lower limits of the plurality of changeable resistance value ranges; and reading the second-kind data on the basis of a second-kind threshold group including thresholds which are equal to or larger than the smallest of upper limits of the plurality of changeable resistance value ranges.

The non-volatile memory device may further comprise: a read circuit that includes: a driver for applying a read voltage to a memory cell selected from among the plurality of memory cells; a constant current source for flowing a constant current through the selected memory cell at a predetermined current amount; a counter circuit for counting time that passes from when the driver stops application of the read voltage to the selected memory cell until a voltage of the selected memory cell becomes smaller than a predetermined determination voltage; and a comparator circuit for comparing the time counted by the counter circuit to a predetermined determination time; wherein the read circuit selectively reads the first-kind data and the second data, and between the case of reading the first-kind data and the case of reading the second-kind data, at least one of the read voltage, the current amount, the predetermined determination voltage, and the predetermined determination time is different.

In the above non-volatile memory device, the memory cell array may include a first write address area and a second write address area, the first-kind data may be stored in the first write address area, and the second-kind data may be stored in the second write address area.

In the above non-volatile memory device, the memory cell array may have a characteristic in which a memory cell which changes from the initial state to the variable state by application of an electric stress for causing the memory cell to change from the initial state to the variable state, and a memory cell maintained in the initial state, despite the application of the electric stress, occur randomly, and the first-kind data may be data generated by an event that the memory cell which changes from the initial state to the variable state occurs randomly.

In the above non-volatile memory device, the changeable resistance value ranges may include a high-resistance value range and a low-resistance value range lower than the high-resistance value range.

In this configuration, all of the resistance values read from the memory cells in the variable state do not become an equal value. Apparently, it looks like some data is stored. Therefore, it becomes possible to more effectively keep the stored data secret, on the basis of whether or not the resistance value is within the initial resistance value range.

In the above non-volatile memory device, a lower limit of the initial resistance value range may be equal to or larger than upper limits of all of the changeable resistance value ranges.

In the above non-volatile memory device, an upper limit of the initial resistance value range may be equal to or smaller than lower limits of all of the changeable resistance value ranges.

In the above non-volatile memory device, the plurality of changeable resistance value ranges include (N−1) changeable resistance value ranges, where N is an integer equal to or larger than 3; and wherein in the memory cell array, multi-valued data is stored, on the basis of which of N resistance value ranges including the initial resistance value range and the (N−1) changeable resistance value ranges, the resistance value of each of the plurality of memory cells is within.

The "multi-valued data" refers to data which is more in value than the "binary (two-valued) data". Specifically, for example, the "multi-valued data" may be three-valued data, four-valued data, etc.

The above non-volatile memory device may comprise a read circuit that reads the stored data, by determining whether a memory cell selected from among the plurality of memory cells is in the initial state or the variable state.

The above non-volatile memory device may further comprise a read circuit that selectively executes: determining whether or not a resistance value of a memory cell selected from among the plurality of memory cells is larger than a first threshold, the first threshold being equal to or smaller than a lower limit of the initial resistance value range and being equal to or larger than the largest of upper limits of the plurality of changeable resistance value ranges; and determining whether or not a resistance value of a memory cell selected from among the plurality of memory cells is larger than a second threshold, the second threshold being equal to or smaller than the largest of lower limits of the plurality of changeable resistance value ranges and being equal to or larger than the smallest of upper limits of the plurality of changeable resistance value ranges.

Note that the determination as to the resistance value may be performed by directly detecting the resistance value, or by detecting another physical amount (e.g., current amount and attenuation time of voltage amount, etc.) relating to the resistance value.

In the above non-volatile memory device, each of the plurality of memory cells may include a variable resistance element including a first electrode, a second electrode, and a variable resistance layer located between the first electrode and the second electrode, and the variable resistance layer of the variable resistance element included in the memory cell in the initial state may insulate the first electrode and the second electrode from each other.

A data storing method of a non-volatile memory device, of Embodiment 1, including a memory cell array that includes a plurality of memory cells, the plurality of memory cells including: memory cell in a variable state, in which a resistance value reversibly changes between a plurality of changeable resistance value ranges in accordance with an electric signal applied thereto; and a memory cell in an initial state, which does not change to the variable state unless a forming stress for changing the memory cell in the initial state to the variable state is applied thereto, a resistance value of the memory in the initial state being within an initial resistance value range which does not overlap with the plurality of changeable resistance value ranges, the method comprising the step of: applying the forming stress to the memory cell in the initial state, wherein data is stored in the memory cell array on the basis of whether each of the memory cells is in the initial state or the variable state, in the step of applying the forming stress.

In the above data storing method of the non-volatile memory device, the step of applying the forming stress may include applying the forming stress to the plurality of memory cells in the initial state to change a part of the plurality of memory cells in the initial state to the variable state.

In the above data storing method, the plurality of changeable resistance value ranges may include a first resistance value range which is smaller in resistance value than the initial resistance value range and a second resistance value range which does not overlap with the first resistance value range and is smaller in resistance value than the first resistance value range, and the memory cell in the variable state has a characteristic in which the resistance value changes from the second resistance value range to the first resistance value range by application of a first electric signal and changes from the first resistance value range to the second resistance value range by application of a second electric signal, the method further comprising: after the step of applying the forming stress, applying an auxiliary stress as an electric stress which is smaller in magnitude than the second electric signal and has the same polarity as that of the second electric signal, to the memory cell containing data.

In the above data storing method, the plurality of changeable resistance value ranges may include a second resistance value range which is larger in resistance value than the initial resistance value range and a first resistance value range which does not overlap with the second resistance value range and is larger in resistance value than the second resistance value range, and the memory cell in the variable state has a characteristic in which the resistance value changes from the second resistance value range to the first resistance value range by application of a first electric signal and changes from the first resistance value range to the second resistance value range by application of a second electric signal, the method further comprising: after the step of applying the forming stress, applying an auxiliary stress as an electric stress which is smaller in magnitude than the first electric signal and has the same polarity as that of the first electric signal, to the memory cell containing data.

The above data storing method may further comprise the steps of: after the step of applying the auxiliary stress, determining whether or not the resistance value of the memory cell selected from among the memory cells containing the data is within the first resistance value range; and applying the second electric signal, the first electric signal, and the auxiliary stress in this order to the selected memory cell, when it is determined that the resistance value of the selected memory cell does not fall into the first resistance value range, in the step of determining whether or not the resistance value of the memory cell is within the first resistance value range.

The above data storing method may further comprise the steps of: after the step of applying the auxiliary stress, determining whether or not the resistance value of the memory cell selected from among the memory cells containing the data is within the second resistance value range; and applying the first electric signal, the second electric signal, and the auxiliary stress in this order to the selected memory cell, when it is determined that the resistance value of the selected memory cell does not fall into the second resistance value range, in the step of determining whether or not the resistance value of the memory cell is within the second resistance value range.

In the above data storing method, the first electric signal may be different in polarity from the second electric signal, and the forming stress may have the same polarity as that of the first electric signal.

In the above data storing method, a part of the memory cells may be selected randomly such that the data may be generated to form random data and stored in the memory cell array.

In the above data storing method, the plurality of changeable resistance value ranges may include a first resistance value range which is smaller in resistance value than the initial resistance value range and a second resistance value range which does not overlap with the first resistance value range and is smaller in resistance value than the first resistance value range, and the memory cell in the variable state has a characteristic in which the resistance value changes from the second resistance value range to the first resistance value range by application of a first electric signal and changes from the first resistance value range to the second resistance value range by application of a second electric signal, the method further comprising the step of: after the step of applying the forming stress, applying the second electric signal to the memory cell containing data.

In the above data storing method, the plurality of changeable resistance value ranges may include a second resistance value range which is larger in resistance value than the initial resistance value range and a first resistance value range which does not overlap with the second resistance value range and is larger in resistance value than the second resistance value range, and the memory cell in the variable state has a characteristic in which the resistance value changes from the second resistance value range to the first resistance value range by application of a first electric signal and changes from the first resistance value range to the second resistance value range by application of a second electric signal, the method further comprising the step of: after the step of applying the forming stress, applying the first electric signal to the memory cell containing data.

In the above data storing method, the plurality of changeable resistance value ranges may include a first resistance value range which is smaller in resistance value than the initial resistance value range and a second resistance value range which does not overlap with the first resistance value range and is smaller in resistance value than the first resistance value range, the method further comprising the step of: after the step of applying the forming stress, comparing first data read using a first threshold which is equal to or smaller than a lower limit of the initial resistance value range and is equal to or larger than an upper limit of one of the plurality of changeable resistance value ranges, corresponding to a largest resistance value, to second data read using a second threshold which is equal to or smaller than a lower limit of one of the plurality of changeable resistance value ranges, corresponding to the largest resistance value and is equal to or larger than an upper limit of one of the plurality of changeable resistance value ranges, corresponding to a smallest resistance value; and additionally applying the first electric signal to the memory cell in the changeable resistance value range which is smaller than the second threshold such that the resistance value is within the changeable resistance value range which is larger than the second threshold, when the memory cells which are different in resistance value between the first data and the second data are less than a predetermined number.

In the above data storing method, the plurality of changeable resistance value ranges may include a second resistance value range which is larger in resistance value than the initial resistance value range and a first resistance value range which does not overlap with the second resistance value range and is larger in resistance value than the second resistance value range, the method further comprising the step of: after the step of applying the forming stress, comparing first data read using a first threshold which is equal to or larger than an upper limit of the initial resistance value range and is equal to or smaller than a lower limit of one of the plurality of changeable resistance value ranges, corresponding to a smallest resistance value, to second data read using a second threshold which is equal to or larger than an upper limit of one of the plurality of changeable resistance value ranges, corresponding to the smallest resistance value and is equal to or smaller than a lower limit of one of the plurality of changeable resistance value ranges, corresponding to a largest resistance value; and additionally applying the second electric signal to the memory cell in the changeable resistance value range which is larger than the second threshold such that the resistance value is within the changeable resistance value range which is smaller than the second threshold, when the memory cells which are different in resistance value between the first data and the second data are less than a predetermined number.

In the above data storing method, a first write mode for changing the memory cell from the initial state to the variable state by applying the forming stress to the memory cell in the initial state, or a second write mode for changing the resistance value of the memory cell between the plurality of changeable resistance value ranges by applying one of a plurality of different electric signals to the memory cell in the variable state, may be selectively executed.

The above data storing method may further comprise the step of: applying the first electric signal or the second electric signal to the memory cell in the variable state, wherein in the step of applying the forming stress, first-kind data may be stored on the basis of whether or not the resistance value of each of the memory cells is within the initial resistance value range, and in the step of applying the first electric signal or the second electric signal, second-kind data may be stored without utilizing whether or not the resistance value of each of the memory cells is within the initial resistance value range and on the basis of whether or not the resistance value of each of the memory cells is within at least one of the changeable resistance value ranges.

In the above data storing method of the non-volatile memory device, in the step of applying the forming stress, first-kind data may be stored in a first write address area of the memory cell array, and in the step of applying the first electric signal or the second electric signal, second-kind data may be stored in a second write address area of the memory cell array.

In the above data storing method of the non-volatile memory device, the step of applying the forming stress may include setting a first write address area in the memory cell array, and storing the first-kind data in the first write address area, and applying the forming stress to a region which is different from the first write address area of the memory cell array, to form a second write address area composed of a plurality of memory cells in the variable state; and wherein in the step of applying the first electric signal or the second electric signal, the second-kind data may be stored in the second write address area of the memory cell array.

In the above data storing method of the non-volatile memory device, each of the plurality of memory cells may include a variable resistance element including a first electrode, a second electrode, and a variable resistance layer provided between the first electrode and the second electrode, and the variable resistance layer of the variable resistance element included in the memory cell in the initial state may insulate the first electrode and the second electrode from each other.

A data write circuit of a non-volatile memory device of Embodiment 1, including a memory cell array that includes a plurality of memory cells, the plurality of memory cells including: a memory cell in a variable state, in which a resistance value reversibly changes between a plurality of changeable resistance value ranges in accordance with an electric signal applied thereto; and a memory cell in an initial state, which does not change to the variable state unless a forming stress for changing the memory cell in the initial state to the variable state is applied thereto, a resistance value of the memory in the initial state being within an initial resistance value range which does not overlap with the plurality of changeable resistance value ranges, wherein data is stored in the memory cell array on the basis of whether each of the memory cells is in the initial state or the variable state, by applying the forming stress to the memory cell in the initial state.

The above data write circuit may apply the forming stress to the plurality of memory cells in the initial state to change a part of the plurality of memory cells in the initial state to the variable state.

In the above data write circuit, the plurality of changeable resistance value ranges may include a first resistance value range which is smaller in resistance value than the initial resistance value range and a second resistance value range which does not overlap with the first resistance value range and is smaller in resistance value than the first resistance value range, and the memory cell in the variable state has a characteristic in which the resistance value changes from the second resistance value range to the first resistance value range by application of a first electric signal and changes from the first resistance value range to the second resistance value range by application of a second electric signal, and the data write circuit may, after application of the forming stress, apply an auxiliary stress as an electric stress which is smaller in magnitude than the second electric signal and has the same polarity as that of the second electric signal, to the memory cell containing data.

In the above data write circuit, the plurality of changeable resistance value ranges may include a second resistance value range which is larger in resistance value than the initial resistance value range and a first resistance value range which does not overlap with the second resistance value range and is larger in resistance value than the second resistance value range, and the memory cell in the variable state has a characteristic in which the resistance value changes from the second resistance value range to the first resistance value range by application of a first electric signal and changes from the first resistance value range to the second resistance value range by application of a second electric signal, and the data write circuit may, after application of the forming stress, apply an auxiliary stress as an electric stress which is smaller in magnitude than the first electric signal and has the same polarity as that of the first electric signal, to the memory cell containing data.

The above data write circuit may, after application of the auxiliary stress, determine whether or not the resistance value of the memory cell selected from among the memory cells containing the data is within the first resistance value range, and apply the second electric signal, the first electric signal, and the auxiliary stress in this order to the selected memory cell, when the data write circuit determines that the resistance value of the selected memory cell does not fall into the first resistance value range.

The above data write circuit may, after application of the auxiliary stress, determine whether or not the resistance value of the memory cell selected from among the memory cells containing the data is within the second resistance value range; and apply the first electric signal, the second electric signal, and the auxiliary stress in this order to the selected memory cell, when the data write circuit determines that the resistance value of the selected memory cell does not fall into the second resistance value range.

In the above data write circuit, the first electric signal may be different in polarity from the second electric signal, and the forming stress may have the same polarity as that of the first electric signal.

In the above data write circuit, a part of the memory cells may be selected randomly such that the data may be generated to form random data and stored in the memory cell array.

In the above data write circuit, the plurality of changeable resistance value ranges may include a first resistance value range which is smaller in resistance value than the initial resistance value range and a second resistance value range which does not overlap with the first resistance value range and is smaller in resistance value than the first resistance value range, and the memory cell in the variable state has a characteristic in which the resistance value changes from the second resistance value range to the first resistance value range by application of a first electric signal and changes from the first resistance value range to the second resistance value range by application of a second electric signal, and the data write circuit may, after application of the forming stress, apply the second electric signal to the memory cell containing data.

In the above data write circuit of the non-volatile memory device, the plurality of changeable resistance value ranges may include a second resistance value range which is larger in resistance value than the initial resistance value range and a first resistance value range which does not overlap with the second resistance value range and is larger in resistance value than the second resistance value range, and the memory cell in the variable state has a characteristic in which the resistance value changes from the second resistance value range to the first resistance value range by application of a first electric signal and changes from the first resistance value range to the second resistance value range by application of a second electric signal, and the data write circuit may, after application of the forming stress, apply the first electric signal to the memory cell containing data.

In the above data write circuit, the plurality of changeable resistance value ranges may include a first resistance value range which is smaller in resistance value than the initial resistance value range and a second resistance value range which does not overlap with the first resistance value range and is smaller in resistance value than the first resistance value range, and the data write circuit may, after application of the forming stress, compare first data read using a first threshold which is equal to or smaller than a lower limit of the initial resistance value range and is equal to or larger than an upper limit of one of the plurality of changeable resistance value ranges, corresponding to a largest resistance value, to second data read using a second threshold which is equal to or smaller than a lower limit of one of the plurality of changeable resistance value ranges, corresponding to the largest resistance value and is equal to or larger than an upper limit of one of the plurality of changeable resistance value ranges, corresponding to a smallest resistance value, and additionally apply the first electric signal to the memory cell in the changeable resistance value range which is smaller than the second threshold such that the resistance value is within the changeable resistance value range which is larger than the second threshold, when the memory cells which are different in resistance value between the first data and the second data are less than a predetermined number.

In the above data write circuit, the plurality of changeable resistance value ranges may include a second resistance value range which is larger in resistance value than the initial resistance value range and a first resistance value range which does not overlap with the second resistance value range and is larger in resistance value than the second resistance value range, and the data write circuit may, after application of the forming stress, compare first data read using a first threshold which is equal to or larger than an upper limit of the initial resistance value range and is equal to or smaller than a lower limit of one of the plurality of changeable resistance value ranges, corresponding to a smallest resistance value, to second data read using a second threshold which is equal to or larger than an upper limit of one of the plurality of changeable resistance value ranges, corresponding to the smallest resistance value and is equal to or smaller than a lower limit of one of the plurality of changeable resistance value ranges, corresponding to a largest resistance value, and additionally apply the second electric signal to the memory cell in the changeable resistance value range which is larger than the second threshold such that the resistance value is within the changeable resistance value range which is smaller than the second threshold, when the memory cells which are different in resistance value between the first data and the second data are less than a predetermined number.

The above data write circuit may selectively execute a first write mode for changing the memory cell from the initial state to the variable state by applying the forming stress to the memory cell in the initial state, or a second write mode for changing the resistance value of the memory cell between the plurality of changeable resistance value ranges by applying one of a plurality of different electric signals to the memory cell in the variable state.

The above data write circuit may be configured to apply the first electric signal or the second electric signal to the memory cell in the variable state, wherein in application of the forming stress, the data write circuit may store first-kind data on the basis of whether or not the resistance value of each of the memory cells is within the initial resistance value range, and wherein in application of the first electric signal or the second electric signal, the data write circuit may store second-kind data without utilizing whether or not the resistance value of each of the memory cells is within the initial resistance value range and on the basis of whether or not the resistance value of each of the memory cells is within at least one of the changeable resistance value ranges.

In the above data write circuit, the data write circuit may store the first-kind data in a first write address area of the memory cell array, in application of the forming stress, and may store the second-kind data in a second write address area of the memory cell array, in application of the first electric signal or the second electric signal.

The above data write circuit may, in application of the forming stress, set a first write address area in the memory cell array, and store the first-kind data in the first write address area, or apply the forming stress to a region which is different from the first write address area of the memory cell array, to form a second write address area composed of a plurality of memory cells in the variable state; and wherein in application of the first electric signal or the second electric signal, the data write circuit may store the second-kind data in the second write address area of the memory cell array.

In the above data write circuit, each of the plurality of memory cells may include a variable resistance element including a first electrode, a second electrode, and a variable resistance layer provided between the first electrode and the second electrode, and the variable resistance layer of the variable resistance element included in the memory cell in the initial state may insulate the first electrode and the second electrode from each other.

In the above non-volatile memory device, the above data storing method of the non-volatile memory device, and the above data write circuit of the non-volatile memory device, each of the plurality of memory cells may include a variable resistance element including a first electrode, a second electrode, and a variable resistance layer located between the first electrode and the second electrode; and wherein the variable resistance layer may include a metal oxide.

In the above non-volatile memory device, the above data storing method of the non-volatile memory device, and the above data write circuit of the non-volatile memory device, each of the plurality of memory cells may include a variable resistance element including a first electrode, a second electrode, and a variable resistance layer located between the first electrode and the second electrode; and wherein the variable resistance layer may include an oxygen-deficient metal oxide layer.

In the above non-volatile memory device, the above data storing method, and the above data write circuit, the metal oxide may comprise at least one of a transition metal oxide and an aluminum oxide.

In the above non-volatile memory device, the above data storing method, and the above data write circuit, the metal oxide may be at least one of a tantalum oxide, a hafnium oxide, and a zirconium oxide.

In the above non-volatile memory device, the above data storing method, and the above data write circuit, wherein the memory cell in the variable state may include a variable resistance element including a first electrode, a second electrode, and a variable resistance layer located between the first electrode and the second electrode; wherein the variable resistance layer may include an insulator layer including a metal oxide, an oxygen-deficient metal oxide layer, and a conductive path penetrating through the insulator layer; and wherein the conductive path may comprise an oxygen-deficient metal oxide which is lower in oxygen content atomic percentage than the insulator layer.

[Device Configuration]

Figure 2:
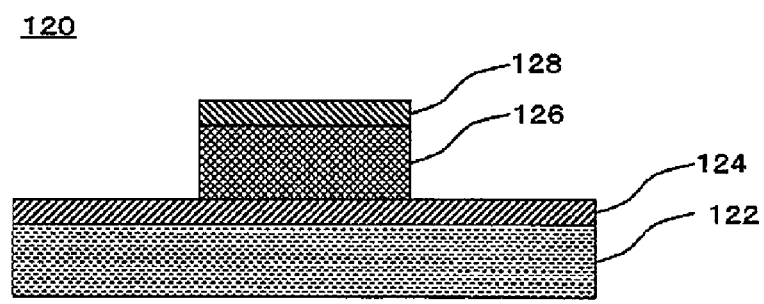
FIG. 2 is a cross-sectional view showing the exemplary schematic configuration of a memory cell included in the non-volatile memory device according to Embodiment 1.
Figure 3:
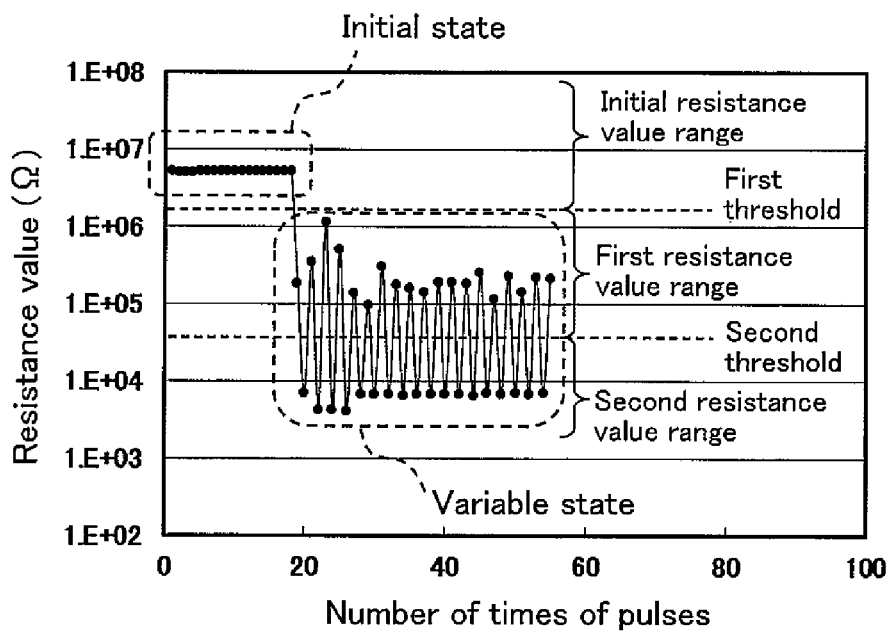
FIG. 3 is a graph showing the exemplary resistance value range of the memory cell included in the non-volatile memory device according to Embodiment 1.

FIG. 1 is a block diagram showing the exemplary schematic configuration of a non-volatile memory device according to Embodiment 1. FIG. 2 is a cross-sectional view showing the exemplary schematic configuration of a memory cell included in the non-volatile memory device according to Embodiment 1. FIG. 3 is a graph showing the exemplary resistance value range of the memory cell included in the non-volatile memory device according to Embodiment 1.

In the example of FIG. 1, a non-volatile memory device 100 of the present embodiment includes a memory cell array 90, a write circuit 92, and a read circuit 94. One or both of the write circuit 92 and the read circuit 94 may be omitted.

The memory cell array 90 may be configured such that a plurality of memory cells 91 are arranged in array.

In the example of FIG. 2, a variable resistance element 120 included in the memory cell 91 includes a base layer 122, a first electrode 124, a variable resistance layer 126, and a second electrode 128.

As exemplarily shown in FIG. 3, the memory cell 91 has at least a variable state and an initial state. The variable state refers to a state in which a resistance value is allowed to reversibly change between a plurality of changeable resistance value ranges in accordance with an electric signal applied to the memory cell 91. The initial state refers to a state in which the resistance value is within an initial resistance value range which does not overlap with the changeable resistance value ranges. The memory cell in the initial state does not change to the variable state unless a forming stress as an electric stress for changing the memory cell in the initial state to the variable state is applied to the memory cell in the initial state. For example, the forming stress may be a cumulative stress. In that case, when the amount of cumulative stress exceeds a specified amount, the memory cell changes from the initial state to the variable state.

The plurality of memory cells 91 included in the memory cell array 90 include the memory cell in the variable state and the memory cell in the initial state. In the memory cell array 90, data is stored on the basis of whether each of the memory cells 91 is in the initial state or the variable state.

After manufacturing, the memory cell 91 does not reversibly change between the plurality of changeable resistance value ranges, unless the memory cell 91 goes through a forming process. The forming process refers to a process in which a particular electric stress is applied to the memory cell to reversibly change the resistance value of the memory cell between the plurality of changeable resistance value ranges. For example, the electric stress applied for performing the forming process may be an electric pulse with a specified voltage and a duration, or a combination of a plurality of electric pulses.

The initial resistance value range and the changeable resistance value ranges may be set so that the resistance value of the memory cell 91, just after manufacturing, is within the initial resistance value range and does not fall into the changeable resistance value ranges. The initial resistance value range and the changeable resistance value ranges may be set so that the resistance value of the memory cell 91 which has changed to the variable state is within the changeable resistance value range and does not fall into the initial resistance value range. It is well known that the memory cell including the non-volatile memory element of the variable resistance element has such a characteristic. The memory cell 91 having such a characteristic can be manufactured using known various materials.

The initial state of the memory cell 91 includes a state in which the memory cell 91 is subjected to an electric stress which is not a forming stress as an electric stress for changing the memory cell 91 to the variable state. The initial state of the memory cell 91 includes a state in which the resistance value corresponding to a state of just after manufacturing has changed because the memory cell 91 is subjected to an electric stress or the like, which is not the forming stress.

The read circuit 94 is configured to read data stored in the memory cell 91, by determining whether the selected memory cell 91 is in the initial state or the variable state.

In the exemplary configuration of the element of FIG. 3, the material of the first electrode 124 is TaN (tantalum nitride), the material of the second electrode 128 is Ir (iridium), the material of the variable resistance layer 126 is tantalum oxide, the thickness of the entire variable resistance layer 126 is equal to or smaller than 50 nm, and the variable resistance layer 126 has a stacked-layer structure including two layers which are different in oxygen concentration. The layer which is in contact with the first electrode 124 is the layer which is lower in oxygen concentration. When the composition of this layer is expressed as $TaO_x$, $0<x<2.5$. The layer which is in contact with the second electrode 128 is the layer which is higher in oxygen concentration. When the composition of this layer is expressed as $TaO_y$, $y \geq 2.1$ and its thickness is about 5.5 nm. The area of the surface of the first electrode 124 and the surface of the variable resistance layer 126, which surfaces are in contact with each other, and the area of the surface of the second electrode 128 and the surface of the variable resistance layer 126, which surfaces are in contact with each other, are each equal to or smaller than 0.25 µm². The forming stress with a voltage of +3.5V and a pulse width of 5 µSec is cumulatively applied. A LR (low-resistance) state writing pulse (pulse used for changing the resistance value of the element from a first resistance value range to a second resistance value range: second electric signal) has a voltage of −2.4V and a pulse with of 50 nSec. A HR (high-resistance) state writing pulse (pulse used for changing the resistance value of the element from the second resistance value range to the first resistance value range: first electric signal) has a voltage of +1.8V and a pulse with of 50 nSec. The voltage is defined as a positive voltage in a case where a positive voltage is applied to the second electrode 128 on the basis of the first electrode 124.

In other example, the material of the first electrode 124 and the second electrode 128 may be platinum (Pt), the material of the variable resistance layer 126 may be hafnium oxide, the thickness of the variable resistance layer 126 may be 30 nm, and an element region may have a circular shape with a diameter of 3 µm. In a case where the variable resistance layer 126 comprises $HfO_{1.6}$, its initial resistance value is about several MΩ, a high-resistance value range is about 1000 to 3000Ω, and a low-resistance value range is about 100 to 300Ω. In this case, for example, the forming stress with a voltage of 2 to 3 V and a pulse width of 100 nSec is cumulatively applied. The LR state writing pulse has a voltage of +1.0V and a pulse with of 100 nSec. The HR state writing pulse has a voltage of −1.3V and a pulse with of 100 nSec.

In the example of FIG. 3, the lower limit of the initial resistance value range is equal to or larger than the upper limits of all of the changeable resistance value ranges. Specifically, the lower limit of the initial resistance value range may be equal to or larger than the upper limit of one of the plurality of changeable resistance value ranges, corresponding to a largest resistance value. More specifically, the lower limit of the initial resistance value range may be equal to the upper limit of the first resistance value range of two changeable resistance value ranges, corresponding to a largest resistance value.

In the example of FIG. 3, a first threshold is a value which is equal to or smaller than the lower limit of the initial resistance value range and is equal to or larger than the upper limit of one of the plurality of changeable resistance value ranges, corresponding to a largest resistance value. Specifically, the first threshold may be a value which is equal to the lower limit of the initial resistance value range and may be equal to the upper limit of one of the plurality of changeable resistance value ranges, corresponding to the largest resistance value. More specifically, the first threshold may be equal to the upper limit of the first resistance value range of two changeable resistance value ranges, corresponding to a largest resistance value. Note that the resistance value which is equal in value to the first threshold may belong to the initial resistance value range, or to one of the plurality of changeable resistance value ranges, corresponding to the largest resistance value.

In the example of FIG. 3, a second threshold is a value which is equal to or smaller than the lower limit of one of the plurality of changeable resistance value ranges, corresponding to a largest resistance value and is equal to or larger than the upper limit of one of the plurality of changeable resistance value ranges, corresponding to a smallest resistance value. Specifically, the second threshold may be a value which is equal to or smaller than the lower limit of the first resistance value range of two changeable resistance value ranges, corresponding to a largest resistance value, and which is equal to or larger than the upper limit of a second resistance value range of two changeable resistance value ranges, corresponding to a smallest resistance value. More specifically, the second threshold may be equal to the lower limit of the first resistance value range and to the upper limit of the second resistance value range. Note that the resistance value which is equal in value to the second threshold may belong to a resistance value range including the resistance value which is larger than the second threshold of the plurality of changeable resistance value ranges or to a resistance value range including the resistance value which is smaller than the second threshold of the plurality of changeable resistance value ranges.

Depending on the configuration of the memory cell 91, the resistance value of the memory cell 91, just after manufacturing, is in some cases smaller than the changeable resistance value ranges. Specifically, for example, in a case where the memory cell 91 includes the variable resistance element including the variable resistance layer comprising iron oxide, such a characteristic is realized. More specifically, the resistivity of the iron oxide is higher in the order of $Fe_3O_4$, FeO, and $Fe_2O_3$. In the exemplary element configuration, the material of the first electrode 124 may be Pt (platinum), the material of the second electrode 128 may be Pt (platinum), the material of the variable resistance layer 126 may be $Fe_3O_4$, and the thickness of the entire variable resistance layer 126 may be equal to or smaller than 50 nm. When the area of the surface of the first electrode 124 and the surface of the variable resistance layer 126, which surfaces are in contact with each other, and the area of the surface of the second electrode 128 and the surface of the variable resistance layer 126, which surfaces are in contact with each other, are each equal to or smaller than 0.25 µm², the initial resistance value is a very low resistance value which is approximately 200Ω. When a pulse which has a pulse width of 10 µSec, has the same polarity as that of the first electric signal, and has a voltage with an absolute value of 3.5V, is applied to the memory cell in the initial state, predetermined number of times, the memory cell changes to a state (high-resistance state of 2K to 8K Ω) in which the resistance value is larger than the initial resistance value. This may be due to the fact that oxidization proceeds in a region of the interface between the second electrode 128 and the variable resistance layer 126, and thereby an insulative resistive layer comprising $Fe_2O_3$ is formed there. After that, when the second electric signal having a voltage with an absolute value of 2.4V is applied to the memory cell, the resistance value changes to the second resistance value range of 300Ω to 500Ω, while when the first electric signal having a voltage with an absolute value of 2.4V and being opposite in polarity to the second electric signal is applied to the memory cell, the resistance value changes to the first resistance value range of 2 KΩ to 8 KΩ.

In other example, the material of the first electrode 124 and the second electrode 128 may be platinum (Pt), the material of the variable resistance layer 126 may be hafnium oxide, the thickness of the variable resistance layer 126 may be equal to 30 nm, and an element region may have a circular shape with a diameter of 3 µm. In a case where the variable resistance layer 126 comprises $HfO_{0.9}$, and the does not cause resistance change in the initial state, the memory cell changes to the variable state, when a pulse with a voltage of 4V and a long pulse width of 100 µSec, is applied to the memory cell as the forming stress. The memory cell in the variable state changes to a low-resistance value range of about 30 to 90Ω by application of the LR state writing pulse with a voltage of −1.3V and a pulse width of 100 Sec, and changes to a high-resistance value range of about 100 to 3000Ω by application of the HR state writing pulse with a voltage of +2.0V and a pulse width of 100 nSec.

In this configuration, the upper limit of the initial resistance value range may be equal to or smaller than the lower limits of all of the changeable resistance value ranges. Specifically, the upper limit of the initial resistance value range may be equal to or smaller than the lower limit of one of the changeable resistance value ranges, corresponding to a smallest resistance value. More specifically, the upper limit of the initial resistance value range may be equal to the lower limit of the second resistance value range which is one of the two changeable resistance value ranges, corresponding to a smallest resistance value.

The first threshold may be a value which is equal to or larger than the upper limit of the initial resistance value range, and is equal to or smaller than the lower limit of one of the plurality of changeable resistance value ranges, corresponding to a smallest resistance value. Specifically, the first threshold may be a value which is equal to the upper limit of the initial resistance value range, and is equal to the lower limit of one of the plurality of changeable resistance value ranges, corresponding to the smallest resistance value. More specifically, the first threshold may be equal to the lower limit of the second resistance value range of two changeable resistance value ranges, corresponding to a smallest resistance value.

The second threshold may be a value which is equal to or larger than the upper limit of one of the plurality of changeable resistance value ranges, corresponding to a smallest resistance value and is equal to or smaller than the lower limit of one of the plurality of changeable resistance value ranges, corresponding to a largest resistance value. Specifically, the second threshold may be a value which is equal to or larger than the upper limit of the second resistance value range of two changeable resistance value ranges, corresponding to a smallest resistance value, and which is equal to or smaller than the lower limit of a first resistance value range of two changeable resistance value ranges, corresponding to a largest resistance value. More specifically, the second threshold may be equal to the lower limit of the first resistance value range and to the upper limit of the second resistance value range.

Note that the upper limit and lower limit of adjacent resistance value ranges need not coincide with each other, and a specified margin may be set between the adjacent resistance value ranges.

The read circuit 94 may be configured to read the stored data, by selectively executing a first read mode for determining whether or not the resistance value of the selected memory cell 91 is larger than the first threshold, or a second read mode for determining whether or not the resistance value of the selected memory cell 91 is larger than the second threshold.

The stored data may include first-kind data and second-kind data, the first-kind data may be stored on the basis of whether or not the resistance value of the memory cell 91 is within the initial resistance value range, and the second-kind data may be stored without utilizing whether or not the resistance value of the memory cell 91 is within the initial resistance value range and on the basis of whether or not the resistance value of the memory cell 91 is within at least one of the changeable resistance value ranges.

In this case, the memory cell array 90 may include a first write address area and a second write address area, the first-kind data may be stored in the first write address area, and the second-kind data may be stored in the second write address area. The first write address area and the second write address area may not be necessarily separated from each other as physical regions. For example, the memory cell 91 corresponding to each address may be allocated to the first write address area or the second write address area, according to a particular rule.

The second write address area is a region composed of, for example, a plurality of memory cells in the variable state. Therefore, by applying the forming stress to the plurality of memory cells included in a particular region, of the memory cell array 90 (e.g., memory cell array 90, just after manufacturing) composed of the plurality of memory cells in the initial state, the second write address area can be formed. That is, by applying the forming stress, the second write address area for writing the second-kind data, can be formed, in addition to the storage of the first-kind data. Also, by selectively applying the forming stress to the plurality of memory cells included in the memory cell array 90, the first write address area and the second write address area can be set. This makes it possible to flexibly choose the capacitive allocation and layout of the address areas. By applying the forming stress to a portion of the first write address area, this region can be changed into the second write address area.

By placing the first write address area or the second write address area on the same memory cell array 90, the confidentiality of the information can be improved, even when the information is transmitted and received between the first write address area and the second write address area, for example.

In the example of FIG. 3, specifically, for example, the first-kind data may be stored on the basis of whether or not the resistance value of the memory cell 91 is within the initial resistance value range, and the second-kind data may be stored on the basis of whether or not the resistance value of the memory cell 91 is within the second resistance value range.

Although in the example of FIG. 3, the number of changeable resistance value ranges is two, the number of changeable resistance value ranges may be three or more. In other words, the memory cell 91 may be a multi-valued memory.

When N is an integer which is equal to or larger than 3, the memory cell 91 in the variable state may change between (N−1) changeable resistance value ranges in accordance with an electric signal applied thereto, and in the memory cell array 90, multi-valued data may be stored, on the basis of which of N resistance value ranges including the initial resistance value range and the (N−1) changeable resistance value ranges, the resistance value of the memory cell 91 is within. In the example of FIG. 3, N=3. N may be an integer which is equal to or larger than 4.

When N is an integer which is equal to or larger than 3, M1 is a positive integer which is equal to or smaller than N, and M2 is a positive integer which is equal to or smaller than (N−1), the first-kind data may be stored on the basis of which of M1 resistance value ranges which do not overlap with each other and include the initial resistance value range, the resistance value of the memory cell 91 is within, the second-kind data may be stored on the basis of which of M2 resistance value ranges which do not overlap with each other and do not include the initial resistance value range, the resistance value of the memory cell 91 is within, and (M1−1) resistance value ranges which do not include the initial resistance value range, of the M1 resistance value ranges used to store the first-kind data, may be identical to one of the M2 resistance value ranges used to store the second-kind data.

When N is an integer which is equal to or larger than 3, M1 is a positive integer which is equal to or smaller than N, and M2 is a positive integer which is equal to or smaller than (N−1, the first-kind data may be stored on the basis of which of M1 resistance value ranges which do not overlap with each other and include the initial resistance value range, the resistance value of the memory cell 91 is within, the second-kind data may be stored on the basis of which of M2 resistance value ranges which do not overlap with each other and do not include the initial resistance value range, the resistance value of the memory cell 91 is within, and at least one of (M1−1) resistance value ranges which do not include the initial resistance value range, of the M1 resistance value ranges used to store the first-kind data, may be different from the M2 resistance value ranges used to store the second-kind data.

The read circuit 94 may selectively execute a first read mode for reading the first-kind data using a first-kind threshold group including (M1−1) thresholds, or a second read mode for reading the second-kind data using a second-kind threshold group including (M2−1) thresholds, wherein the first-kind threshold group includes a first threshold which is equal to or smaller than the lower limit of the initial resistance value range and is equal to or larger than the upper limit of one of the plurality of changeable resistance value ranges, corresponding to a largest resistance value, and the thresholds included in the second-kind threshold group may be equal to or smaller than the lower limit of one of the plurality of changeable resistance value ranges, corresponding to a largest resistance value. In the example of FIG. 3, the threshold belonging to the first-kind threshold group is the first threshold, while the threshold belonging to the second-kind threshold group is the second threshold.

In the variable resistance element of FIG. 3, for example, the initial resistance value range may be set equal to or larger than $2\times10^6\Omega$, and smaller than $1.0\times10^7\Omega$, and the changeable resistance value ranges may be set equal to or larger than $5\times10^4\Omega$, and smaller than $2\times10^6\Omega$, and equal to or larger than $5\times10^3\Omega$, and smaller than $5\times10^4\Omega$. In this case, the first threshold is $2\times10^6\Omega$, and the second threshold is $5\times10^4\Omega$.

[Configuration of Variable Resistance Element]

The variable resistance element 120 has a structure in which the variable resistance layer 126 is provided between the first electrode 124 and the second electrode 128. The variable resistance layer 126 may comprise, for example, a metal oxide, more specifically, for example, a transition metal oxide. The variable resistance element 120 of the memory cell 91 in the variable state has a characteristic in which the resistance value between the first electrode 124 and the second electrode 128 reversibly changes between the plurality of changeable resistance value ranges by application of the electric signal between the first electrode 124 and the second electrode 128.

The variable resistance layer 126 of the variable resistance element 120 of the memory cell 91 in the initial state may insulate the first electrode 124 and the second electrode 128 from each other. The insulation may be specifically such that the resistance value is equal to or larger than 2 MΩ. The variable resistance layer 126 of the variable resistance element 120 may include a layer comprising an insulator. The insulator may be, specifically, a material having a resistivity of 30 Ω·m or larger. Since the variable resistance layer 126 of the variable resistance element 120 comprises the insulator, the resistance characteristic of the memory cell in the initial state can be maintained steadily.

The variable resistance element in the initial state refers to the element in the initial resistance value range, in which the memory cell does not change to the variable state unless a forming stress as an electric stress for changing the memory cell in the initial state to the variable state is applied to the memory cell in the initial state and in which its resistance value does not overlap with the changeable resistance value ranges. The variable resistance element in the initial state does not easily change to the variable state unless the forming stress is applied thereto. This allows the data to be retained steadily, on the basis of a difference between the initial state and the variable state. The initial resistance value range of the variable resistance element in the initial state can be adjusted to some extent depending on the material, size, shape, manufacturing conditions, and the like of the variable resistance element in the initial state, differently from the variable resistance element in the variable state in which its resistance value changes by application of the electric signal. Especially, in a case where the variable resistance layer 126 has a stacked-layer structure, the initial resistance value range of the variable resistance element in the initial state can be adjusted as desired, depending on the thickness and oxygen concentration during the deposition, of the layer which is higher in oxygen concentration.

For example, the initial resistance value range may be defined as a range of the resistance value read by application to the variable resistance element in the initial state a voltage which is smaller in magnitude than the forming stress and the electric signal for changing the resistance value of the element in the variable state between the plurality of changeable resistance value ranges.

The forming stress is decided depending on the amount of the amplitude, pulse width, cumulative application time, and the like of the voltage applied to the memory cell 91, and their values are different for each of the memory cells 91 within the memory cell array 90. For example, the cumulative application time refers to a total of the pulse width of the electric pulse applied for the resistance state to change from the initial state to the variable state. Therefore, the specific values of parameters defining the electric stress which is required at minimum as the forming stress, are values of the voltage, pulse width, cumulative application time, and the like of the electric stress applied to allow the element of each target memory cell 91 to change to the variable state, are not absolute fixed values and have non-uniformity.

In general, the forming stress is larger in magnitude than the electric signal applied to reversibly change the resistance value of the memory cell in the variable state, between the plurality of changeable resistance value ranges. Specifically, the forming stress may be larger in magnitude than the electric signal applied to change the resistance value of the memory cell in the variable state, in at least any one of the absolute value, pulse width, and cumulative application time of the voltage.

The variable resistance element which changes the resistance value by application of the electric signal with the same polarity, which is different in voltage, pulse width and the like, to the element in the variable state, will be referred to as a unipolar variable resistance element. More specifically, for example, when the electric signal (electric pulse) with a voltage of +2V and a pulse width of 1 μs is applied in a direction in which a current flows from the second electrode 128 to the first electrode 124, the resistance value of the variable resistance element changes to a particular high-resistance level (first resistance value range: also will be referred to as HR level), while when the electric signal with a voltage of +4V and a pulse width of 50 ns is applied in a direction in which a current flows from the second electrode 128 to the first electrode 124, in the same manner, the resistance value of the variable resistance element changes to a particular low-resistance level (second resistance value range: also will be referred to as LR level). The variable resistance element which reversibly changes the resistance value by application of the electric signal with the same polarity in the above described manner, will be referred to as the unipolar variable resistance element.

By comparison, the variable resistance element which changes the resistance value by application of the electric signal with a different polarity, to the element in the variable state, will be referred to as a bipolar variable resistance element. More specifically, for example, when the electric signal with a voltage of +2V and a pulse width of 50 ns is applied in a direction in which a current flows from the second electrode 128 to the first electrode 124, the resistance value of the variable resistance element changes to a particular high-resistance level (first resistance value range: also will be referred to as HR level), while when the electric signal with a voltage of +2V and a pulse width of 50 ns is applied in a direction in which a current flows from the first electrode 124 to the second electrode 128, the resistance value of the variable resistance element changes to a particular low-resistance level (second resistance value range: also will be referred to as LR level). The variable resistance element which reversibly changes the resistance value by application of the electric signal with an opposite polarity in the above described manner, will be referred to as the bipolar variable resistance element.

Of course, to enable the bipolar variable resistance element to operate steadily, for example, the pulse width and the absolute value of the voltage may be made different, between the electric signal applied in a case where the element is changed to the HR level (also referred to as writing HR state to the element) and the electric signal applied in a case where the element is changed to the LR level (also referred to as writing LR state to the element), as well as the polarity.

The variable resistance layer 126 may comprise a metal oxide. The variable resistance layer 126 may include a layer comprising an oxygen-deficient metal oxide. The metal oxide constituting the variable resistance layer 126 may be at least one of a transition metal oxide and an aluminum oxide, or may be at least one of a tantalum oxide, an iron oxide, a hafnium oxide and a zirconium oxide.

As the material of the variable resistance layer of the unipolar variable resistance element, a titanium (Ti) oxide, a nickel (Ni) oxide, an aluminum (Al) oxide, etc., may be used. By comparison, as the material of the variable resistance layer of the bipolar variable resistance element, a tantalum (Ta) oxide, a hafnium (Hf) oxide, an aluminum (Al) oxide, an iron (Fe) oxide, etc., may be used.

Even when the oxide of the same material is used, both of the bipolar variable resistance element and the unipolar variable resistance element may be sometimes obtained depending on a combination with the electrode material, the stacked-layer structure of the oxide, etc. When the tantalum oxide is used as the material of the variable resistance layer, the variable resistance element is allowed to have a good characteristic. Therefore, this will be described in detail in the present embodiment.

As the material of the first electrode 124 and the material of the second electrode 128, for example, iridium (Ir), platinum (Pt), tungsten (W), copper (Cu), aluminum (Al), a titanium nitride (TiN), a tantalum nitride (TaN), a titanium aluminum nitride (TiAlN), etc., may be used. Although in the example of FIG. 2, the first electrode 124 has a larger area than the second electrode 128, the present disclosure is not limited to this. For example, the first electrode 124 and the second electrode 128 may be allowed to suitably have optimal shapes, depending on semiconductor process steps, for example, use of the first electrode 124 as a portion of a wire. Likewise, the base layer 122 may be suitably omitted or modified, depending on the semiconductor process steps.

Figure 24:
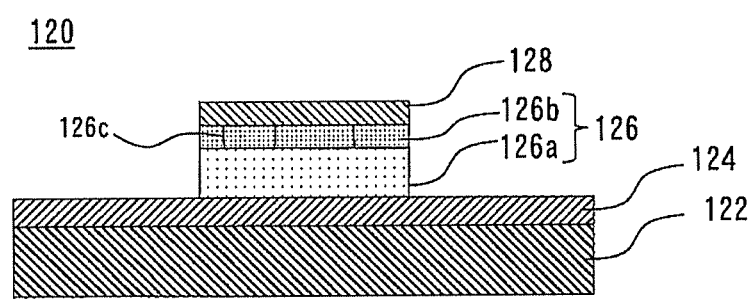
FIG. 24 is a cross-sectional view showing an exemplary schematic configuration of a memory cell included in the non-volatile memory device according to Embodiment 1.

Turning to FIG. 24, the variable resistance layer 126 may be configured such that at least two layers, i.e., a first variable resistance layer 126a connected to the first electrode 124 and a second variable resistance layer 126b connected to the second electrode 128 are stacked together.

The first variable resistance layer 126a may comprise an oxygen-deficient first metal oxide, while the second variable resistance layer 126b may comprise an oxygen-deficient second metal oxide which is lower in oxygen atomic percentage than the first metal oxide. The second variable resistance layer 126b may be a layer comprising the insulator. A minute localized region in which the degree of oxygen deficiency reversibly changes in response to the electric pulse applied, is formed in the second variable resistance layer 126b. It is considered that the localized region includes a filament comprising oxygen vacancy sites. The localized region may be a conductive path 126c penetrating the second variable resistance layer 126b. The insulator may comprise a metal oxide, and the conductive path 126c may comprise an oxygen-deficient metal oxide which is lower in oxygen atomic percentage than the insulator.

The term "degree of oxygen deficiency" refers to a ratio of an amount of oxygen which is deficient with respect to an amount of oxygen constituting an oxide having a stoichiometric composition (stoichiometric composition corresponding to a largest resistance value in a case where there exist plural stoichiometric compositions) of each metal oxide. A metal oxide having a stoichiometric composition is more stable and has a larger resistance value than a metal oxide having another composition.

For example, in a case where the metal is tantalum (Ta), a tantalum oxide having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $Ta_{1.5}$, is $(2.5-1.5)/2.5=40\%$. An oxygen excess metal oxide has a negative value in degree of oxygen deficiency. In the present specification, the degree of oxygen deficiency is meant to include a positive value, 0 and a negative value unless otherwise noted.

An oxide which is lower in degree of oxygen deficiency is closer to the oxide having a stoichiometric composition and therefore has a larger resistance value, while an oxide which is higher in degree of oxygen deficiency is closer to the metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide and the metal constituting the second metal oxide are of the same kind, there is a correspondence between the oxygen content atomic percentage and the degree of oxygen deficiency. Specifically, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

As the metal constituting the variable resistance layer, a metal other than tantalum may be used. As the metal constituting the variable resistance layer, at least either a transition metal or aluminum (Al) may be used. As the transition metal, tantalum (Ta), titanium (Ti), hafnium (Hf), zirconium (Zr), niobium (Nb), tungsten (W), nickel (Ni), iron (Fe), etc., may be used. Since the transition metal can assume plural oxidized states, different resistance states can be implemented by the redox reaction.

When x of $HfO_x$ of the composition of the first metal oxide is equal to or larger than 0.9 and equal to or less than 1.6, and y of $HfO_y$ of the composition of the second metal oxide is larger than x, in a case where the hafnium oxide is used, the resistance value of the variable resistance layer is allowed to change stably and at a high speed. In this case, the thickness of the second metal oxide may be set to 3 to 4 nm.

When x of $ZrO_x$ of the composition of the first metal oxide is equal to or larger than 0.9 and equal to or less than 1.4, and y of $ZrO_y$ of the composition of the second metal oxide is larger than x, in a case where the zirconium oxide is used, the resistance value of the variable resistance layer is allowed to change stably and at a high speed. In this case, the thickness of the second metal oxide may be set to 1 to 5 nm.

The first metal constituting the first metal oxide and the second metal constituting the second metal oxide may be different metals. In this case, the second metal oxide may be lower in degree of oxygen deficiency than the first metal oxide, i.e., higher in resistance than the first metal oxide. In such a configuration, a larger portion of a voltage applied between the first electrode 124 and the second electrode 128 to cause resistance change is fed to the second metal oxide, and the redox reaction taking place within the second metal oxide is facilitated.

In a case where the first metal constituting the first metal oxide which will become a first variable resistance layer and the second metal constituting the second metal oxide which will become a second variable resistance layer are materials which are different from each other, the standard electrode potential of the second metal may be lower than the standard electrode potential of the first metal. The standard electrode potential is a characteristic in which as its value is larger, the corresponding material is less easily oxidized. This allows the redox reaction to take place more easily in the second metal oxide which is relatively lower in standard electrode potential. It is estimated that in a resistance changing phenomenon, the redox reaction takes place in the minute localized region formed within the second metal oxide which is higher in resistance, the filament (conductive path) changes, and thereby its resistance value (degree of oxygen deficiency) changes.

For example, a stable resistance changing operation is attained by using an oxygen-deficient tantalum oxide ($TaO_x$) as the first metal oxide and by using a titanium oxide ($TiO_2$) as the second metal oxide. Titanium (standard electrode potential=−1.63 eV) has a lower standard electrode potential than tantalum (standard electrode potential=−0.6 eV). By using as the second metal oxide an oxide of a metal having a lower standard electrode potential than the metal of the first metal oxide, the redox reaction easily takes place within the second metal oxide. As another combination, an aluminum oxide ($Al_2O_3$) may be used as the second metal oxide which will become the high-resistance layer. For example, an oxygen-deficient tantalum oxide ($TaO_x$) may be used as the first metal oxide, and the aluminum oxide ($Al_2O_3$) may be used as the second metal oxide.

It is estimated that in a resistance changing phenomenon in the variable resistance layer having the stacked-layer structure, the redox reaction takes place in the minute localized region formed within the second metal oxide which is higher in resistance, the filament (conductive path) in the localized region changes, and thereby its resistance value changes.

Specifically, when a positive voltage is applied to the second electrode 128 connected to the second metal oxide on the basis of the first electrode 124, oxygen ions within the variable resistance layer are drawn toward the second metal oxide. Thereby, an oxidization reaction proceeds in the minute localized region formed within the second metal oxide, and the degree of oxygen deficiency reduces. This may result in a situation in which connection of the filament in the localized region does not easily occur, and the resistance value increases.

Conversely, when a negative voltage is applied to the second electrode 128 connected to the second metal oxide on the basis of the first electrode 124, the oxygen ions within the second metal oxide are forced to migrate toward the first metal oxide. Thereby, the reduction reaction proceeds in the minute localized region formed within the second metal oxide, and the degree of oxygen deficiency increases. This may result in a situation in which connection of the filament in the localized region easily occurs, and the resistance value decreases.

Figure 4:
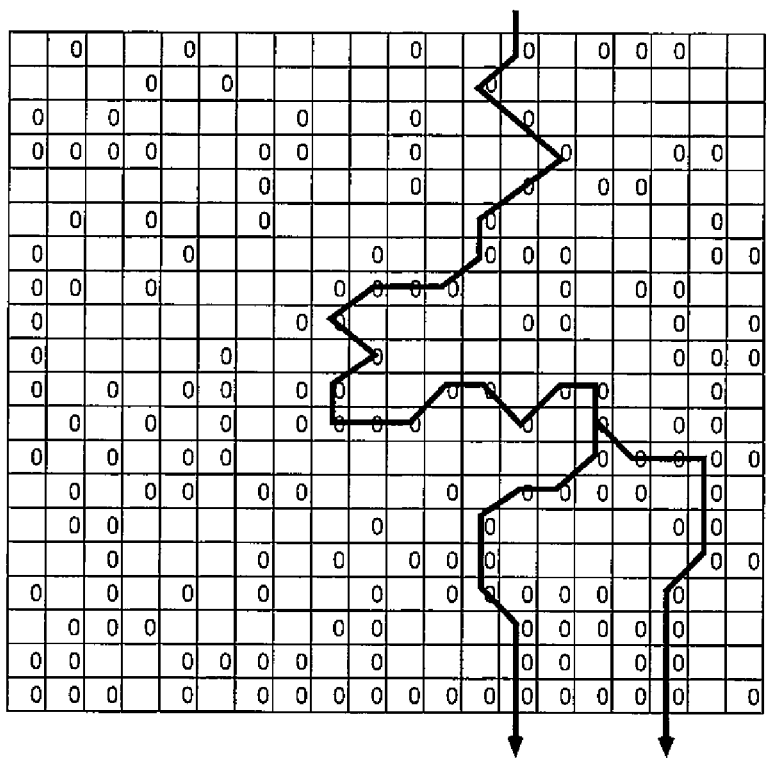
FIG. 4 is a view showing the exemplary simulation of formation of a filament in a variable resistance layer, which simulation is conducted using a percolation model.

FIG. 4 is a view showing the exemplary simulation of formation of the filament in the variable resistance layer (e.g., localized region) which simulation is conducted using a percolation model. In this example, the oxygen vacancy sites (hereinafter will be simply referred to as "vacancy sites"), or the like, in the variable resistance layer, are connected, thereby forming the filament (conductive path). The percolation model refers to a model based on a theory that a probability with which the vacancy sites or the like distributed randomly in the variable resistance layer are connected increases if the density of the vacancy sites or the like exceeds a threshold. The term "vacancy" means that oxygen is deficient in the metal oxide, for example. The "density of the vacancy sites" corresponds to the degree of oxygen deficiency. That is, as the degree of oxygen deficiency increases, the density of the vacancy sites increases, too.

In the simulation of FIG. 4, the oxygen ion sites of the variable resistance layer are approximately assumed as regions (sites) separated in lattice, and the filament formed by the vacancy sites probabilistically is found by the simulation. In FIG. 4, the sites containing "0" represent the vacancy sites formed in the variable resistance layer. On the other hand, the sites which are blank represent the sites occupied by the oxygen ions and mean high-resistance regions. The cluster of the vacancy sites (cluster of the vacancy sites connected to each other within a range of one site in upward and downward, rightward and leftward, and oblique directions) indicated by arrows, represent the filament formed in the variable resistance layer, i.e., path through which a current flows, when a voltage is applied in the upward and downward direction in FIG. 4. As shown in FIG. 4, the filament through which a current flows between the lower surface and upper surface of the variable resistance layer is formed by the cluster of the vacancy sites connecting the upper end to the lower end of the vacancy sites distributed randomly. Based on this percolation model, the number and shape of filaments are probabilistic. The distribution of the number and shape of filament becomes the non-uniformity of the resistance value of the variable resistance layer.

A forming operation corresponds to the operation for changing the density of the vacancy sites within the metal oxide, in a portion of the variable resistance layer, to form the filament. Specifically, by application of the electric stress, the filament connecting the vacancy sites which were non-dense in the initial state, is formed. In a case where the variable resistance element including the variable resistance layer comprising the metal oxide is formed, the vacancy sites within the variable resistance layer are placed randomly for each memory cell. Therefore, it is estimated that even when a specified electric stress is applied to each of the memory cells, the maximum distance or the like between the vacancy sites, which become barrier in the formation of the filament (connection of the vacancies), becomes non-uniform randomly among the memory cells, and thereby the amount of stress for causing the forming to occur becomes non-uniform randomly among the memory cells. It is also estimated that as a result of the above, when a specified electric stress is applied to the plurality of memory cells in the initial state, the memory cells for which the forming completes occur randomly.

Regarding the material in which the filament path is formed by connecting the oxygen vacancy sites and the like, occurrence of the forming (change from initial state to variable state) can be explained by using a similar mechanism. From this, it is estimated that for example, even when the metal contained in the metal oxide is different, the number and shape of the filaments which occur by the forming are probabilistic, in the same manner. Therefore, it is decided probabilistically, i.e., randomly, whether or not the forming occurs when a specified electric stress is applied to the memory cell in the initial state.

The second electrode 128 connected to the second metal oxide which is lower in degree of oxygen deficiency may comprise, for example, a material which is higher in standard electrode potential than the metal constituting the second metal oxide and the material constituting the first electrode 124, such as platinum (Pt), iridium (Ir), and palladium (Pd). The first electrode 124 connected to the first metal oxide which is higher in degree of oxygen deficiency may comprise for example, a material which is lower in standard electrode potential than the metal constituting the first metal oxide, such as tungsten (W), nickel (Ni), tantalum (Ta), titanium (Ti), aluminum (Al), a tantalum nitride (TaN), and a titanium nitride (TiN). The standard electrode potential is a characteristic in which as its value is larger, the corresponding material is less easily oxidized.

When the standard electrode potential of the second electrode 128 is V2, the standard electrode potential of the metal constituting the second metal oxide is Vr2, the standard electrode potential of the metal constituting the first metal oxide is Vr1, and the standard electrode potential of the first electrode 124 is V1, Vr2<V2 and V1<V2 may be satisfied. Furthermore, V2>Vr2 and Vr1≥V1 may be satisfied.

By the above described configuration, the redox reaction takes place selectively in a region of the second metal oxide which is in the vicinity of the interface between the second electrode 128 and the second metal oxide, and hence a stable resistance changing phenomenon is attained.

More suitably, the variable resistance layer 126 has at least a stacked-layer structure in which a first variable resistance layer having a composition expressed as $TaO_x$ (0≤x<2.5) and a second variable resistance layer having a composition expressed as $TaO_y$ (x<y<2.5) are stacked together. Of course, other layer, for example, a third variable resistance layer or the like comprising a metal oxide which is other than the tantalum oxide, may be placed suitably.

$TaO_x$ may satisfy 0.8≤x<1.9. $TaO_y$ may satisfy 2.1≤y<2.5. The thickness of the second tantalum containing layer may be 1 nm or larger and 8 nm or smaller. By stacking together the layers which are different in degree of oxygen deficiency, the direction of resistance change in the bipolar type can be decided. For example, the second variable resistance layer is placed closer to the second electrode 128, and the first variable resistance layer is placed closer to the first electrode 124. In this configuration, the variable resistance element changes to the HR state by application of a voltage in the direction in which a current flows from the second electrode 128 to the first electrode 124, and changes to the LR state by application of a voltage in an opposite direction. Of course, when the second variable resistance layer is placed in contact with the first electrode 124 and the first variable resistance layer is placed in contact with the second electrode 128, the relation between the resistance change and the direction of voltage application is reversed.

[Characteristic of Variable Resistance Element]

Figure 5:
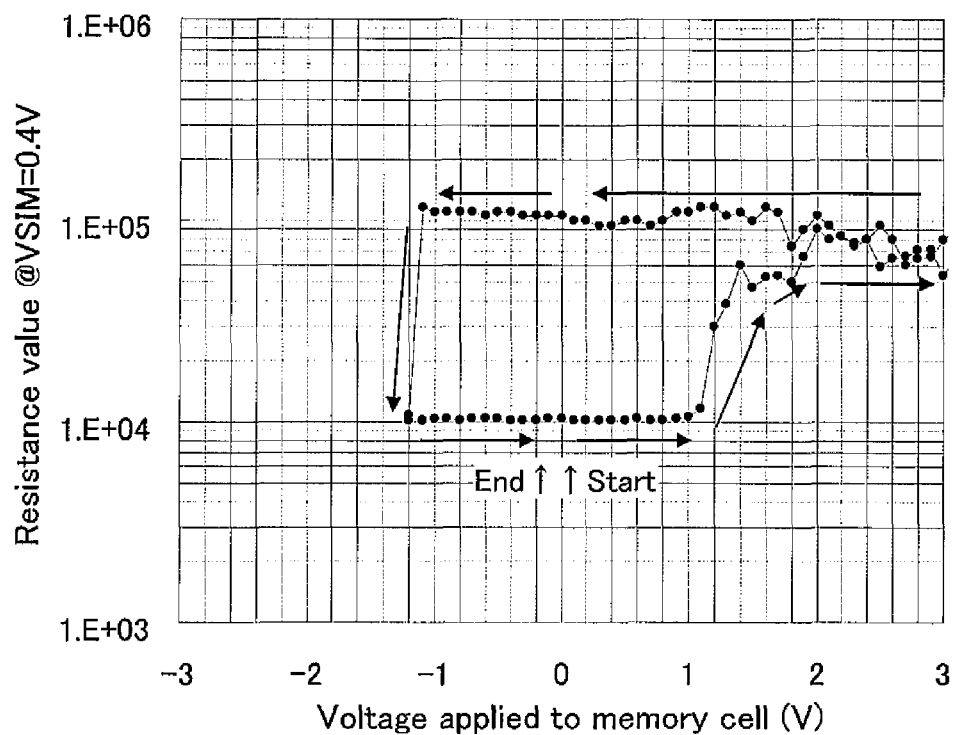
FIG. 5 is a view showing the exemplary characteristic of a bipolar variable resistance element in a variable state.

FIG. 5 is a view showing the exemplary characteristic of the bipolar variable resistance element in the variable state. In the configuration of the element of FIG. 5, the material of the first electrode 124 is TaN, the material of the second electrode 128 is Ir, the variable resistance layer 126 has at least a stacked-layer structure in which the first tantalum-containing layer having a composition represented by $TaO_x$ (0<x<2.5) and the second tantalum-containing layer having a composition represented by $TaO_y$ (x<y) are stacked together, the first tantalum-containing layer is placed in contact with the first electrode 124 and the second-tantalum containing layer is placed in contact with the second electrode 128. The bipolar variable resistance element is fabricated such that $TaO_x$ satisfies 0.8≤x≤1.9 and $TaO_y$ satisfies 2.1≤y≤2.5. The thickness of the second tantalum-containing layer is 8 nm or smaller, and the thickness of the entire variable resistance layer 126 is 50 nm or smaller. The area of the surface of the first tantalum-containing layer and the surface of the electrode, which surfaces are in contact, and the area of the surface of the second tantalum-containing layer and the surface of the electrode, which surfaces are in contact, are equal to those of the variable resistance element used in the measurement of FIG. 3.

In FIG. 5, a horizontal axis indicates the voltage of the electric signal applied, and a vertical axis indicates the resistance value (resistance value calculated from the current in the case where a read voltage $Y_R$ is applied) of the variable resistance element after the electric signal is applied to the variable resistance element. When a voltage level is gradually increased toward a positive side from a start position of FIG. 5, the resistance value increases gradually from a time point when the applied voltage exceeds +1.1V, and reaches about 100 kΩ when the applied voltage is +2.0V. Conversely, when the voltage level is gradually decreased toward a negative side, the resistance value decreases to about 10 kΩ when the applied voltage exceeds −1.1V, and returns to the resistance value at the start. In this case, the variable resistance layer 126 is configured such that the second variable resistance layer is placed closer to the second electrode 128, and the first variable resistance layer is placed closer to the first electrode 124. Positive application is defined as application of the electric signal in which a current flows from the second electrode 128 to the first electrode 124. In the positive application, the variable resistance element 120 changes to the HR level. Negative application is defined as application of the electric signal in which a current flows in an opposite direction. In the negative application, the variable resistance element 120 changes to the LR level. When the voltage for changing the variable resistance element 120 from LR to HR is the HR state writing voltage ($V_H$), and the voltage for changing the variable resistance element 120 from HR to LR is the LR state writing voltage ($V_L$), the variable resistance element 120 can change between the LR state and the HR state adequately, using a common power supply voltage, if the absolute value $|H_H|=|V_L|$=about 2.0V.

Figure 6:
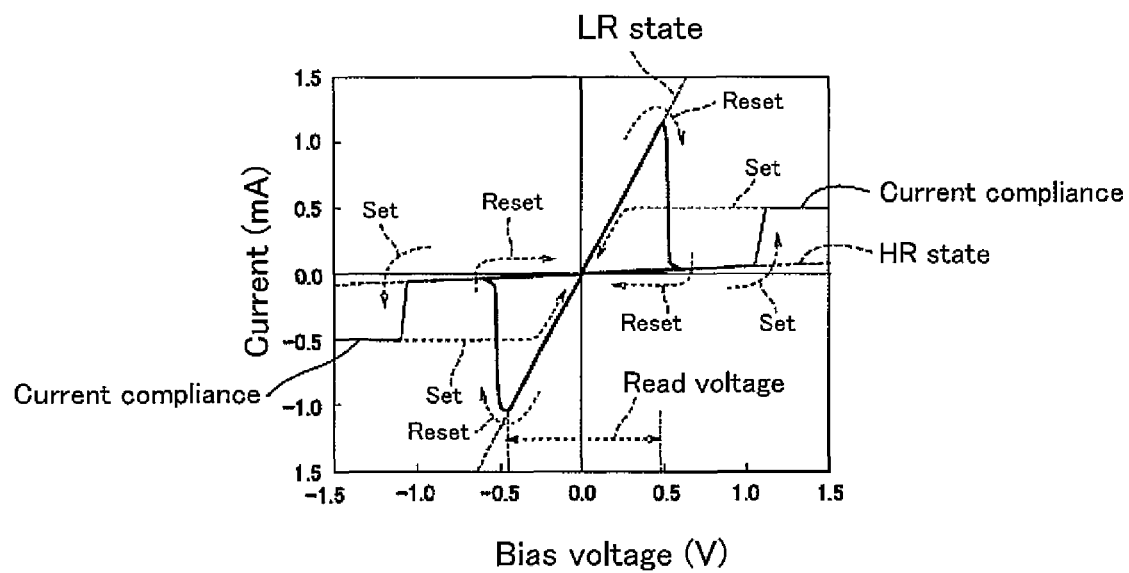
FIG. 6 is a view showing the exemplary characteristic of a unipolar variable resistance element in a variable state.

FIG. 6 is a schematic view showing the exemplary characteristic of the unipolar variable resistance element in a variable state, disclosed in IEDM Technical Digest. 13-15 Dec. 2004, p 587. As described in this document, it is known that the variable resistance element including the variable resistance layer comprising NiO, $TiO_2$, $HfO_2$, or $ZrO_2$ has a unipolar characteristic and the variable resistance layer comprising this transition metal oxide is an insulator just after manufacturing and changes to the variable state by formation of the conductive path by the process for applying the forming stress.

Depending on a combination of the material of the variable resistance layer and the electrode, impurities doped on a variable resistance material, etc., an element which causes resistance change in a unipolar manner symmetrically at a positive voltage side and a negative voltage side, can be attained. FIG. 6 exemplarily shows the characteristic of such an element.

In the example of FIG. 6, when the absolute value of a bias voltage exceeds 0.5V, the element shifts to a reset state, i.e., HR level, while when the absolute value of the bias voltage exceeds 1.0V, the element shifts to a set state, i.e., LR level. This element is allowed to reversibly change between two resistance states by application of electric signals with the same polarity and with different voltages. Alternatively, the unipolar variable resistance element having a characteristic of FIG. 6, may be used as the bipolar variable resistance element by performing control such that the variable resistance element changes to the HR state by application of a positive electric signal of a voltage which is +0.5V or larger and smaller than +1V, and changes to the LR state by application of a negative electric signal of a voltage which is −1V or smaller (absolute value is 1V or larger). In the present disclosure, both of the bipolar variable resistance element and the unipolar variable resistance element may be used.

The variable resistance element may be used as a multi-valued memory which reversibly changes the resistance value between three or more changeable resistance value ranges, depending a combination of the voltage (absolute value), pulse width, the number of times, and the like of the electric signal applied thereto. For example, the variable resistance element including the variable resistance layer comprising the tantalum oxide has a good characteristic and may be applicable to the multi-valued memory.

Figure 7:
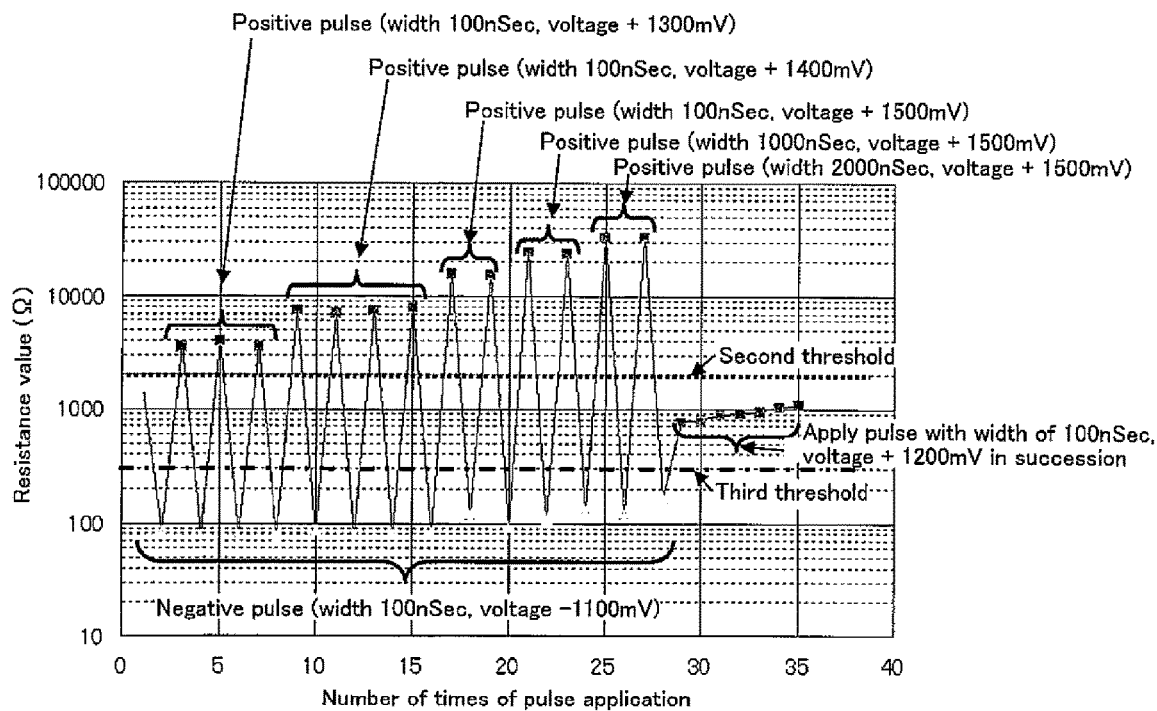
FIG. 7 is a view showing the exemplary resistance changing characteristic of the variable resistance element.

FIG. 7 is a view showing the exemplary resistance changing characteristic of the variable resistance element. A horizontal axis indicates the number of times of application of the pulse (electric signal), and a vertical axis indicates the resistance value read after the application of the electric signal (as described above, the resistance value is calculated from the current in the case where the read voltage $Y_R$ is applied). Triangles (▲) indicate the resistance values read after a negative pulse (electric signal) is applied, while rectangles (■) indicate the resistance values read after a positive pulse (electric signal) is applied.

In the configuration of the element of FIG. 7, the material of the first electrode 124 is a tantalum nitride (TaN), the material of the second electrode 128 is platinum (Pt), the material of the variable resistance layer 126 is the tantalum oxides of the stacked-layer structure, the thickness of the variable resistance layer 126 is 50 nm or less, the area of the surface of the first electrode 124 and the surface of the variable resistance layer 126, which surfaces are in contact with each other, and the area of the surface of the second electrode 128 and the surface of the variable resistance layer 126, which surfaces are in contact with each other, are each equal to or smaller than 0.25 μm². The layer placed in contact with the first electrode 124, of the layers of the variable resistance layer 126, is the layer which is lower in oxygen concentration, and satisfies 0<x<2.5 when its composition is expressed as $TaO_x$. On the other hand, the layer placed in contact with the second electrode 128, of the layers of the variable resistance layer 126, is the layer which is higher in oxygen concentration, satisfies y≥2.1 when its composition is expressed as $TaO_y$, and has a thickness of about 5 nm.

As can be seen from FIG. 7, when the pulse voltage is increased from 1300 mV to 1500 mV, the resistance value read after application of the positive pulse increases gradually. In a case where the pulse voltage is fixed to 1500 mV, the resistance value read after application of the positive pulse increases gradually, when the pulse width is changed as 100 nSec, 1000 nSec, and 2000 nSec. In a case where the pulse voltage is applied plural times in succession, in a state in which the pulse voltage is fixed to a relatively small value, 1200 mV, the resistance value read after application of the positive pulse increases gradually. It can be found that the resistance value can be finely adjusted by using the voltage pulse with a relatively small magnitude, by utilizing such a characteristic. In other words, the variable resistance element having a characteristic of FIG. 7 is allowed to set the resistance value in any one of three or more changeable resistance value ranges, with high controllability.

When a sense amplifier which determines the resistance value using the second threshold, of FIG. 7, is used, it determines that the resistance values of all of the memory cells 91 to which the data is written by application of the positive pulse of +1300 mV or larger are larger than the second threshold, and outputs 0 of binary data (when the resistance value which is larger than the threshold is defined as digital data 0). On the other hand, when the resistance value of the memory cell 91 to which the data is written by application of a negative pulse and the resistance value of the memory cell 91 to which the data is written by application of the positive pulse of +1200 mV and 100 ns are smaller than the second threshold, the sense amplifier outputs 1 of binary data (when the resistance value which is smaller than the threshold is defined as digital data 1) for these memory cells 91. Note that the cell having a resistance value which perfectly coincides with the value of the threshold may be allocated to 1 or 0.

When the sense amplifier which determines the resistance value using the third threshold, of FIG. 7, is used, it determines that the resistance values of all of the memory cells 91 to which the data is written by application of the positive pulse of +1200 mV or larger are larger than the third threshold, and outputs 0 of the binary data. On the other hand, only the resistance value of memory cell 91 to which the data is written by application of a negative pulse is smaller than the third threshold, and therefore, the sense amplifier outputs 1 of the binary data.

By combining two kinds of outputs of the sense amplifier as described above, the element of FIG. 7 can be used as a three-valued memory.

The resistance change of the variable resistance element (ReRAM element) which occurred by the event that the conductive path electrically connecting the second electrode 128 to the first electrode 124 was generated within the variable resistance layer 126 was observed by cross-sectional analysis. It was found out that the conductive path had a diameter of 30 to 10 nm or less, and was smaller than the width of the wire manufactured by semiconductor process steps for a miniaturized structure in the state of the art. In other words, the variable resistance element as described above can maintain the stable resistance changing characteristic as well, even when it is manufactured by semiconductor process steps for a super miniaturized structure, which is recognized as a limit of processing using lithography.

The process step for forming the variable resistance layer of the variable resistance element (ReRAM element) need not a high-temperature treatment which exceeds several hundreds degrees C. Because of this, the characteristic of C-MOS transistor will not be degraded by a heating process step. Specifically, the variable resistance element has a feature in which it is highly compatible with the semiconductor process steps, and the reliability of resistance change is not degraded even when further miniaturization of the semiconductor process steps progresses, as compared to a memory element including a floating gate transistor such as a flash memory. Therefore, for example, even in a case where a logic circuit such as a controller and the variable resistance element are mounted on the same chip, the variable resistance element can be formed while lessening the effects on the characteristic of the logic circuit. In addition, the variable resistance element can be formed using the same process step as that for the logic circuit, manufacturing cost can be reduced.

[Operation Modes and Commands]

In the present embodiment, the non-volatile memory device 100 may have four or more operation modes. In this case, the non-volatile memory device 100 may receive one selected from among four or more commands externally input and selectively execute one of the four or more operation modes.

The non-volatile memory device 100 may selectively execute writing and reading of data on the basis of whether the memory cell 91 is in the initial state or the variable state (first mode), or writing and reading of data without utilizing whether or not the resistance value of the memory cell 91 is within the initial resistance value range and on the basis of whether or not the resistance value of the memory cell 91 is within at least one of the changeable resistance value ranges (second mode).

For example, in the example of FIG. 3, it is supposed that the electric stress for changing the memory cell 91 in the initial state to the variable state is the forming stress, the electric signal for changing the resistance value of the memory cell 91 from the first resistance value range to the second resistance value range is the LR state writing pulse, and the electric signal for changing the resistance value of the memory cell 91 from the second resistance value range to the first resistance value range is the HR state writing pulse.

In this case, a mode in which the write circuit 92 operates to apply the forming stress to the memory cell 91 selected with respect to input data "1", and not to apply the electric stress to the memory cell 91 selected with respect to input data "0" will be referred to as a special write mode (first write mode). The command input from outside the non-volatile memory device 100 to execute the special write mode will be referred to as a special write command (first write command).

A mode in which the read circuit 94 operates to read the data by determination using the first threshold will be referred to as a special read mode (first read mode). The command input from outside the non-volatile memory device 100 to execute the special read mode will be referred to as a special read command (first read command).

A mode in which the write circuit 92 operates to apply the LR state writing pulse (second electric signal) to the memory cell 91 selected with respect to input data "1", and to apply the HR state writing pulse (first electric signal) to the memory cell 91 selected with respect to input data "0", will be referred to as a normal write mode (second write mode). The command input from outside the non-volatile memory device 100 to execute the normal write mode will be referred to as a normal write command (second write command).

A mode in which the read circuit 94 operates to read the data by determination using the second threshold will be referred to as a normal read mode (second read mode). The command input from outside the non-volatile memory device 100 to execute the normal read mode will be referred to as a normal read command (second read command).

[Specific Example of Limitation of Access to Data]

In this configuration, for example, the normal write command and the normal read mode are widely published, in manual or the like of the non-volatile memory device 100. On the other hand, the special write command and the special read mode are owned only by the manufacturer of the non-volatile memory device 100, i.e., kept secret.

In this case, the manufacturer of the non-volatile memory device 100 writes a password in a particular region of the memory cell array 90 using the special write command. When a particular user inputs a password from outside the non-volatile memory device 100, for example, a controller (not shown) of the non-volatile memory device 100 compares the received password to the password read from the particular region in the special read mode and permits writing in the normal write mode and reading in the normal read mode when there is a coincidence between them.

In this configuration, for example, charged (paid) content data can be stored in the non-volatile memory device 100 in the normal write mode, and ID information, serial information of each content, etc., of the non-volatile memory device 100 can be stored in the special write mode. This allows only the particular user which preliminarily knows the ID information, serial information of each content, etc., of the non-volatile memory device 100 to access the charged content stored in the non-volatile memory device 100, which is access limitation. Also, for example, it becomes difficult for a third party which does not know the method of the special write mode and is not permitted to access the data to create a password unset state by rewriting the data in the non-volatile memory device 100.

When the non-volatile memory device 100 is sealed by resin or the like, the wire or the like may be damaged (broken) even if an attempt is made to bring a probe into contact with the wire inside the non-volatile memory device 100. Therefore, it is impossible to perform analysis by measuring an electric resistance. So long as the user does not leak the ID information and the command corresponding to the special read command, unauthorized (impermissible) access to the data inside the non-volatile memory device 100 will not take place.

In the flash memory used in the prior art, as miniaturization progresses, the reliability of the data storage in the case where this is used as the multi-valued memory is reduced. Especially, if an error occurs in the data bit string of the parameter (e.g., cipher key data or serial number) used for the encryption or authentication, the data created by the encryption using this parameter cannot be read at all. In some cases, the main body of the non-volatile memory device 100 cannot be accessed, which is a very serious damage. For this reason, it is required that the data of the parameter used for the encryption or authentication be stored with a very high reliability.

Regarding this, the non-volatile memory device 100 including the memory cell using the variable resistance element is able to ensure a high reliability even when miniaturization progresses. Especially, in the case of the variable resistance element in which the filament is formed in the variable resistance layer and thereby resistance change occurs, the localized region in which the filament is formed is much smaller than an element size. This makes it possible to lessen negative effects on the resistance changing characteristic even when miniaturization progresses in terms of the element size. Therefore, for example, the data of the parameter used for the encryption or authentication, etc., can be stored with a high reliability.

Or, the controller circuit for executing at least one of the encryption and the authentication and the non-volatile memory device (memory main body section) may be mounted on the same chip. In this configuration, in a case where the data of the encryption parameter or the like is transmitted and received between the controller circuit for executing at least one of the encryption and the authentication and the non-volatile memory device, it becomes possible to reduce a risk of a leakage of the encryption parameter or the like due to steal-reading of a signal waveform. Because of the characteristic of the variable resistance element, it is substantially impossible to determine the resistance state by physical analysis. As a result, the encryption parameter or the like are not stolen physically.

In a case where the flash memory used in the prior art is mounted along with the controller circuit on the same chip, the manufacturing process steps of the flash memory require a semiconductor process step which is different from C-MOS process used for the logic circuit. This increases the number of process steps and hence manufacturing cost. In addition, since the manufacturing process steps of the flash memory require a high-temperature thermal treatment, the semiconductive characteristic of the C-MOS process used for the logic circuit is negatively affected, and it becomes possible to ensure performance of the transistor characteristic due to many restrictions.

On the other hand, the non-volatile memory device 100 comprising the memory array including memory cells including the variable resistance elements, does not require a high-temperature thermal treatment, in the manufacturing process steps, which do not negatively affect the semiconductive characteristic of the C-MOS process. Therefore, in the case where the controller circuit and the non-volatile memory device (memory main body section) are mounted on the same chip, the confidentiality of the encryption parameters can be improved, without degrading the characteristic of the logic circuit such as the controller circuit, or increasing the cost of the manufacturing process steps.

Although in the above examples, the two special operation modes and the two special commands and the two normal operation modes and the two normal commands are set, the number and combination of the operation modes and the commands are not limited to this. In a case where the resistance value of the memory cell in the variable state is allowed to have seven levels, like the example of FIG. 7, 3-bit data may be written using eight levels in the special write mode including the initial state, or 2-bit data may be written using four levels in the normal write mode which does not include the initial state. Thus, the combination of the resistance value levels used for write may be suitably selected depending on a used system.

[Randomness of Change to Variable State by Application of Forming Stress]

The process step for changing the resistance value of the element in the initial state from the initial resistance value range to a particular changeable resistance value range is referred to as a forming process step or forming write. As described above, the voltage and pulse width of the electric signal for changing the element to the HR state to store "0" in the normal write mode are $V_H$ and $TP_H$, respectively, while the voltage and pulse width of the electric signal for changing the element to the LR state to store "1" in the normal write mode are $V_L$ and $TP_L$, respectively. The voltage and pulse width of the electric stress used for the forming write are $V_F$ and $TP_F$, respectively. In this case, when $|V_F|>|V_H|$ and $|V_F|>|V_L|$ are condition 1 and $TP_F>TP_H$ and $TP_F>TP_L$ are condition 2, at least one of the condition 1 and the condition 2 may be satisfied. In other words, the forming process cannot be executed under the write condition in the normal write mode.

Regarding the pulse width, when a specified forming process step is not completed after application of the electric stress is performed once, even in the state in which $TP_F>TP_H$ and $TP_F>TP_L$ are satisfied, the electric stress may be applied plural times to complete the forming process step. In this case, the electric stress may be applied repeatedly. During the repeated application of the electric stress, the applied voltage may be increased gradually with a specified increase amount. During the repeated application of the electric stress, the pulse width may be increased gradually with a specified increase amount or a specified increase rate.

It is supposed that to complete the forming for all of the memory cells, for example, in the state in which all of the memory cells within the memory cell array are in the initial state, it is necessary to apply the electric stress of 10000 units in normalized cumulative application time. In this case, if the application of the electric stress is halted at a stage in which the electric stress of 150 units has been applied to all of the memory cells, these memory cells do not change to the variable state, of course. However, from an experiment, it was revealed that even in the above case, the memory cells which change from the initial state to the variable state may occur randomly within the memory cell array.

Specifically, the memory cell array may have a characteristic in which a memory cell which changes from the initial state to the variable state by application of the electric stress for causing the memory cell to change from the initial state to the variable state, and a memory cell maintained in the initial state despite the application of the electric stress, occur randomly. In this case, the data (first-kind data) written in the special write mode, may be data generated by an event that the memory cells which change from the initial state to the variable state occur randomly.

Figure 8:
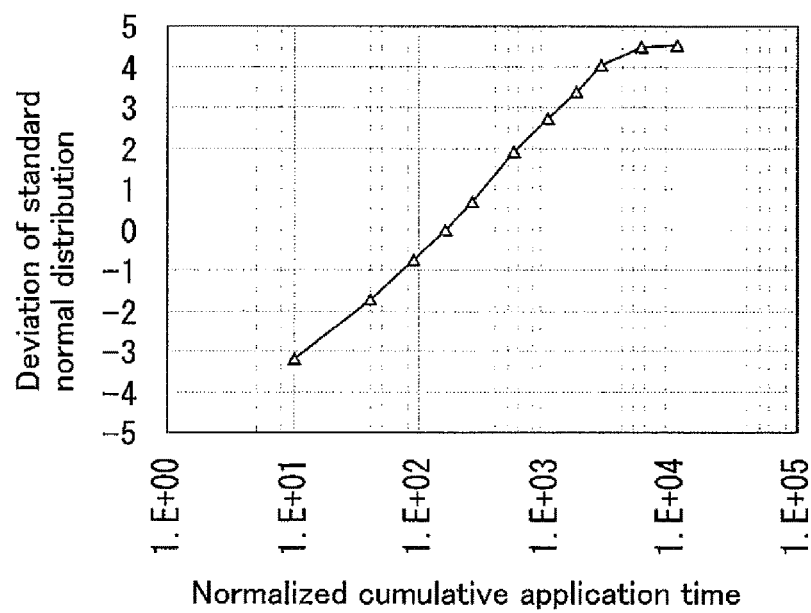
FIG. 8 is a view showing plots of the relation between a normalized cumulative application time and a deviation of a standard normal distribution of the memory cells which have changed to the variable state.

FIG. 8 is a view showing plots of the relation between a normalized cumulative application time and a deviation of a standard normal distribution of the memory cells which have changed to the variable state. In the configuration of the element, the material of the first electrode 124 is a tantalum nitride (TaN), the material of the second electrode 128 is iridium (Ir), the material of the variable resistance layer 126 is the tantalum oxides of the stacked-layer structure, the thickness of the variable resistance layer 126 is 50 nm, the area of the surface of the first electrode 124 and the surface of the variable resistance layer 126, which surfaces are in contact with each other, and the area of the surface of the second electrode 128 and the surface of the variable resistance layer 126, which surfaces are in contact with each other, are each equal to or smaller than 0.25 μm². The layer placed in contact with the first electrode 124, of the layers of the variable resistance layer 126, is the layer which is lower in oxygen concentration, and satisfies 0<x<2.5 when its composition is expressed as $TaO_x$. On the other hand, the layer placed in contact with the second electrode 128, of the layers of the variable resistance layer 126, is the layer which is higher in oxygen concentration, satisfies y≥2.1 when its composition is expressed as $TaO_y$, and has a thickness of about 5.5 nm. The forming stress has a voltage of 3.5V and a shortest pulse width of 10 μSec. The number of memory cells is 256 kilobits. The cumulative application time of FIG. 8 is normalized time with a specified coefficient based on the shortest pulse width.

As shown in FIG. 8, the normal distribution of the cumulative bit number in which the forming is complete is substantially linear with respect to the cumulative application time. This implies that the change from the initial state to the variable state is a phenomenon which occurs very randomly. By using the randomness of the change to the variable state, it becomes possible to create the ID information which is unique and random for each non-volatile memory device.

In the example of FIG. 8, when the application of the electric stress in the special write mode is stopped at a time point when the normalized cumulative application time reaches 150, almost half memory cells have changed to the variable state and almost half memory cells have not changed to the variable state. The memory cells having changed to the variable state are random in location. In the special write mode, a part of the memory cells in the memory cell array are selected randomly, and thereby the data is generated to form random data and stored in the memory cell array. The data (first-kind data) written in the special write mode is the data which is unique and random for each non-volatile memory device.

The reason why the memory cell which has changed to the variable state and the memory cell which has not changed to the variable state, occur randomly among the elements, may be, for example, random occurrence of the memory cell for which the forming stress is completed, as well as the non-uniform process step or shape of the variable resistance element. As described above, the vacancy sites in the metal oxide are placed randomly for each of the memory cells and connected to each other to form the filament by the forming. For this reason, even when a specified electric stress is applied to the plurality of memory cells in the initial state, the memory cells for which the forming is completed occur non-uniformly statistically (e.g., in standard normal distribution manner). From this, it may be considered that even when a uniform stress is applied to the plurality of memory cells in the special write mode, the electric stress may be adjusted so that the element formed with the filament and the element which is not formed with the filament, occur probabilistically. It is estimated that the same mechanism is applied to the material formed with the filament path by connecting the oxygen vacancy sites or the like to each other.

In general, to generate the random ID information, random values generated using a particular function inside the device are used. However, if the function is the same and the input initial value is the same, the same values are output depending on the number of times of computation. If the function formula and the initial value leak, the random values generated inside the device are predicted, for example, the cipher key or the like generated based on the random values is estimated, which may lead to a security accident.

When the random values are generated on the basis of the change of the variable resistance element from the initial state to the variable state, which is a random phenomenon unique to the variable resistance element, the formula for generating the random values in an unpredictable manner can be established. If the random data written in the special write mode is used as the initial value of the function for obtaining the above stated random values, the degree of the randomness can be improved, which is an advantage.

For example, in the specific example of the above stated limitation of the access to the data, by writing the ID information and the serial information as the random data in the special write mode, the ID information and the serial information can be set and stored in an unpredictable manner. The ID information and the serial information written in the special write mode, are limited in utilization in such a manner that they are read in the special read mode and provided to a particular user to allow the particular user to utilize the content.

Example 1

Figure 9:
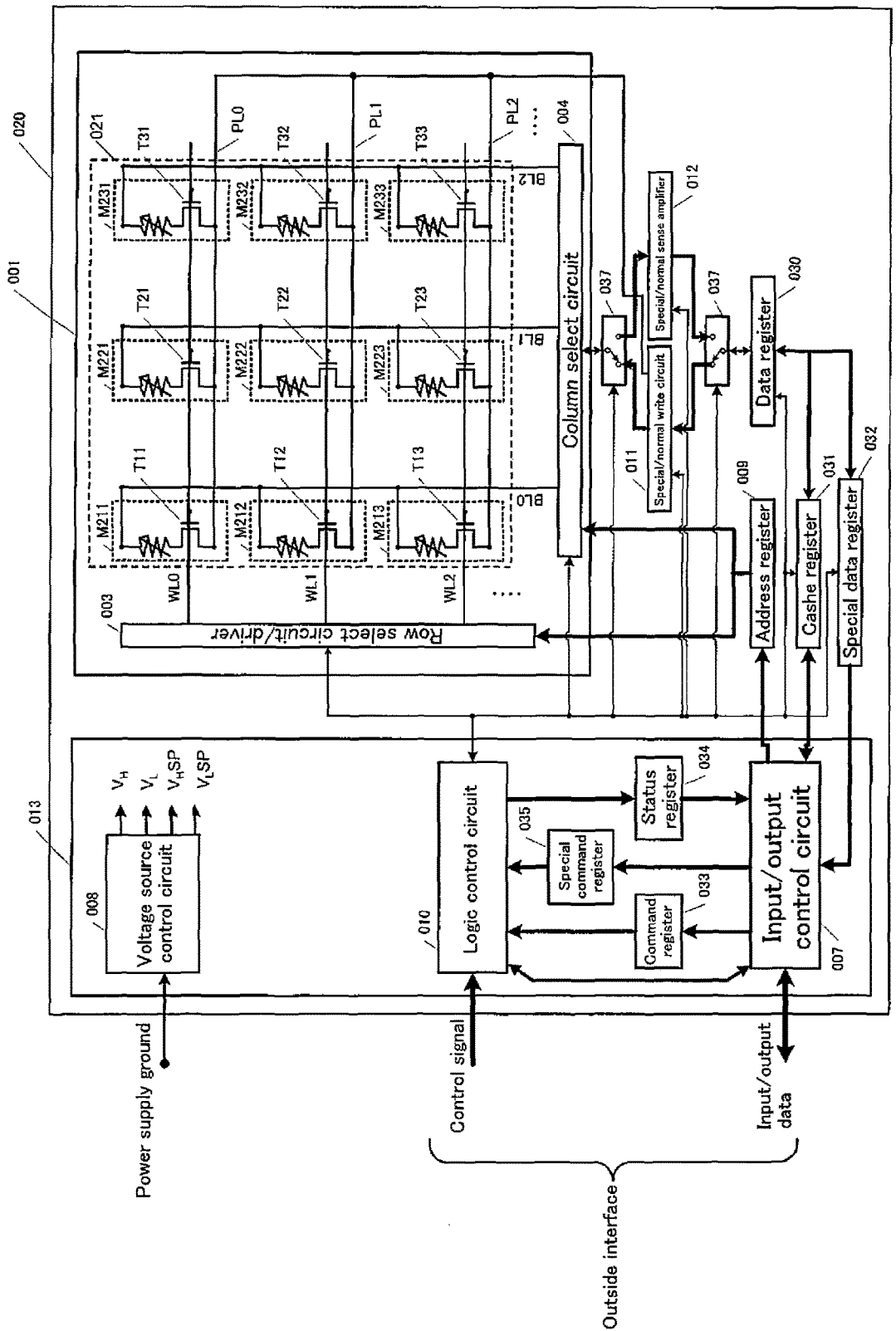
FIG. 9 is a block diagram showing the exemplary schematic configuration of a non-volatile memory device according to Example 1 of Embodiment 1.

FIG. 9 is a block diagram showing the exemplary schematic configuration of a non-volatile memory device according to Example 1 of Embodiment 1. The configuration of FIG. 9 is merely exemplary, and the specific configuration of the non-volatile memory device according to Embodiment 1 is not limited to the configuration of FIG. 9, of course.

As shown in FIG. 9, the non-volatile memory device 020 of Example 1 includes a memory main body section 001 on a semiconductor substrate. The memory main body section 001 includes a memory cell array 021, a row select circuit/driver 003, and a column select circuit 004.

The memory cell array 021 includes a plurality of first wires (in the example of FIG. 9, WL0, WL1, WL2, . . . . Hereinafter, these will be referred to as word lines WL0, WL1, WL2, . . . for easier explanation) formed on the semiconductor substrate such that they extend in parallel with each other in a first direction within a first plane, a plurality of second wires (in the example of FIG. 9, BL0, BL1, BL2, . . . . Hereinafter, these will be referred to as bit lines BL0, BL1, BL2, . . . for easier explanation formed within a second plane parallel to the first plane such that they extend in parallel with each other in a second direction and three-dimensionally cross the first wires, respectively, and memory cells M211, M212, M213, M221, M222, M223, M231, M232, M233 (hereinafter will be referred to as "memory cells M211, M212, . . . " provided at three-dimensional cross-points of the word lines WL0, WL1, WL2, . . . and the bit lines BL0, BL1, BL2, . . . .

Each of the memory cells M211, M212, . . . includes the variable resistance element 120 (see FIG. 2). The word lines WL0, WL1, WL2, . . . are connected to the control terminals (also referred to as gates) of transistors T11, T12, T13, T21, T22, T23, T31, T32, T33, . . . (hereinafter will be referred to as "transistors T11, T12, . . . " included in the memory cells M211, M212, . . . , respectively, and the bit lines BL0, BL1, BL2, . . . are connected to one ends of the variable resistance elements 120 of the memory cells M211, M212, . . . , respectively. The other ends of the variable resistance elements 120 included in the memory cells M211, M212, . . . , respectively, are connected to the first main terminals of the transistors T11, T12, . . . included in the memory cells M211, M212, . . . , respectively.

The variable resistance element 120 operates as the non-volatile memory element within the memory cell. In the example of FIG. 9, 1T1R memory device is shown, in which each of the memory cells includes one transistor and one variable resistance element.

The memory array further includes a plurality of plate lines PL0, PL1, PL2, . . . arranged in parallel with the word lines WL0, WL1, WL2, . . . , respectively. The plate lines PL0, PL1, PL2, . . . are connected to the second main terminals of the transistors T11, T12, . . . included in the memory cells M211, M212, . . . , respectively. Which of the first main terminal and the second main terminal of each of the transistors T11, T12, . . . becomes a source or a drain is not particularly limited, but may be suitably set depending on specific operation. Specifically, this may be decided depending on the direction of a current flowing through the transistor, positive/negative of charges of major carrier, etc.

The configuration of the variable resistance element 120 may be the same as that of Embodiment 1 and will not be described in detail repeatedly.

In the example of FIG. 9, n-channel MOS transistor is used as the select transistor of the memory array. The first main terminals of the transistors T11, T12, T13, . . . are connected to the bit line BL0 via the variable resistance elements, respectively, the first main terminals of the transistors T21, T22, T23, . . . are connected to the bit line BL1 via the variable resistance elements, respectively, and the first main terminals of the transistors T31, T32, T33, . . . are connected to the bit line BL2 via the variable resistance elements, respectively.

The gates of the transistors T11, T21, T31, . . . are connected to the word line WL0, the gates of the transistors T12, T22, T32, . . . are connected to the word line WL1, and the gates of the transistors T13, T23, T33, . . . are connected to the word line WL2.

The second main terminals of the transistors T11, T21, T31, . . . are connected to the plate line PL0, the second main terminals of the transistors T12, T22, T32, . . . are connected to the plate line PL1, and the second main terminals of the transistors T13, T23, T33, . . . are connected to the plate line PL2.

Although in the example of FIG. 9, the plate lines are shown to be connected form single lines on the respective rows, they may be separated into a plurality of blocks.

The non-volatile memory device 020 further includes a special/normal write circuit 011, a special/normal sense amplifier 012, a switching circuit 037, a voltage source control circuit 008, a logic control circuit 010, a command register 033, a status register 034, a special command register 035, an input/output control circuit 007, an address register 009, a Cashe register 031, a special data register 032, and a data register 030.

The special/normal write circuit 011 (hereinafter will be simply referred to as write circuit) writes information to one or more memory cells selected by the row select circuit/driver 003 and the column select circuit 004.

The special/normal sense amplifier 012 (hereinafter will be simply referred to as sense amplifier) detects the resistance value of the selected memory cell, and determines whether the detected resistance value corresponds to one of at least two values (e.g., data "1" and data "0").

The switching circuit 037 performs switching between a write operation performed by connecting the memory cell selected by the column select circuit to the write circuit 011 and a read operation performed by connecting the memory cell selected by the column select circuit to the sense amplifier 012.

The voltage source control circuit 008 generates a plurality of voltage sources required to write data to the memory cell.

The logic control circuit 010 causes the input/output control circuit 007 to obtain the control command, the address information and the input data, in response to control signals input externally. The logic control circuit 010 causes the input/output control circuit 007 to control the operation of the non-volatile memory device 020 based on the control commands stored in the command registers (special command register 035 and command register 033).

The input/output control circuit 007 obtains the input data via an input/output data bus, in response to the command based on the control signal from the logic control circuit 010, extracts the control command and the address information from the input data and holds the control command and the address information in the command register and the address register, respectively. In addition, the input/output control circuit 007 outputs to outside the data held in the status register 034, the Cashe register 031, etc., in response to the control commands stored in the command registers.

Typically, the control command is extracted from the input data obtained by the input/output control circuit 007, in response to the control signal input to the logic control circuit 010. Specifically, for example, the logic control circuit 010 generates a command input timing based on the input control signal, and generates the control command and the corresponding address information from the data (command data pattern) input to the input/output control circuit 007 based on this command input timing. The control command refers to the normal write command, the special write command, the normal read command, the special read command, etc. The special write command is a command data pattern which is different from the normal write command. The special read command is a command data pattern which is different from the normal read command. Note that the special write command and the special read command may be commands which are not published to general users.

The command register 033 temporarily stores the control command. For example, the normal write command or the normal read command may be stored in the command register 033.

The status register 034 temporarily stores status information indicating the internal state of the memory device which is known to outside, in response to the command based on the control signal from the logic control circuit 010.

The special command register 035 temporarily stores the special write command or the special read command.

The address register 009 outputs a row address signal to the row select circuit/driver 003, and outputs a column address signal to the column select circuit 004, based on an address signal held by the address register 009. The address signal is defined as a signal indicating the address of a particular memory cell selected from the plurality of memory cells M211, M212, . . . .

The row address signal is a signal indicating the row address of the address indicated by the address signal, while the column address signal is a signal indicating the column address of the address indicated by the address signal. In the example of FIG. 9, the column select circuit 0004 selects one bit line corresponding to the column address, and the row select circuit selects one word line corresponding to the row address. Hereinafter, a case where a single memory cell is selected from the shown memory cell group will be exemplarily described, but the present disclosure is not limited to this. For example, if BL0 and BL1 are selected when WL0 is selected, two cells are selected simultaneously, and simultaneous access to the plurality of cells is enabled by configuring the write circuit 011 and the sense amplifier 012 such that the data is simultaneously written to or read from BL0 and BL1 in parallel. Those skilled in the art can easily practice such modification or similar alternation.

The Cashe register 031 buffers specified data to be written based on the control signal and the input data, under control of the input/output control circuit 007, when the control command code which is obtained from the control signal and the input data and temporarily stored in the command register 033 indicates the "normal write mode", or when the control command code which is obtained from the control signal and the input data and temporarily stored in the special command register 035 indicates the "special write mode".

The special data register 032 receives the data read by the sense amplifier 012 set in the special mode, from the memory cell selected in each read cycle, via the data register 030, when the control command code which is obtained from the control signal and the input data and temporarily stored in the command register 033 indicates "special read mode".

The data register 030 takes data in each write cycle from the Cashe register 031 and temporarily stores the data.

The control command is obtained from the control signal and the input data and temporarily stored in the command register 033. When the stored control command indicates the "normal read mode", the sense amplifier 012 set in the normal mode, reads the data from the memory cell selected in each read cycle, and the read data is sequentially temporarily stored in the data register 030. The data register 030 outputs the temporarily stored data to the Cashe register 031. The Cashe register 031 buffers the read data with a specified volume and outputs the read data to the device under control of the input/output control circuit 007.

In the example of FIG. 9, the controller 013 is configured to include the voltage source control circuit 008, the logic control circuit 010, the input/output control circuit 007, the command register 033, the status register 034, and the special command register 035. The controller 013 and the memory main body section 001 may be mounted on the same chip. This can reduce a risk of steal-reading of the information transmitted and received between the controller 013 and the memory main body section 001.

The logic control circuit 010 causes the switching circuit 037 to form a connection to the write circuit 011, in a data write cycle. The input/output control circuit 007 stores the input data in the Cashe register 031, takes out only the data required in each write cycle from the Cashe register 031 in response to the command from the logic control circuit 010, and sequentially sends the data to the data register 030. The write circuit 011 executes specified writing to the selected memory cell, in accordance with the information of the data in the data register 030 in each write cycle, in response to the command from the logic control circuit 010. The logic control circuit 010 causes the switching circuit 037 to form a connection to the sense amplifier 012, in a data read cycle. The sense amplifier 012 reads the resistance value with a specified condition from the selected memory cell in each read cycle, in response to the command from the logic control circuit 010, perform decoding into the original data, and sends the original data to the data register 030. The Cashe register 031 stores the data output in each read cycle in response to the command from the logic control circuit 010, and sequentially outputs the data to outside the non-volatile memory device 020 under control of the input/output control circuit 007.

When receiving the normal write command, the input/output control circuit 007 holds the normal write command in the command register 033. The input/output control circuit 007 holds in the address register 009, the write address extracted from the data input via the input/output data bus in the same manner. Then, the normal write circuit 011 suitably applies the electric signal to each of the memory cells based on the setting in each register, in response to the command from the logic control circuit 010, to write specified data to the memory array.

When receiving the normal read command, the input/output control circuit 007 holds the normal read command in the command register 033. The input/output control circuit 007 holds in the address register 009, the read address extracted from the data input via the input/output data bus in the same manner. Then, the sense amplifier 012 set in the normal mode, reads the specified data from the memory array, based on the setting in each register, in response to the command from the logic control circuit 010, and stores the read data in the Cashe register 031 via the data register 030. When the data with a required data volume has been stored in the Cashe register 031, the input/output control circuit 007 sequentially outputs the data stored in the Cashe register 031 to outside. Although an example in which the data is stored in the Cashe data register 030 and then output to outside, for example, has been described, the Cashe data register 030 may be omitted.

When receiving the command for checking the internal operation state of the non-volatile memory device 020, the logic control circuit 010 researches the internal state, and holds the code indicating the internal operation state corresponding to the received content, in the status register 034. Then, the input/output control circuit 007 outputs the status code held in the status register 034 to outside.

As described above, the command data pattern of the special write command is set different from the command data pattern of the normal write command. Likewise, the command data pattern of the special read command is set different from the command data pattern of the normal read command. In the access using the special commands, access to a particular address area, under a particular write condition, a particular read condition, etc., which cannot be executed using the normal commands, may be permitted. By making the command patterns different from each other in this way, for example, the user who knows only the normal commands, is not permitted (unauthorized) to access the data stored using the special commands.

When receiving the special write command, the input/output control circuit 007 holds the special write command in the special command register 035. The input/output control circuit 007 holds in the address register 009, the write address which is extracted from the data input via the input/output data bus in the same manner and the normal user is not permitted to access. Then, the special write circuit 011 suitably applies the forming stress to each of the memory cells based on the setting in each register, in response to the command from the logic control circuit 010, to write specified data to the memory array.

When receiving the special read command, the input/output control circuit 007 holds the special read command in the special command register 035. The input/output control circuit 007 holds in the address register 009, the read address which is extracted from the data input via the input/output data bus in the same manner and the normal user is unauthorized to access. Then, the sense amplifier 012 set in the special mode, reads the specified data from the memory array, based on the setting in each register, in response to the command from the logic control circuit 010, and stores the read data in the Cashe register 031 via the data register 030. When the data with a required data amount has been stored in the Cashe register 031, the input/output control circuit 007 sequentially outputs the data stored in the Cashe register 031 to outside.

Figure 10:
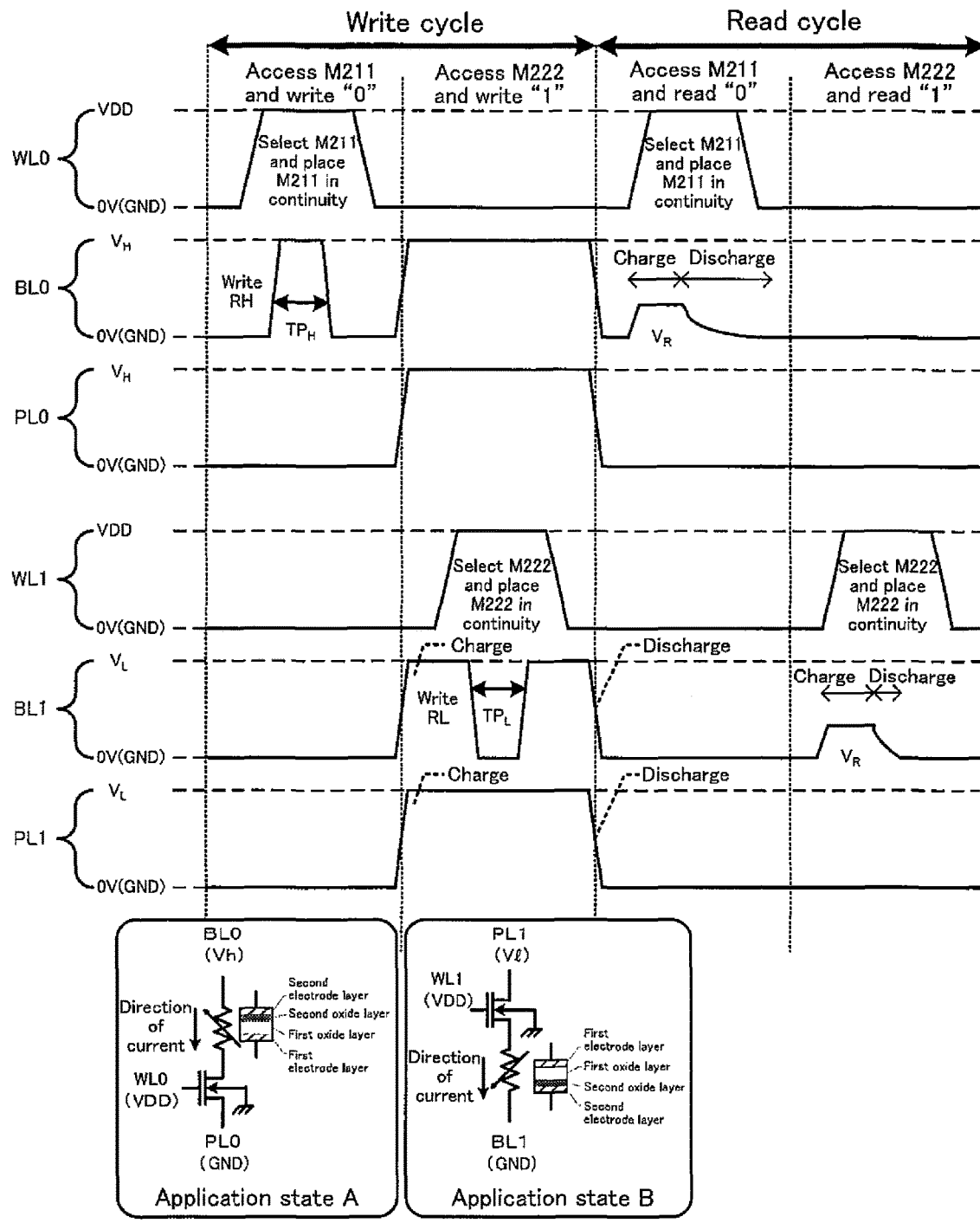
FIG. 10 is a timing chart showing the exemplary write cycle and the exemplary read cycle of the non-volatile memory device according to Example 1 of Embodiment 1.

FIG. 10 is a timing chart showing the exemplary write cycle and the exemplary read cycle of the non-volatile memory device according to Example 1 of Embodiment 1. Hereinafter, the exemplary signal control for one memory cell, in the write cycle and in the read cycle, will be described with reference to FIG. 10.

Now, a case where the bipolar variable resistance element which is more complex in signal line control is used will be exemplarily described. Based on this example, a case where the configuration including the unipolar variable resistance element is used can be easily designed. Specific control is not limited to the example described below, of course.

It is supposed that a case where the variable resistance layer is in the HR state is allocated to data "0" and a case where the variable resistance layer is in the LR state is allocated to data "1". For easier explanation, a case where the data is written to and read from the memory cells M211 and M222, will be exemplarily described.

In FIG. 10, $V_H$ indicates the pulse voltage (voltage at both ends of the memory cell) required to change the resistance value of the variable resistance element to the HR level, while $V_L$ indicates the pulse voltage (voltage at both ends of the memory cell) required to change the resistance value of the variable resistance element to the LR level. The voltage source control circuit 008 generates $V_H$ and $V_L$ based on the voltages input externally. In the example of FIG. 10, $V_H$ and $V_L$ are positive values. A case where in the bipolar variable resistance element, the HR state writing voltage and the LR state writing voltage are almost equal in absolute value, and the voltages at both ends of the memory cell can have an equal voltage amplitude, i.e., $V_H = V_L$ will be exemplarily described.

During the read, the read voltage $V_R$ which is smaller in absolute value than the write voltages ($V_H$ and $V_L$) is applied between the both ends of the memory cell. The write circuit 011 supplies one of the voltages $V_H$, $V_L$ and GND to the plate line according to an application direction. In response to a need for switching between the write mode, the read mode or the like, each bit line and each plate line is charged with one of the voltages $V_H$, $V_L$ and $V_R$ or discharged to GND.

As shown in FIG. 10, during the write cycle for the memory cell M211, the write circuit 011 pre-sets the voltage of the bit line BL0 and the voltage of the plate line PL0 to GND level. VDD is applied to the word line WL0, and the transistor T11 of the memory cell M211 is placed in a continuity state. The electric pulse with a pulse width of $TP_H$ and a voltage of $V_H$ is applied to the bit line BL0. Thereby, the HR state writing voltage ($V_H$) for writing the data "0" to the memory cell M211 is applied for the pulse width $TP_H$, so that the variable resistance element 120 of the memory cell M211 is changed to the HR state. By this operation, the data "0" is written to the memory cell M211. The application state in this case is shown as application state A in FIG. 10. It can be seen from FIG. 10, a current flows from the second electrode layer (second electrode 128) to the first electrode layer (first electrode 124).

As shown in FIG. 10, during the write cycle for the memory cell M222, the write circuit 011 initially pre-sets the voltages of all of the word lines to 0V and all of the bit lines and all of the plate lines, including the unselected bit lines and plate lines are charged with $V_L$ (=$V_H$). Then, VDD is applied to the word line WL1, and the transistor T22 is turned ON. The electric pulse with a pulse width of $TP_L$ and a voltage changing as $V_L \rightarrow 0V \rightarrow V_L$ is applied to the selected bit line. Thereby, the LR state writing voltage (−$V_L$) for writing the data "1" to the memory cell M222 is applied for the pulse width $TP_L$, so that the variable resistance element 120 of the memory cell M222 is changed to the LR state. By this operation, the data "1" is written to the memory cell M222. At the end of the cycle, the word line is discharged from VDD to 0V, and the select transistor T22 is turned OFF. Then, all of the bit lines and plate lines charged with $V_L$ are discharged to 0V. The application state in this cycle is shown as application state B in FIG. 10. It can be seen from FIG. 10, a current flows from the first electrode layer (first electrode 124) to the second electrode layer (second electrode 128).

As shown in FIG. 10, during the read cycle for the memory cell M211, VDD is applied to the word line WL0 to turn ON the transistor T11, and the column select circuit connects the memory cell M211 to the sense amplifier 012. According to that timing, the read voltage $Y_R$ which is smaller in amplitude than the write pulses and does not cause the memory cell to change the resistance state is applied to the bit line BL0. The driver (driver 131 of FIG. 11) for driving the voltage of $Y_R$ outputs the voltage for a specified period, and switching to a high impedance occurs. Then, the voltage of $Y_R$ of the bit line BL0 is discharged according to the time constant decided by the resistance value, load capacitance (total of diffusion capacitance of wire and transistor, and a capacitance of capacitor, etc.) of the memory cell, etc. Since the resistance value of the memory cell M211 is set to HR in previous write, the discharge requires a relatively long time. Therefore, it is determined that the time required for the discharge is longer than a predetermined threshold, and the input/output control circuit 007 outputs the data "0" indicating the HR level.

As shown in FIG. 10, during the read cycle for the memory cell M222, VDD is applied to the word line WL1 to turn ON the transistor T22, and the column select circuit connects the memory cell M222 to the sense amplifier 012. According to that timing, the read voltage $Y_R$ is applied to the bit line BL1. The driver for driving the voltage of $Y_R$ outputs the voltage for a specified period, and switching to a high impedance occurs. Then, the voltage of $Y_R$ of the bit line BL1 is discharged according to the time constant decided by the resistance value and load capacitance of the memory cell. Since the resistance value of the memory cell M222 is set to LR in previous write, the discharge is completed in a relatively short time. Therefore, it is determined that the time required for the discharge is shorter than a predetermined threshold, and the input/output control circuit 007 outputs the data "1" indicating the LR level.

In these read cycles, the write circuit 011 supplies 0V (ground level) to all of the plate lines and unselected bit lines.

In a case where the special write command is input to the non-volatile memory device 020, for example, at least one of the voltage, pulse width and cumulative application time of the electric stress output from the write circuit 010 during the write is set different from that in the normal write mode.

In the special write mode, in a case where masking is performed to maintain the variable resistance element in the initial state such that no electric stress is applied thereto, the voltage of the electric stress is set to $V_H SP(=0V)$, and the pulse width of the electric stress is set to $TP_H SP$ (=0 ns). It is supposed that the forming stress is a single electric pulse, the voltage of the forming stress is set to $V_L SP$, and the pulse width of the forming stress is set to $TP_L SP$. The voltage source control circuit 008 of FIG. 9 generates $V_H SP$ and $V_L SP$.

As described with reference to FIG. 7, in a case where the special write command is input and the variable resistance element is maintained in the initial state, the voltage level of $V_H$ may be changed into $V_H SP$, while when the special write command is input and the variable resistance element is changed to the variable state, the voltage level of $V_L$ may be changed into $V_L SP$. $V_H SP$, $TP_H SP$, $V_L SP$, and $TP_L SP$ correspond to $V_H$, $TP_H$, $V_L$ and $TP_L$ corresponding to the normal write command, respectively. Some of these may be equal in value.

Next, the exemplary specific configuration and operation of the sense amplifier 012 in the special read mode and in the normal read mode will be described.

Figure 11:
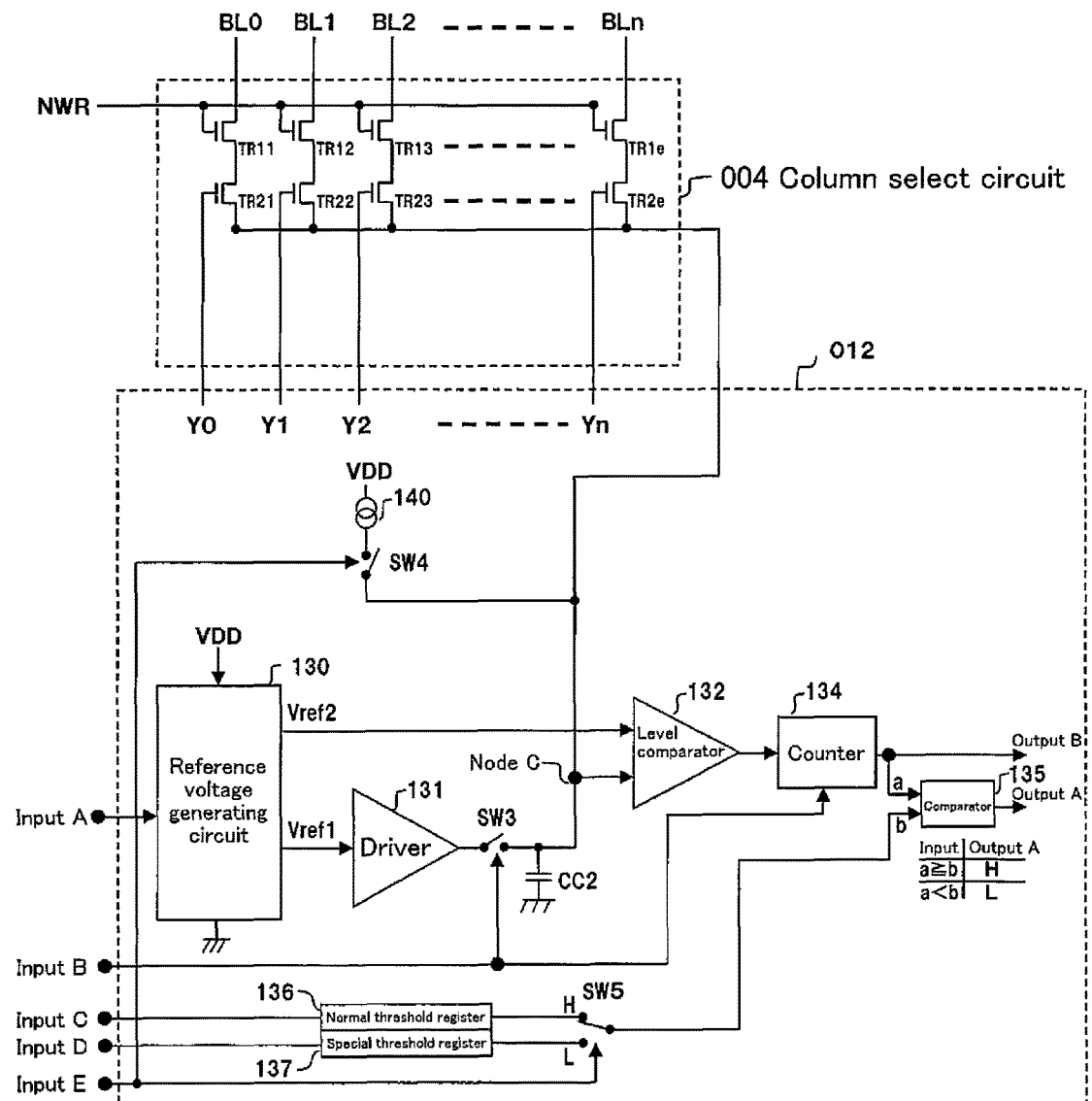
FIG. 11 is a block diagram showing the exemplary schematic configuration of a sense amplifier included in the non-volatile memory device according to Example 1 of Embodiment 1.
Figure 12:
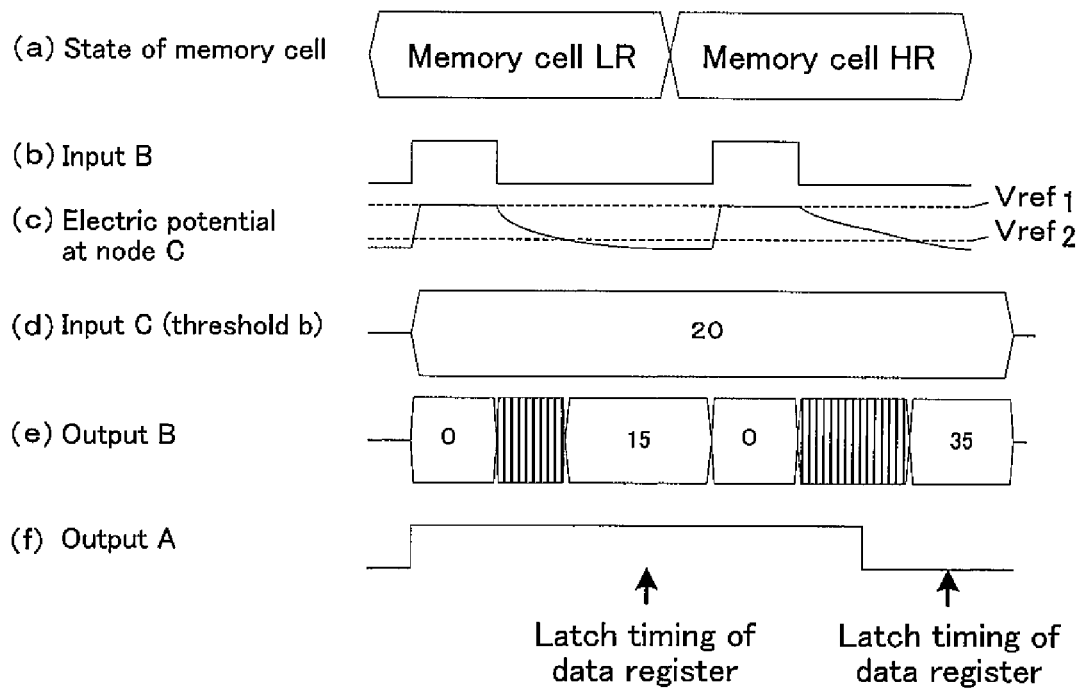
FIG. 12 is a timing chart showing the exemplary operation of major components of the sense amplifier included in the non-volatile memory device according to Example 1 of Embodiment 1.

FIG. 11 is a block diagram showing the exemplary schematic configuration of the sense amplifier included in the non-volatile memory device according to Example 1 of Embodiment 1. FIG. 12 is a timing chart showing the exemplary operation of major components of the sense amplifier included in the non-volatile memory device according to Example 1 of Embodiment 1.

In the example of FIG. 11, the column select circuit 004 surrounded by a broken line has been described above, and will not be described repeatedly. The switching circuit 037 of FIG. 9 selects the write circuit when NWR is Low and the sense amplifier rather than the write circuit, when NWR is High, although the switching circuit 037 not shown in FIG. 11.

In the example of FIG. 11, a reference voltage generating circuit 130 outputs a specified reference voltage in response to a command input from the logic control circuit 010 to an input A. Specifically, for example, the reference voltage generating circuit 130 creates a plurality of specified voltage levels by dividing a voltage using a ladder resistance or the like based on an electric potential difference between the power supply voltage VDD and the set voltage GND, chooses some of these specified voltage levels using a semiconductor switch or the like, and outputs Vref1 and Vref2. Vref1 and Vref2 satisfy the relationship of Vref1>Vref2. As the circuit for generating the reference voltages, there are many known configurations. In the present example, the known configuration may be used. Vref2 (determination voltage) may be made different between the special read mode and the normal read mode.

A switch control signal is input from the logic control circuit 010 to an input B. A switch 3 (SW3) is OFF when the switch control signal is 'L', and ON when the switch control signal is 'H'. When the switch 3 is OFF, the state of input from the reference voltage generating circuit 130 to a node C switches to HiZ (high impedance) state. When the switch 3 is ON, the driver 131 outputs the electric potential of Vref1 to the node C. Although the input/output voltage values are actually varied to some extent depending on a voltage drop of a transistor, a wire, etc., constituting the driver 131 and other circuits, it is assumed that the effects of the voltage drop or the like is negligible, for easier explanation.

The node C is connected to the selected memory cell included in the memory cell array 021 (FIG. 9). For example, it is assumed that the amount of information based on the resistance value of the memory cell M211 is read. Initially, all of the bit lines and all of the word lines are set to 0V. The logic control circuit 010 selects the bit line BL0 by changing NWR of FIG. 8 from Low level to High level, setting Y0 to High Level, and setting Y1 to Yn to Low level. In addition, the selected word line WL0 is set to High level, the unselected word lines except WL0 are set to Low level, and the read voltage of $V_R$=Vref1 is applied to the node C to which the selected bit line BL0 is connected.

Next, the application method to the node C and the reading method of the resistance value information will be described. As shown in FIG. 11, a capacitor CC2 is connected in parallel with the memory cell, between the node C and a ground. This capacitor may be realized by a wire capacitance, the diffusion capacitance of the transistor, etc., or may be added separately from the wire and the transistor.

In general, to increase a read speed, the capacitance of the capacitor CC2 may be reduced to a smallest possible level. As described above, when the switch control signal input to the input B is 'H', the electric potential at the node C becomes Vref1. Thereafter, when the switch control signal input to the input B becomes 'L', SW3 is turned OFF, and the state of input from the reference voltage generating circuit 130 to the node C becomes HiZ (high impedance) state. Thereafter, the capacitor CC2 starts discharge, and the electric potential at the node C is reduced gradually from Vref1 according to the time constant decided by the capacitance of the capacitor CC2 and the resistance value of the selected memory cell connected in parallel with the capacitor CC2.

Specifically, when the resistance value of the selected memory cell is small, a current flowing therethrough is increased, and therefore the electric potential is reduced at a higher pace. On the other hand, when the resistance value of the selected memory cell is large, a current flowing therethrough is reduced, and therefore the electric potential is reduced at a slower pace. This operation will be easily understood with reference to FIG. 12.

As can be seen from the state of the memory cell of FIG. 12(a), the former half indicates that the memory cell is in the LR state, and the latter half indicates that the memory cell is in the HR state. In these states, the input B changes to 'H' at the timing of FIG. 12(b) and the voltage of Vref1 is applied to the node C for the period of 'H' as shown in FIG. 12(c).

When the input B switches from 'H' to 'L', the switch circuit SW3 is OFF, and the state of input from the reference voltage generating circuit 130 to the node C switches to HiZ, and therefore the electric potential at the node C is reduced gradually (discharge). The time period that lapses until the electric potential at the node C becomes smaller than Vref2 is shorter when the memory cell is in the LR state and is longer when the memory cell is in the HR state.

A level comparator 132 of FIG. 11 compares the electric potential Vref2 output from the reference voltage generating circuit 130 to the electric potential at the node C. When the electric potential at the node C is higher than Vref2, the level comparator 132 outputs 'L', while when the electric potential at the node C is lower than Vref2, the level comparator 132 outputs 'H'. The time period that lapses from when the switching control signal has switched from 'H' to 'L' until the output of the level comparator 132 changes from 'L' to 'H' is shorter when the memory cell is in the LR state and is longer when the memory cell is in the HR state.

For the time period during which the control signal of the input B is 'H', a counter 134 is reset to zero. When the switch control signal is 'L', and the input from the level comparator 132 is 'L', the counter 134 is counted up according to the cycle of a clock (not shown) input to the counter 134. Note that the counter 134 may be limited to a predetermined upper limit value so that the count value does not overflow.

The operation of the counter 134 is shown in FIG. 12(e). As shown in FIG. 12(e), the counter 134 starts count up just after the input B has changed to 'L'. In the state in which the memory cell is in the LR state, the counter 134 stops count up when the count value reaches 15, while in the state in which the memory cell is in the HR state, the counter 134 stops count up when the count value reaches 35, and its count value is fixed to 35.

A threshold corresponding to the normal read mode is input to the input C of FIG. 11, and set in a normal threshold register 136. A threshold corresponding to the special read mode is input to the input D of FIG. 8, and set in a special threshold register 137.

A switching signal for switching between the special read mode and the normal read mode is input to an input E. When the switching signal High is input, SW5 is connected to 'H' terminal, while when the switching signal Low is input, SW5 is connected to 'L' terminal.

By this switching, the threshold held in proper one of the normal threshold register 136 and the special threshold register 137 is input to the input b of the comparator 135. In the normal read mode, for example, as shown in FIG. 9, the value of 20, which is the threshold used to determine whether the variable resistance element is in the HR state or in the LR state, is input.

The count value output from the counter 134 is input to the input a of the comparator 135. The comparator 135 compares the count value input to the input a to the threshold input to the input b. When the input a≥input b, the comparator 135 determines that the selected memory cell is in the HR state, and outputs 'L' (data "0") to the output A. On the other hand, when the input a<input b, the comparator 135 determines that the selected memory cell is in the LR state, and outputs 'H' (data "1") to the output A.

In the case of the threshold 20 of FIG. 12, 'H' is output to the output A when the selected memory cell is in the LR state, at data latch timing of the data register 30, and 'L' is output to the output A when the selected memory cell is in the HR state, at data latch timing of the data register 30. The output value is latched in the data register 30.

As described above, the sense amplifier 012 reads the resistance value information of the selected memory cell, on the basis of that the attenuation time of the voltage applied to the node C is different, according of the resistance value of the selected memory cell which is a read target. As a result, binary digital logic value corresponding to the resistance state of the memory cell is output to the output A. More specifically, the count value corresponding to the resistance value information is output to the output B by the resolution of the clock cycle.

In this configuration, comparison of the resistance value of each of the memory cells can be easily implemented with reference to the value of the output B. That is, the value of the output B correlates with the resistance value of the memory cell, is a numeric value which correlates with the resistance value of the memory cell, represents discharge time of the voltage between the both ends of the memory cell in terms of a physical amount, and is equivalent to the resistance value information of the memory cell. The output B is input to the write circuit 011 and to the logic control circuit 0101 and used in the processing flow of verify operation (see STEP6 in first to fourth operation examples, STEP13 in third operation example, or STEP15 in fourth operation example).

The value of the input C and the hold value of the counter 134 are not limited to the values of FIG. 12. The value of the input C and the hold value of the counter 134 may be varied depending on the count clock frequency of the counter 134, the capacitance of the capacitor CC2, the set values of Vref1 and Vref2, the current amount (as will be described later) of a constant current source 140 and the state of SW4, non-uniformity of the resistance value of the memory cell, etc.

Next, a case where the range of the resistance value to be read is changed between the normal read mode and the special read mode will be exemplarily described.

As shown in FIG. 11, in the sense amplifier 012, the constant current source 140 is connected to the node C via the switch 4 (SW4). As the constant current source 140, there are many known configurations, including the use of a p-channel MOSFET, the use of a current mirror circuit, etc. In the present example, these known configurations may be suitably used.

SW4 is ON when the input E from the logic control circuit 010 is High and OFF when the input E from the logic control circuit 010 is Low. When SW4 is ON, a constant current is supplied to the node C. In this case, the above stated discharge time is longer. The difference in the discharge time will be described with reference to FIG. 13.

Figure 13:
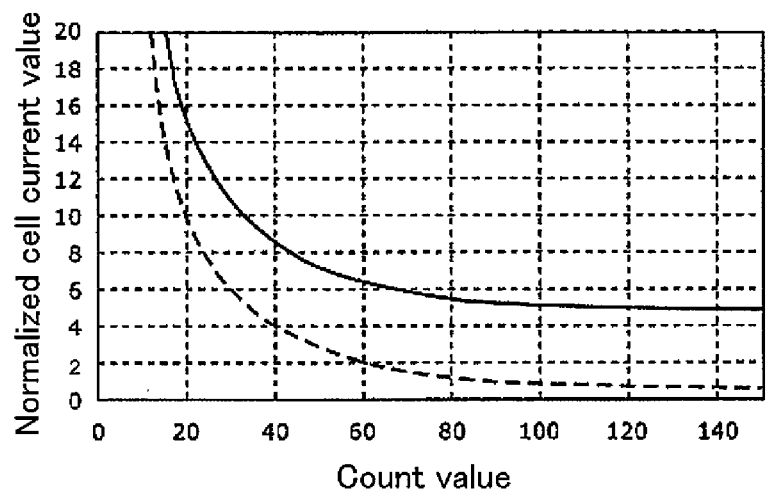
FIG. 13 is a graph showing a difference in discharge time in the non-volatile memory device according to Example 1 of Embodiment 1.

FIG. 13 is a graph showing the difference in discharge time in the non-volatile memory device according to Example 1 of Embodiment 1. In FIG. 13, a horizontal axis indicates the count value of the counter 134, and a vertical axis indicates a normalized cell current value. The normalized cell current value is the value of a DC current flowing when a specified voltage is applied to the memory cell, which is represented in a normalized form, and is a value corresponding to the inverse number of the resistance value of the memory cell. In other words, FIG. 13 indicates the correlation between the count value which is the resistance value information read by the sense amplifier 012 and an actual cell current amount.

This correlation is expressed as the function of cell current=$\alpha \times T^{\beta}$ (T=count value×clock cycle). In FIG. 13, a broken line indicates the characteristic in a case where SW4 is OFF, while a solid line indicates the characteristic in a case where SW4 is ON.

As can be seen from FIG. 13, in the characteristic indicated by the broken line, the range of about 10 to 1, of the cell current value, corresponds to the range of 20 to 100, of the count value. Also, in the characteristic indicated by the solid line, the range of about 15 to 5, of the cell current value, corresponds to the range of 20 to 100, of the count value.

As described above, whether the measurement range of the count value is a relatively low resistance value range or a relatively high resistance value range, can be selected using SW4. Specifically, when SW4 is turned ON, the characteristic indicated by the solid line is formed, which can correspond to a case where a cell current is relatively high, i.e., case where the resistance value of the memory cell is relatively small. This corresponds to the normal read mode (second read mode) for determining whether the resistance value is within the first resistance value range or the second resistance value range, in the case where the characteristic of the memory cell is that shown in FIG. 3.

On the other hand, when SW4 is turned OFF, the characteristic indicated by the broken line is formed, which can correspond to a case where a cell current is relatively low, i.e., case where the resistance value of the memory cell is relatively large. This corresponds to the special read mode (first read mode) for determining whether the resistance value is within the initial resistance value range or the first resistance value range, in the case where the characteristic of the memory cell is that shown in FIG. 3.

Note that the resolution of the read resistance value information can be adjusted, depending on the current amount of the constant current source 140, the frequency of the clock input to the counter 134, the magnitude of Vref1 and the magnitude of Vref2, the capacitance of the capacitor CC2, etc., as well as whether or not a current is supplied from the constant current source 140 (ON or OFF of SW4). Specifically, the resolution of the read resistance value information can be increased when the frequency of the clock is increased.

The measurement range is shifted so that a larger resistance value can be read in a shorter time, by increasing the magnitude of Vref1 and the magnitude of Vref2, by reducing the current amount of the constant current source 140, by reducing the capacitance of the capacitor CC2, etc. Conversely, the measurement range is shifted so that a smaller resistance value can be read, by reducing the magnitude of Vref1 and the magnitude of Vref2, by increasing the current amount of the constant current source 140, by increasing the capacitance of the capacitor CC2, etc.

Vref1 corresponds to the read voltage applied to the memory cell. The resistance state is changed when Vref1 is set higher than a predetermined voltage. This must be taken into account when Vref1 is used to adjust the read range.

[First Exemplary Operation in Special Write Mode]

Hereinafter, the exemplary operation in the special write mode will be described using the variable resistance element of FIG. 3, as an example. It is supposed that the configuration of the non-volatile memory device is the configuration of Example 1, but a similar operation can be performed by using another device configuration.

The operation in the special write mode can be performed by using, for example, the row select circuit/driver 003, the column select circuit 004, the address register 009, the special/normal write circuit 011, the special/normal sense amplifier 012, the controller 013, the data register 030, the Cashe register 031, the special data register 032, and the switching circuit 037. These components are associated with each other to configure the data write circuit. The same applies to other exemplary operation.

Now, it is supposed as follows. When the electric signal with a voltage of +2.4V and a pulse width of 50 ns is applied to the second electrode 128 on the basis of the first electrode 124, the resistance value of the variable resistance element 120 changes from the LR level (second resistance value range) to the HR level (first resistance value range), while when the electric signal with a voltage of −2.4V and a pulse width of 50 ns is applied to the second electrode 128 on the basis of the first electrode 124, the resistance value of the variable resistance element 120 changes from the HR level to the LR level. In a case where the variable resistance element 120 is, for example, the bipolar variable resistance element, and has a characteristic in which the variable resistance element 120 reversibly changes between the HR state and the LR state by application of the electric signal of ±2.4V, for example, the electric stress with a voltage having an absolute value of 3V which is larger than 2.4V and with a pulse width of 1 µs, is applied to the variable resistance element 120. If the variable resistance element 120 does not change to the variable state even though this electric pulse is applied thereto, for example, the electric stress with a voltage which is increased by 0.1V in absolute value and with a pulse width which is five times larger, is newly applied to the variable resistance element 120. By repeating this processing, the electric stress is applied to the variable resistance element 120 for the cumulative application time required for each of the memory cells. Thus, the forming process step is completed.

Figure 14:
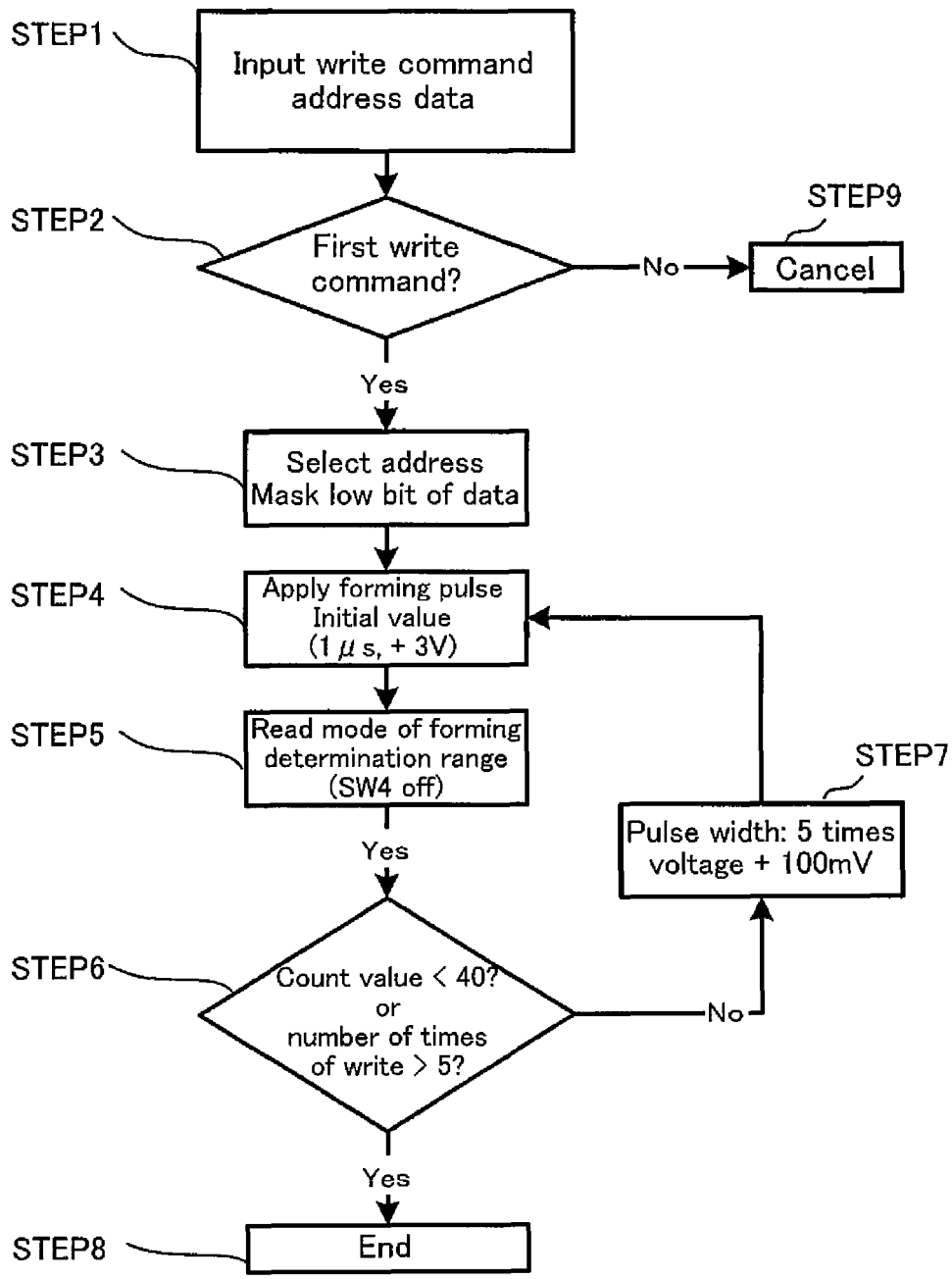
FIG. 14 is a flowchart showing the first exemplary operation of a special write mode of Embodiment 1.

FIG. 14 is a flowchart showing the first exemplary operation in the special write mode of Embodiment 1. In the example of FIG. 14, it is supposed that the input data is written to the memory cell 91, rather than an example in which the application of the electric stress is stopped and the random data is generated before all of the memory cells 91 change to the variable state as will be described later.

Firstly, the write command, the address to which the data is to be written, and the data to be written, are input from outside the non-volatile memory device 100 (STEP1).

Then, it is determined whether or not the write command input in STEP1 is the first write command (STEP2). If the result of the determination in STEP2 is NO, the processing is cancelled.

If the result of the determination in STEP2 is YES, the memory cell 91 corresponding to the address input in STEP1 is selected, and masking is performed to inhibit the electric stress from being applied to the memory cell (memory cell to which data "0" is to be written: memory cell should be maintained in the initial state) to which the data is to be written in Low logic, according to the input data (STEP 3).

Thereafter, the electric stress (forming pulse) is applied to the memory cell for which masking is not performed, of the selected memory cells, i.e., memory cell to which the data is to be written in High logic (memory cell to which data "1" is to be written: memory cell to be changed from the initial state to the variable state) (STEP4). The initial value of the voltage of the applied electric stress is set to 3V, and the initial value of the pulse width of the applied electric stress is set to 1 µs.

Thereafter, the mode of the sense amplifier 012 is set to the read mode of the forming determination range (STEP 5). Specifically, SW4 of FIG. 11 is turned OFF and the measurement range is set to correspond to a high-resistance range.

Thereafter, it is determined whether or not the count value held in the counter 134 of the sense amplifier 012 is smaller than 40, and it is determined whether or not the number of times of application of the electric stress (forming pulse) exceeds five times (STEP 6). If one of the results of the determination in STEP6 is YES, the processing is terminated (End).

If the results of the determination in STEP6 are NO, the process returns to STEP S4, and the electric stress (forming pulse) with a voltage which is increased by 0.1V and with a pulse width which is five times larger, with respect to the electric stress (forming pulse) applied most recently, is applied to the variable resistance element 120. STEP4 to STEP 7 may be repeated until the memory cell to which the data is to be written in High logic is changed to the variable state. However, in the example of FIG. 14, the upper limit is set in the number of times of write, to prevent formation of an infinite loop in a case where the memory cell has a failure.

Although not shown, if a failure which exceeds the upper limit set in the number of times of write, occurs, an error log may be output and a proper processing may be performed. In a case where the above stated flow is executed in parallel with respect to a plurality of bits, the number of times of the application of the electric stress, which will result in YES of the result of the determination in STEP 6, is different for each bit. In that case, for the memory cell for which the result of the determination in STEP 6 is YES, masking is performed to inhibit the electric stress from being applied to the memory cell thereafter. At a time point when the results of the determination in STEP 6 are YES, for all of the memory cells subjected to parallel processing, the flow may be ended.

FIG. 15 is a table showing the exemplary result of reading of data in the special read mode from the memory cell to which the data is written in the special write mode of FIG. 14. FIG. 16 is a table showing the exemplary result of reading of data in the normal read mode from the memory cell to which the data is written in the special write mode of FIG. 14.

In the examples of FIGS. 15 and 16, the clock frequency, the read voltage, the determination voltage Vref2 and the determination time are set equal between the special read mode and the normal read mode, and SW4 of FIG. 11 is switched such that only the current amount of the constant current source 140 is made different between the special read mode and the normal read mode.

FIG. 15 shows the result of reading in the special read mode, from the memory cell after data expressed as 4 bits (16 numeric values expressed as O to F in a hexadecimal form) is written to the memory cell in the initial state. FIG. 16 shows the result of reading in the normal read mode, from the memory cell after the same data as that of FIG. 15 is written in the special write mode.

As the numeric values of the bits in the examples of FIGS. 15 and 16, the values held in the counter 134 of FIG. 11 are shown, without decoding into binary digital data. The terms in the hexadecimal form are results of determination that the value which is larger than 40 of the forming determination threshold is 0 and the value which is smaller than 40 of the forming determination threshold is 1. The maximum value of the counter 134 is 255, and a value larger than 255 is limited.

As shown in FIG. 15, in the case where the data is read from a memory cell group in the special read mode (read using the first threshold), all of the memory cells for which the forming is not completed indicate the maximum value of 255, and the memory cells for which the forming is completed indicate the values of 9 to 10. The terms in the hexadecimal form are identified as specified values of O to F.

By comparison, as shown in FIG. 16, in the case where the data is read from the same memory cell group in the normal read mode (read using the second threshold), reading of correct values cannot be performed, and a large part of data is zero. That is, the data is decoded as data which is completely different from the data originally written to the memory cell group (16 numeric values expressed as O to F in the hexadecimal form). The reason why the numeric values of the memory cells for which the forming is completed are significantly non-uniform is that the resistance values of the memory cells for which the forming is completed are significantly non-uniform unless some measures are taken, so that the memory cells in some cases change to the HR level or to the LR level. A should be understood from this, the data written using the special write command cannot be correctly decoded unless they are read using the special read command. In other words, by using the special write command and the special read command as the secret commands, the security of the data stored using the special write command can be improved.

Although in the above described example, the resistance value of the memory cell in the initial state is larger than the resistance value of the memory cell in the variable state, a similar operation can be performed by suitably changing the determination method, the polarity and voltage of the pulse applied, etc., even when the resistance value of the memory cell in the initial state is smaller than the resistance value of the memory cell in the variable state.

[Second Exemplary Operation in Special Write Mode]

Figure 17:
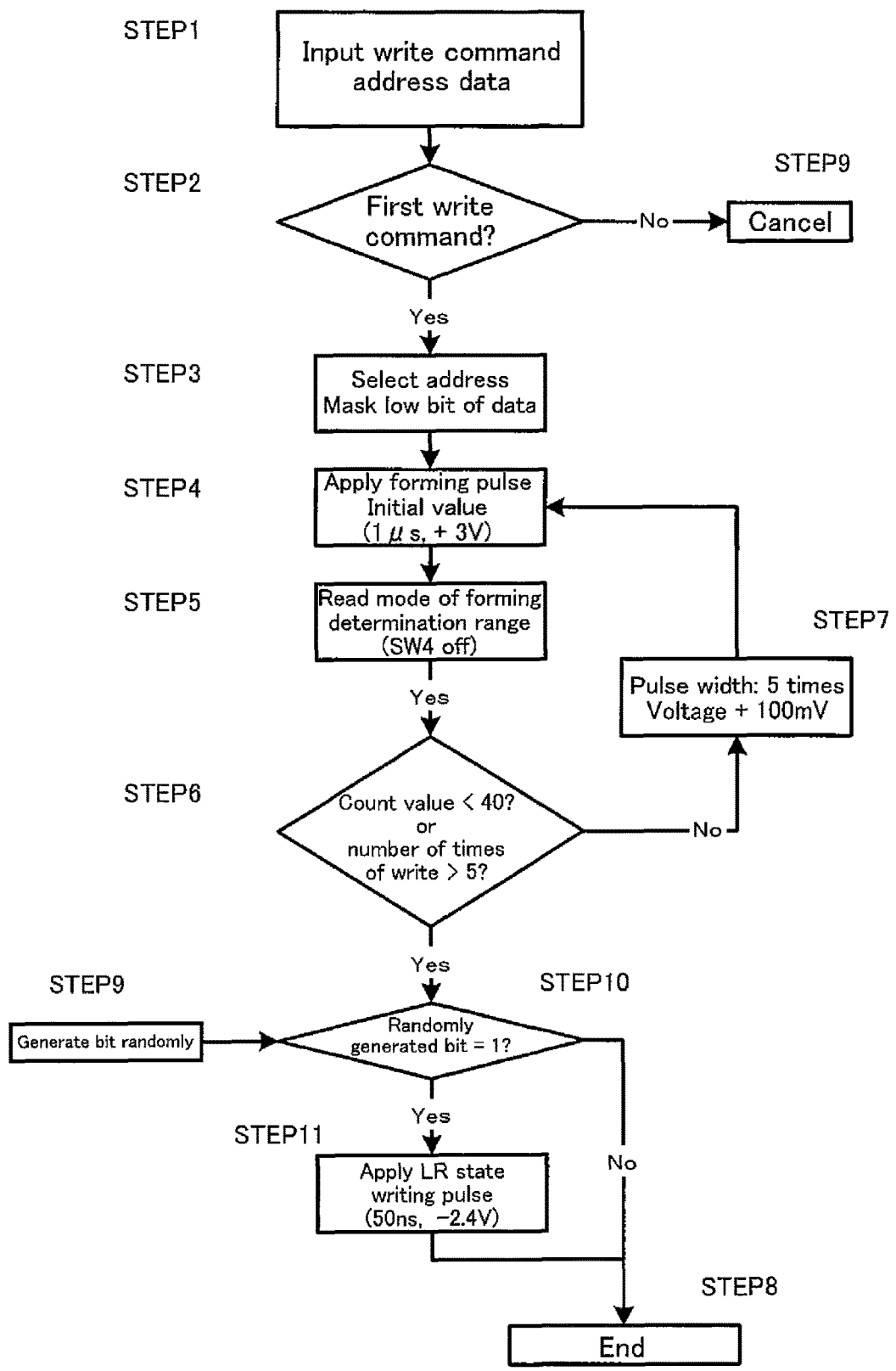
FIG. 17 is a flowchart showing the second exemplary operation of the special write mode of Embodiment 1.

FIG. 17 is a flowchart showing the second exemplary operation of the special write mode of Embodiment 1. In the second exemplary operation, in the special write mode, the resistance values of all of the memory cells which have changed from the initial state to the variable state are not retained in the HR level, but the resistance values of some of the memory cells are randomly set to the LR level. In this method, all of the resistance values of the memory cells which are read using the second read command, from the memory cells to which the data is written in the special write mode, are not zero, and thus it can look like some data is stored.

In the example of FIG. 17, the operation with the same STEP number as that of FIG. 4 (first exemplary operation) is the same as the operation of the first exemplary operation, and will not be described repeatedly.

Referring to FIG. 17, when the count value becomes smaller than 40 and the resistance value reaches the HR level, in STEP6, it is determined whether the random value generated in STEP9 is 0 or 1 (STEP10). When it is determined that the random value is 0, the process moves to STEP8 without any processing, and is terminated. When it is determined that the random value is 1, the LR state writing pulse (second electric signal) is applied to the memory cell to decrease the resistance value to the LR level (STEP11), and the process moves to STEP8, and is terminated.

With this operation, the resistance values of the memory cells which have changed to the variable state become LR level randomly. Therefore, even when these resistance values are read in the normal read mode, they are not recognized as a fixed data pattern in which all bits are 0, and thus the data can be kept secret with an improved level Depending on the input data, the memory cells to which the data "1" is written are very few in some cases. In that case, if STEP11 is performed, a risk of steal-reading of the secret data may be increased. In view of this, depending on the number of memory cells to which the data "1" is written, the processing of STEP11 may be limited.

Although in the above described example, the resistance value of the memory cell in the initial state is larger than the resistance value of the memory cell in the variable state, a similar operation can be performed by suitably changing the determination method, the polarity and voltage of the pulse applied, etc., even when the resistance value of the memory cell in the initial state is smaller than the resistance value of the memory cell in the variable state.

[Third Exemplary Operation in Special Write Mode]

Figure 18:
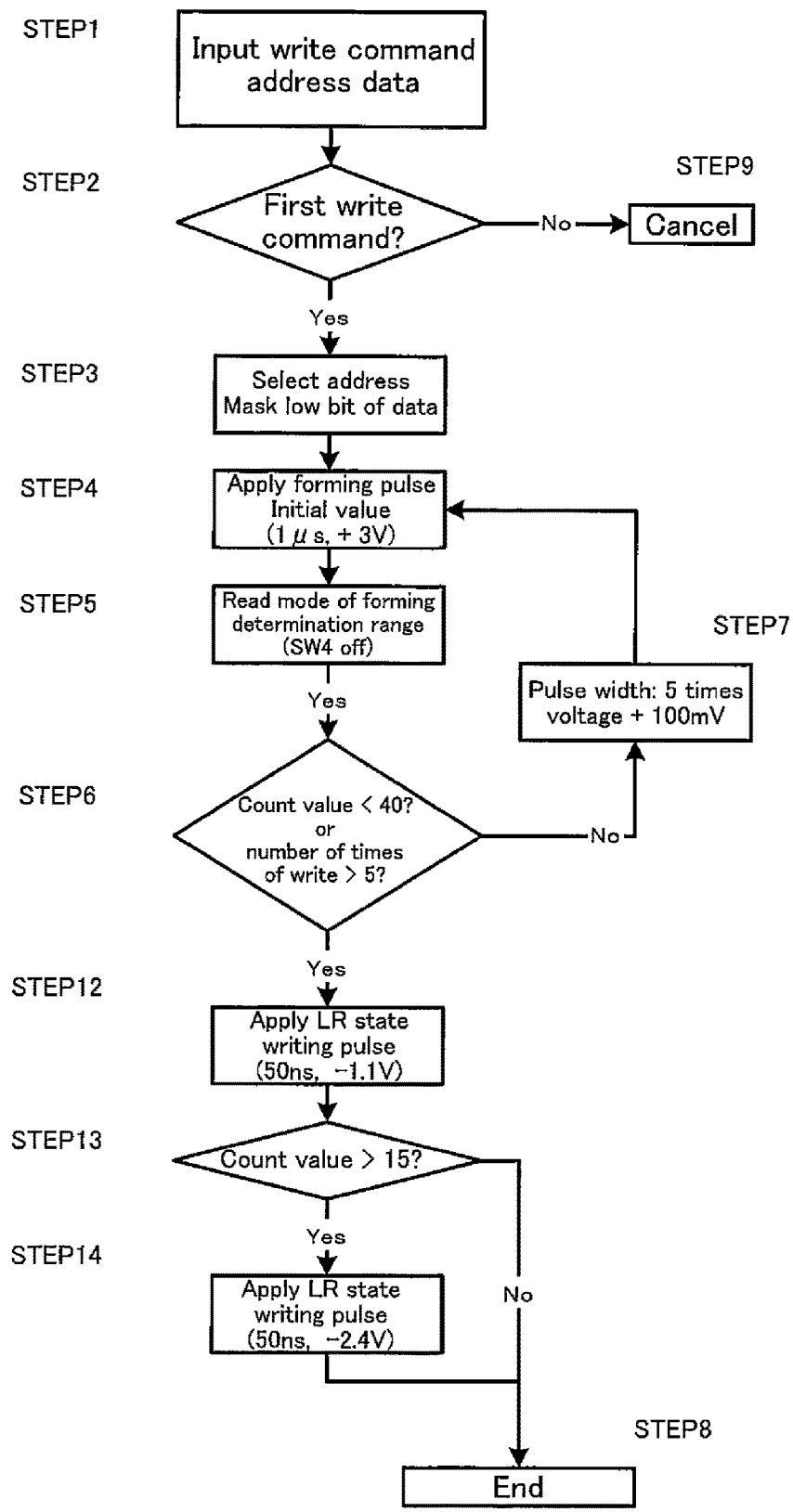
FIG. 18 is a flowchart showing the third exemplary operation of the special write mode of Embodiment 1.

FIG. 18 is a flowchart showing the third exemplary operation of the special write mode of Embodiment 1. In the third exemplary operation, the reliability of the write data can be improved.

In the example of FIG. 18, the operation with the same STEP number as that of FIG. 4 (first exemplary operation) are the same as the operation of the first exemplary operation, and will not be described repeatedly.

The electric stress (auxiliary stress) which is lower than the LR state writing pulse (e.g., absolute value of amplitude is smaller) and has the same polarity as that of the LR state writing pulse, is applied to the memory cell which is determined as having changed to the variable state in STEP6 of FIG. 18 (STEP12). Specifically, when the amplitude of the LR state writing pulse is −2.4V, the amplitude of the auxiliary stress may be set to almost half of −2.4V, i.e., −1.1V. The amplitude of the auxiliary stress may be decided in such a manner that the resistance change in the case where the voltage is increased gradually is measured as described with reference to FIG. 5, and the voltage at a stage which is just before the resistance change occurs, or an intermediate voltage at a stage in which slight resistance change occurs, is used as the auxiliary stress.

By applying the auxiliary stress, a state in which oxygen vacancy sites are more is formed in the variable resistance layer of the variable resistance element. In this state, a reduction reaction easily proceeds. In view of this, for example, in a case where the non-volatile memory device is left for a long period of time, a case where the resistance change occurs under a super-high temperature condition, etc., the directionality of the change can be preliminarily set so that the resistance is decreased easily, i.e., the resistance value does not fall into the initial resistance value range unexpectedly.

In very rare cases, the application of the auxiliary stress may cause the memory cell which changes abnormally (resistance value becomes extremely large). In the third exemplary operation, the sense amplifier determines the resistance value again after STEP12 (STEP13). In this case, the threshold may be set smaller than that in STEP6, and may be a value which provides allowance with respect to the forming determination threshold of 40.

When it is determined that the abnormal change has occurred in STEP13, the LR state writing pulse is applied to the memory cell to forcibly change the resistance value to the LR level (STEP14). Since the memory cell which changes abnormally occurs randomly and very rarely, the secret data will not be read in the normal read mode even when the resistance value is set to the LR level.

The flow of FIG. 18 is merely exemplary and many modified examples may be designed. For example, before the flow is ended in STEP8, a flow may be added, in which the mode of the sense amplifier may be set to the read mode of the normal determination range to enable the determination using the second threshold of FIG. 3, the sense amplifier reads the data and verifies whether a bit number difference with the secret data is equal to or larger than a predetermined number, and the pulse of $V_H$ is applied to the memory cell having decreased to the LR level so that the memory cell is newly set to the HR level when the bit number difference is less than the predetermined number.

Although in the above described example, the resistance value of the memory cell in the initial state is larger than the resistance value of the memory cell in the variable state, a similar operation can be performed by suitably changing the determination method, the polarity and voltage of the pulse applied, etc., even when the resistance value of the memory cell in the initial state is smaller than the resistance value of the memory cell in the variable state.

[Fourth Exemplary Operation in Special Write Mode]

Figure 19:
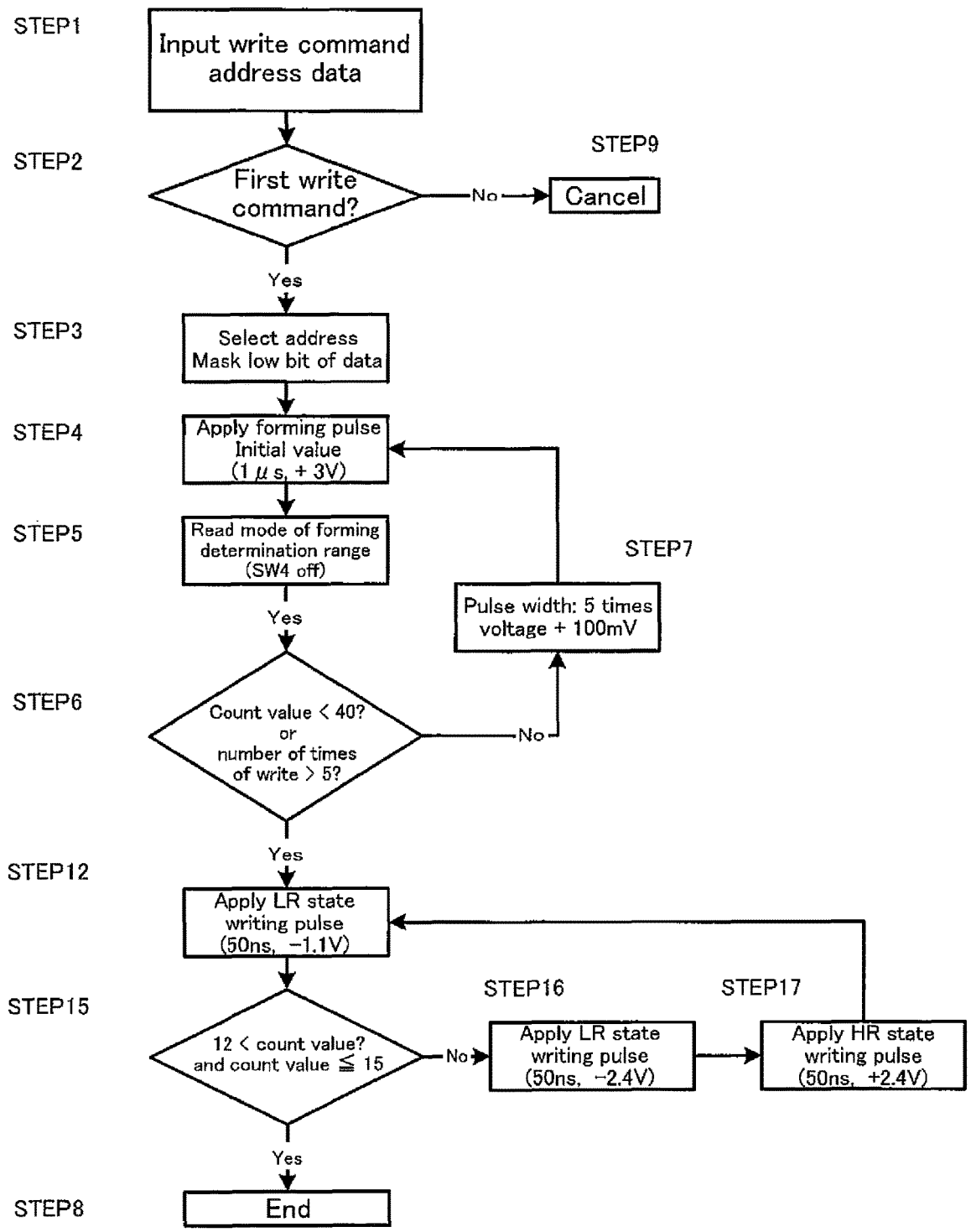
FIG. 19 is a flowchart showing the fourth exemplary operation of the special write mode of Embodiment 1.

FIG. 19 is a flowchart showing the fourth exemplary operation of the special write mode of Embodiment 1. In the fourth exemplary operation of FIG. 19, STEP13 and STEP14 of FIG. 18 are replaced by STEP15, STEP16, and STEP17, and the operation with the same STEP number as that of FIG. 18 (third exemplary operation) are the same as the operation of the third exemplary operation, and will not be described repeatedly.

After STEP12, it is determined that the resistance value of the memory cell is a desired HR level by the application of the auxiliary stress in STEP12 (STEP15). In other words, in STEP15, it is determined whether or not the count value is within the range of 12 to 15, in order to confirm that the resistance value is correctly set to the HR level, rather than the LR level and the initial resistance value range. If the result of the determination is NO, a negative pulse (LR state writing pulse) with a pulse width of 50 ns and an amplitude of −2.4V is applied to the memory cell to change the resistance value to the LR level (STEP16). After that, a positive pulse (HR state writing pulse) with a pulse width of 50 ns and an amplitude of +2.4V is applied to the memory cell to change the resistance value to the HR level (STEP17). Then, processing returns to STEP12.

Although not shown, error processing may be performed to prevent formation of an infinite loop in the flow of STEP12, STEP15, STEP16 and STEP17.

A method of storing the data on the basis of whether the memory cell is in the initial state or the variable state has an advantage that error detection of the data is less likely to take place. The reason is such that in many cases, there is a great difference between the resistance value of the memory cell in the initial state and the resistance value of the memory cell in the variable state.

The variable resistance element of the memory cell in the initial state has a characteristic which is equivalent to that of the insulator and is very stable against a degradation which progresses due to heat and over time. The memory cell which has changed once to the HR level corresponding to the initial resistance value range may change the resistance due to heat but gets close to the LR level, all the time, according to the fourth exemplary operation. Therefore, a detection window is not reduced, and the data can be retained with a very high reliability.

This is especially suitable for the retention of the data with high importance, which will result in serious damages if error occurs in read, such as key information of security, serial number information used for the authentication, etc.

Figure 20:
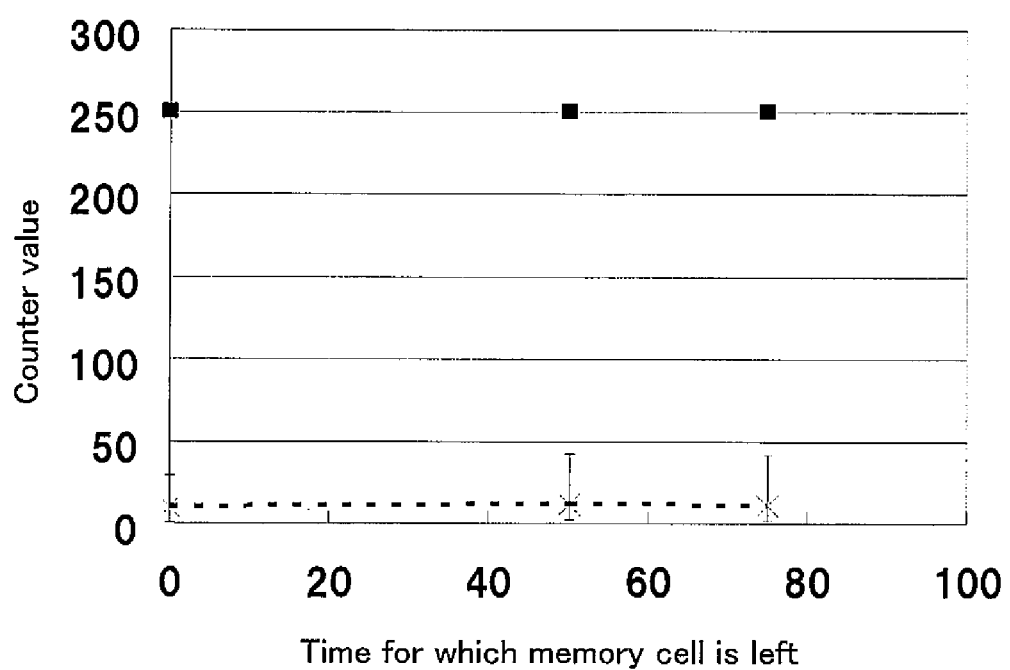
FIG. 20 is a graph showing shifting of a counter value in a state in which the memory cell in which the data is stored using the fourth exemplary operation is left at 210 degrees C.

The data which is the basis for the above described effects is shown in FIG. 20. FIG. 20 is a graph showing shifting of a counter value in a state in which the memory cell in which the data is stored using the fourth exemplary operation is left at 210 degrees C. In the configuration of the element, the material of the first electrode 124 is TaN, the material of the second electrode 128 is Ir, the material of the variable resistance layer 126 is the tantalum oxides of the stacked-layer structure, the thickness of the variable resistance layer 126 is 50 nm, the area of the surface of the first electrode 124 and the surface of the variable resistance layer 126, which surfaces are in contact with each other, and the area of the surface of the second electrode 128 and the surface of the variable resistance layer 126, which surfaces are in contact with each other, are each equal to or smaller than 0.25 µm². The layer placed in contact with the first electrode 124, of the layers of the variable resistance layer 126, is the layer which is lower in oxygen concentration, and satisfies 0<x<2.5 when its composition is expressed as $TaO_x$. On the other hand, the layer placed in contact with the second electrode 128, of the layers of the variable resistance layer 126, is the layer which is higher in oxygen concentration, satisfies y≥2.1 when its composition is expressed as $TaO_y$, and has a thickness of about 5.5 nm. As the select element for the variable resistance element, a memory cell (see the memory cell of FIG. 21) including a bidirectional diode is used. The forming stress has a voltage of +5.5V resulting from the addition of the ON-voltage of the diode, and a pulse width of 10 μSec or larger. The LR state writing pulse (pulse for changing the resistance value of the element from the first resistance value range to the second resistance value range: first electric signal) has a voltage of −4.5V and a pulse width of 50 nSec. The HR state writing pulse (pulse for changing the resistance value of the element from the second resistance value range to the first resistance value range: second electric signal) has a voltage of +4.5V and a pulse width of 50 nSec.

In FIG. 20, a horizontal axis indicates a passage time, and a vertical axis indicates a count value. The memory cell group in the initial state is indicated by a solid line and ■ points, while the memory cell group which has changed to the variable state is indicated by a broken line and X points. The count values of the memory cells in the initial state are uniform. The count values are all the upper limit 250 and constant. Regarding the memory cell group which has changed to the variable state, the maximum value and minimum value of each point are each indicated by a longitudinal bar. As can be seen from FIG. 20, a detection window is not substantially reduced, and the data can be stored with a very high reliability, even under a very high temperature of 210 degrees C. This stability can be attained as well under a low temperature.

Although in the above described example, the resistance value of the memory cell in the initial state is larger than the resistance value of the memory cell in the variable state, a similar operation can be performed by suitably changing the determination method, the polarity and voltage of the pulse applied, etc., even when the resistance value of the memory cell in the initial state is smaller than the resistance value of the memory cell in the variable state.

[Other Exemplary Operation in Special Write Mode]

For example, in a case where the normal read mode is widely published, and the special read mode is kept secret, as described above, a step of confirming that the data stored in the special write mode cannot be read in the normal read mode may be executed. Specifically, after the data is stored in the special write mode using the forming, the data (first data) may be read using the first threshold used in the special read mode, the data (second data) may be read using the second threshold used in the normal read mode, and additional write may be performed to prevent a situation in which the data read in the special read mode and the data read in the normal read mode are similar to or coincide with each other.

In a case where the initial resistance value range is larger than the plurality of changeable resistance value ranges, after executing the step of applying the forming stress, the step of comparing the first data read using a first threshold which is equal to or smaller than the lower limit of the initial resistance value range and is equal to or larger than the upper limit of one of the plurality of changeable resistance value ranges, corresponding to a largest resistance value, to the second data read using a second threshold which is equal to or smaller than the lower limit of one of the plurality of changeable resistance value ranges, corresponding to the largest resistance value and is equal to or larger than the upper limit of one of the plurality of changeable resistance value ranges, corresponding to a smallest resistance value, and the step of additionally applying the electric signal to the memory cells in the changeable resistance value range which is smaller than the second threshold, when the number of the memory cells which are different in resistance value between the first data and the second data is smaller than a predetermined number (e.g., equal to or larger than at least the half of the memory cells to which the data is to be written such that the resistance values fall into the resistance value range which is smaller than the first threshold). The electric signal additionally applied is, for example, the first electric signal (HR state writing pulse) for shifting the memory cell in the changeable resistance value range which is smaller than the second threshold into the changeable resistance value range which is larger than the second threshold. However, this pulse is not limited to the first electric signal (HR state writing pulse). As the electric signal applied to the memory cell in the changeable resistance value range which is smaller than the second threshold such that the resistance value converges in the changeable resistance value range which is larger than the second threshold, a combination of the first electric signal and the second electric signal, or a combination of these electric signals and the auxiliary stress which is smaller in absolute value of voltage than the second electric signal, may be used. In that case, the pulse applied finally in the write flow is the first electric signal or the auxiliary stress.

Or, in a case where the initial resistance value range is smaller than the plurality of changeable resistance value ranges, after executing the step of applying the forming stress, the step of comparing the first data read using a first threshold which is equal to or larger than the upper limit of the initial resistance value range and is equal to or smaller than the lower limit of one of the plurality of changeable resistance value ranges, corresponding to a smallest resistance value, to the second data read using a second threshold which is equal to or larger than the upper limit of one of the plurality of changeable resistance value ranges, corresponding to the smallest resistance value and is equal to or smaller than the lower limit of one of the plurality of changeable resistance value ranges, corresponding to a largest resistance value, and the step of additionally applying the electric signal to the memory cells in the changeable resistance value range which is larger than the second threshold, when the number of the memory cells which are different in resistance value between the first data and the second data is smaller than a predetermined number (e.g., equal to or larger than at least the half of the memory cells to which the data is to be written such that the resistance values fall into the resistance value range which is larger than the first threshold). The electric signal additionally applied is, for example, the second electric signal (LR state writing pulse) for shifting the memory cell in the changeable resistance value range which is larger than the second threshold into the changeable resistance value range which is smaller than the second threshold. However, this pulse is not limited to the second electric signal (LR state writing pulse). As the electric signal applied to the memory cell in the changeable resistance value range which is larger than the second threshold such that the resistance value converges in the changeable resistance value range which is smaller than the second threshold, a combination of the first electric signal and the second electric signal, or a combination of these electric signals and the auxiliary stress which is smaller in absolute value of voltage than the first electric signal, may be used. In that case, the pulse applied finally in the write flow is the second electric signal or the auxiliary stress.

Example 2

Figure 21:
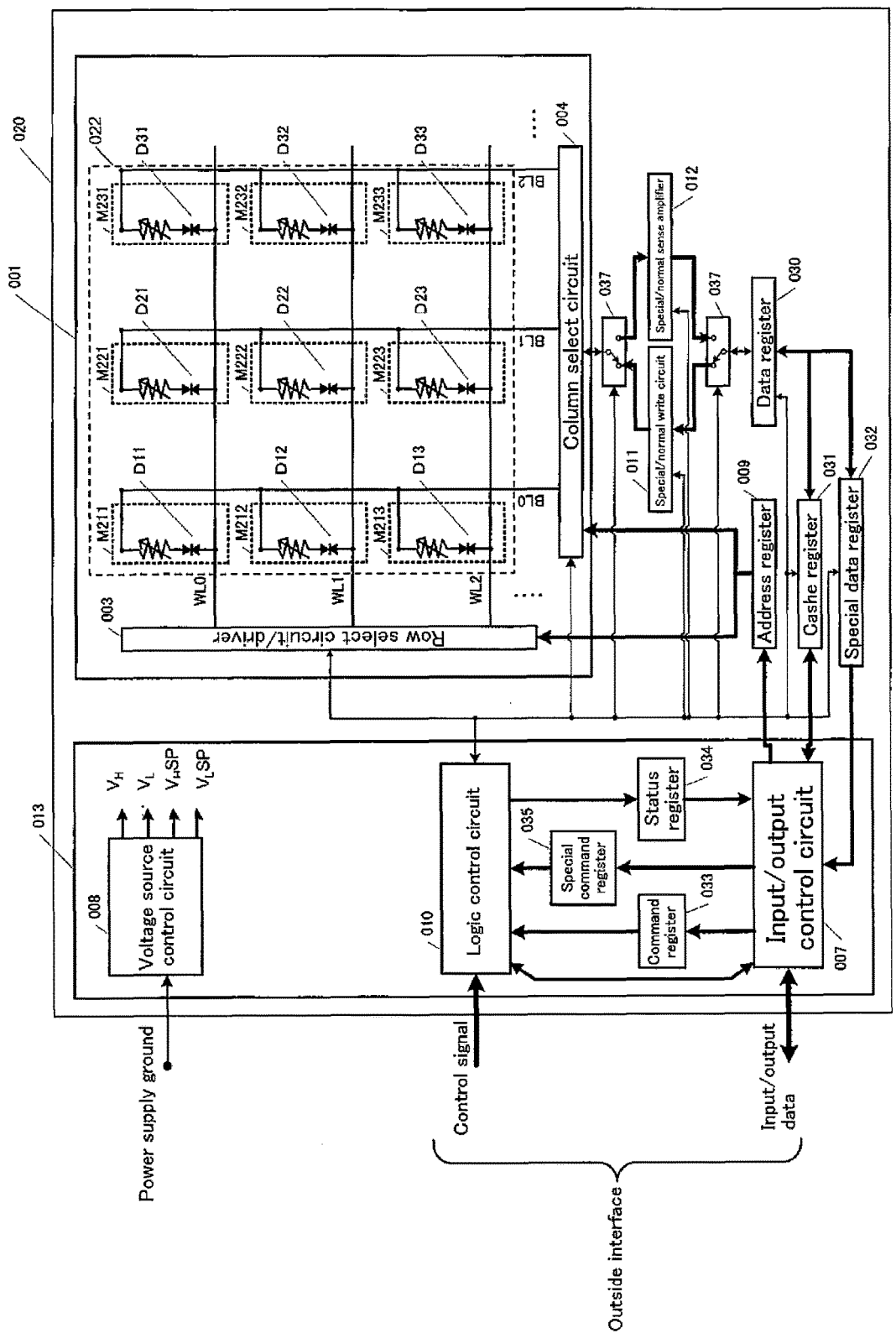
FIG. 21 is a block diagram showing the exemplary schematic configuration of a non-volatile memory device according to Example 2 of Embodiment 1.

FIG. 21 is a block diagram showing the exemplary schematic configuration of a non-volatile memory device according to Example 2 of Embodiment 1. Example 2 may be identical in configuration to Example 1 except the memory cell array. In FIG. 21, the same components as those of FIG. 9 are identified by the same reference symbols and names, and will not be described in detail, repeatedly.

In a memory cell array 022 of Example 2, the elements used to select the memory cells are two-terminal selecting elements instead of the transistors. With this change, the plate lines of Example 1 are omitted.

As the two terminal elements D11 to D33, non-linear elements such as diodes may be used. A semiconductor memory device including the memory cells M211 to M233 including the two-terminal selecting elements such that the memory cells M211 to M233 area arranged in array is referred to as a cross-point memory array. The cross-point memory array is a well-known art in a fuse memory, etc., and will not be described in detail.

Whether each of the memory cells M211 to M233 is in a continuity state or in a non-continuity state is switched depending on a voltage level between the both ends of the cell. For example, by application of a pulse with a voltage level of a sum of the ON-voltage of the two-terminal selecting element and the re-write voltage of the variable resistance element 120, the resistance state of the variable resistance element 120 changes. Also, by application of a pulse with a voltage level of a sum of the ON-voltage of the two-terminal selecting element and a read voltage which is smaller in magnitude than the re-write voltage of the variable resistance element 120, and detection of a current value at this time, the resistance state of the variable resistance element 120 is determined.

As the two-terminal selecting element used in the example of FIG. 21, the characteristic of FIG. 12, in which a current flows in one direction (forward direction) is well-known in general.

Figure 22:
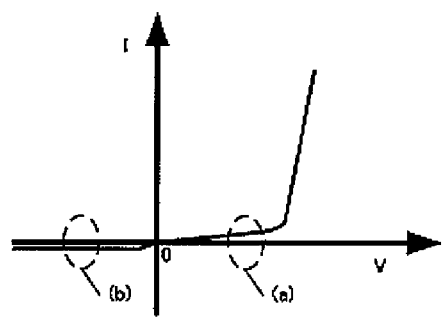
FIG. 22 is a view showing the exemplary voltage-current characteristic of a two-terminal selecting element used in Example 2 of Embodiment 1.

FIG. 22 is a view showing the exemplary voltage-current characteristic of the two-terminal selecting element used in Example 2 of Embodiment 1. In FIG. 22, a horizontal axis indicates a voltage and a vertical axis indicates a current. For example, regarding a general diode element which is commercially available, a minute current of about 100 µA to 1 mA flows under 0.2V, in the range of the forward bias as indicated by a broken line (a), although this is well-known and is not described in detail. On the other hand, in reverse bias, a current is almost constant and as small as about 10 nA to 1 µA until a break voltage is reached, as indicated by the broken line (b). Of course, the absolute amount of the current is varied depending on the size of the diode element, but the trends of the voltage-current characteristic in the forward bias and in the reverse bias are similar to each other. In the example of FIG. 21, by setting the electric potential difference between unselected word lines and unselected bit lines to an equipotential, or to the reverse bias, almost no current flows through the unselected memory cells which are other than the selected memory cell, so that only the selected memory cell becomes a write or read target. The two-terminal selecting element having the diode characteristic of FIG. 22, may be incorporated into, for example, a non-volatile memory device including the unipolar variable resistance element.

Figure 23:
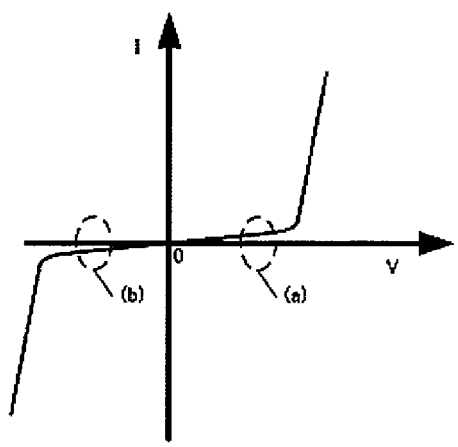
FIG. 23 is a view showing the exemplary voltage-current characteristic of a two-terminal selecting element used in Example 2 of Embodiment 1.

FIG. 23 is a view showing the exemplary voltage-current characteristic of the two-terminal selecting element used in Example 2 of Embodiment 1. In FIG. 23, a horizontal axis indicates a voltage and a vertical axis indicates a current. FIG. 23 shows the characteristic of a current limiting element (also referred to as bidirectional diode) which can flow a current bidirectionally. The structure and characteristic of the current limiting element are also well-known and will not be descried in detail. There are many known methods as the specific control method of selecting a particular memory cell using this current limiting element. In the present example, these known methods may be suitably used.

In the present example, the writing method and the reading method may be the same as those of Example 1, except that the voltage applied between the both ends of the memory cell is set to a voltage level which is equal to or larger than the voltage level of a sum of the ON-voltage of the two-terminal selecting element and the voltage applied to the variable resistance element 120. Example 2 may be modified as in Example 1.

An aspect of the present disclosure is useful as a non-volatile memory device, which can provide a novel data storing method which is not provided in a prior art, and is applicable to a safer encryption technique, and the like.

Numeral improvements and alternative embodiments of the present disclosure will be conceived by those skilled in the art in view of the foregoing description. Accordingly, the description is to be construed as illustrative only, and is provided for the purpose of teaching those skilled in the art the best mode of carrying out the present disclosure. The details of the structure and/or function may be varied substantially without departing from the spirit of the present disclosure.

What is claimed is:
1. A non-volatile memory device comprising:
a memory cell array that includes a plurality of memory cells, the plurality of memory cells including:
first memory cells in a variable state such that each of the first memory cells has a resistance value which reversibly changes between a plurality of changeable resistance value ranges in accordance with an electric signal applied thereto; and
second memory cells in an initial state, which does not change to the variable state unless a forming stress is applied thereto, a resistance value of each of the second memory cells in the initial state being within an initial resistance value range which does not overlap with the plurality of changeable resistance value ranges of the variable state,
wherein in the memory cell array, data is stored on the basis of whether each of the plurality of memory cells is in the initial state or the variable state,
wherein the stored data includes:
first-kind data corresponding to the second memory cells in the initial resistance value range; and
second-kind data different from the first-kind data corresponding to the first memory cells in the variable state, and
wherein the stored date is a random data unique to the non-volatile memory device.
2. The non-volatile memory device according to claim 1, wherein the first-kind data is stored on the basis of which of M1 resistance value ranges which include (M1−1) resistance value ranges and the initial resistance value range, a resis- tance value of each of the plurality of memory cells is within, where M1 is a positive integer equal to or smaller than N and N is an integer equal to or larger than 3;
  wherein the second-kind data is stored on the basis of which of M2 resistance value ranges which do not include the initial resistance value range, a resistance value of each of the plurality of memory cells is within, where M2 is a positive integer equal to or smaller than (N−1); and
  wherein the (M1−1) resistance value ranges each are identical to one of the M2 resistance value ranges.

3. The non-volatile memory device according to claim 1, further comprising:
  a read circuit that selectively executes:
    reading the first-kind data on the basis of a first-kind threshold group including a first threshold which is equal to or smaller than a lower limit of the initial resistance value range and is equal to or larger than the largest of upper limits of the plurality of changeable resistance value ranges; and
    reading the second-kind data on the basis of a second-kind threshold group including thresholds which are equal to or smaller than the largest of lower limits of the plurality of changeable resistance value ranges.

4. The non-volatile memory device according to claim 1, further comprising:
  a read circuit that selectively executes:
  reading the first-kind data on the basis of a first-kind threshold group including a first threshold which is equal to or larger than an upper limit of the initial resistance value range and is equal to or smaller than the smallest of lower limits of the plurality of changeable resistance value ranges; and
    reading the second-kind data on the basis of a second-kind threshold group including thresholds which are equal to or larger than the smallest of upper limits of the plurality of changeable resistance value ranges.

5. The non-volatile memory device according to claim 1, further comprising:
  a read circuit that includes:
  a driver for applying a read voltage to a memory cell selected from among the plurality of memory cells;
  a constant current source for flowing a constant current through the selected memory cell at a predetermined current amount;
  a counter circuit for counting time that passes from when the driver stops application of the read voltage to the selected memory cell until a voltage of the selected memory cell becomes smaller than a predetermined determination voltage; and
  a comparator circuit for comparing the time counted by the counter circuit to a predetermined determination time;
  wherein the read circuit selectively reads the first-kind data and the second-kind data, and
  at least one of the read voltage; the current amount, the predetermined determination voltage, or the predetermined determination time is different between the case of reading the first-kind data and the case of reading the second-kind data.

6. The non-volatile memory device according to claim 1, wherein the memory cell array includes memory cells allocated to a first write address area and memory cells allocated to a second write address area;
  wherein the first-kind data is stored in the first write address area; and
  wherein the second-kind data is stored in the second write address area.

7. The non-volatile memory device according to claim 1, wherein the changeable resistance value ranges include a high-resistance value range and a low-resistance value range lower than the high-resistance value range.

8. The non-volatile memory device according to claim 1, wherein a lower limit of the initial resistance value range is equal to or larger than upper limits of all of the changeable resistance value ranges.

9. The non-volatile memory device according to claim 1, wherein an upper limit of the initial resistance value range is equal to or smaller than lower limits of all of the changeable resistance value ranges.

10. The non-volatile memory device according to claim 1, wherein the plurality of changeable resistance value ranges include (N−1) changeable resistance value ranges, where N is an integer equal to or larger than 3; and
  wherein in the memory cell array, multi-valued data is stored, on the basis of which of N resistance value ranges including the initial resistance value range and the (N−1) changeable resistance value ranges, the resistance value of each of the plurality of memory cells is within.

11. The non-volatile memory device according to claim 1, further comprising:
  a read circuit that reads the stored data, by determining whether a memory cell selected from among the plurality of memory cells is in the initial state or the variable state.

12. The non-volatile memory device according to claim 1, further comprising:
  a read circuit that selectively executes:
    determining whether or not a resistance value of a memory cell selected from among the plurality of memory cells is larger than a first threshold, the first threshold being equal to or smaller than a lower limit of the initial resistance value range and being equal to or larger than the largest of upper limits of the plurality of changeable resistance value ranges; and
    determining whether or not a resistance value of a memory cell selected from among the plurality of memory cells is larger than a second threshold, the second threshold being equal to or smaller than the largest of lower limits of the plurality of changeable resistance value ranges and being equal to or larger than the smallest of upper limits of the plurality of changeable resistance value ranges.

13. The non-volatile memory device according to claim 1, wherein each of the plurality of memory cells includes a variable resistance element including a first electrode, a second electrode, and a variable resistance layer located between the first electrode and the second electrode; and
  wherein the variable resistance layer of the variable resistance element included in the memory cell in the initial state insulates the first electrode and the second electrode from each other.

14. The non-volatile memory device according to claim 1, wherein each of the plurality of memory cells includes a variable resistance element including a first electrode, a second electrode, and a variable resistance layer located between the first electrode and the second electrode; and
  wherein the variable resistance layer includes a metal oxide.

15. The non-volatile memory device according to claim 1,
wherein each of the plurality of memory cells includes a variable resistance element including a first electrode, a second electrode, and a variable resistance layer located between the first electrode and the second electrode; and
wherein the variable resistance layer includes an oxygen-deficient metal oxide layer.

16. The non-volatile memory device according to claim 14,
wherein the metal oxide comprises at least one of a transition metal oxide and an aluminum oxide.

17. The non-volatile memory device according to claim 14,
wherein the metal oxide is at least one of a tantalum oxide, a hafnium oxide, and a zirconium oxide.

18. The non-volatile memory device according to claim 1,
wherein the memory cell in the variable state includes a variable resistance element including a first electrode, a second electrode, and a variable resistance layer located between the first electrode and the second electrode;
wherein the variable resistance layer includes an insulator layer including a metal oxide, an oxygen-deficient metal oxide layer, and a conductive path penetrating through the insulator layer; and
wherein the conductive path comprises an oxygen-deficient metal oxide which is lower in oxygen content atomic percentage than the insulator layer.

19. A non-volatile memory device including a memory cell array having a plurality of memory cells,
wherein data is defined based on whether a resistance value of each of the memory cells is in an initial state or a variable state, the initial state corresponding to an initial resistance value range,
a resistance value of a memory cell among the plurality of memory cells in the variable state falls within one of plural resistance value ranges including at least a first resistance value range and a second resistance value range,
the resistance value of the memory cell in the variable state changes from the resistance value within the second resistance value range to the resistance value within the first resistance value range in response to application of a first signal,
the resistance value of the memory cell in the variable state changes from the resistance value within the first resistance value range to the resistance value within the second resistance value range in response to application of a second signal,
the memory cells in the initial state do not change to the variable state, unless the electric stress higher than a threshold stress is applied thereto, and
the memory cell array having the plurality of memory cells includes one or more memory cells maintained in the initial state and one or more memory cells which have changed from the initial state to the variable state, and
a combination of the one or more memory cells maintained in the initial state and the one or more memory cells which have changed from the initial state to the variable state indicates the data.

* * * * *